US009237685B2

(12) United States Patent  (10) Patent No.: US 9,237,685 B2
Snider et al.  (45) Date of Patent: Jan. 12, 2016

(54) LIGHTWEIGHT AUDIO SYSTEM FOR AUTOMOTIVE APPLICATIONS AND METHOD

(71) Applicant: DELPHI TECHNOLOGIES, INC., Troy, MI (US)

(72) Inventors: Chris R. Snider, Noblesville, IN (US); Edgar Glenn Hassler, Danville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 14/460,559

(22) Filed: Aug. 15, 2014

(65) Prior Publication Data

US 2014/0347831 A1    Nov. 27, 2014

Related U.S. Application Data

(60) Division of application No. 13/455,411, filed on Apr. 25, 2012, now abandoned, which is a division of application No. 12/713,650, filed on Feb. 26, 2010, now Pat. No. 8,264,856, which is a (Continued)

(51) Int. Cl.
*H05K 5/00*  (2006.01)
*H05K 9/00*  (2006.01)

(Continued)

(52) U.S. Cl.
CPC .......... *H05K 9/0045* (2013.01); *B60R 11/0205* (2013.01); *G04G 5/002* (2013.01); *G04R 20/10* (2013.01); *H05K 7/14* (2013.01)

(58) Field of Classification Search
CPC ........ H05K 5/02; H04B 1/082; H04B 1/3816; H04B 1/3822; H04R 5/04

USPC ......... 361/818, 600, 679, 724, 727, 737, 740, 361/752, 799, 801, 816; 439/76.1, 289, 439/638, 946; 174/35 R; 257/678, 723, 785
See application file for complete search history.

(56) References Cited

U.S. PATENT DOCUMENTS 3,162,726 A   12/1964   Rosenberg et al.
3,399,939 A    9/1968   Anderson (Continued)

FOREIGN PATENT DOCUMENTS

EP       0936045       8/1999
EP       1720048      11/2006
WO    2008/021476      2/2008

OTHER PUBLICATIONS

Audio Product Manual 04-RDPD-12-MA-F; "2004 Model Year Ford Freestar Radios", pp. 1-38.

*Primary Examiner* — Xiaoliang Chen
(74) *Attorney, Agent, or Firm* — Lawrence D. Hazelton

(57) ABSTRACT

A lightweight radio/CD player for vehicular application is virtually "fastenerless" and includes a case and frontal interface formed of polymer based material that is molded to provide details to accept audio devices such as playback mechanisms (if desired) and radio receivers, as well as the circuit boards required for electrical control and display. The case and frontal interface are of composite structure, including an insert molded electrically conductive wire mesh screen that has been pre-formed to contour with the molding operation. The wire mesh provides EMC, RFI, BCI and ESD shielding and grounding of the circuit boards via exposed wire mesh pads and adjacent ground clips. The PCB architecture integrally forms a resilient beam portion adjacent an edge thereof carrying a grounding pad. The major components and subassemblies are self-fixturing during the final assembly process and self-interconnect by integral guide and connection features effecting "slide lock" and "snap lock" self-interconnection.

4 Claims, 39 Drawing Sheets

Related U.S. Application Data continuation-in-part of application No. 11/893,357, filed on Aug. 15, 2007, now Pat. No. 7,733,659.

(60) Provisional application No. 60/838,698, filed on Aug. 18, 2006, provisional application No. 61/156,105, filed on Feb. 27, 2009.

(51) Int. Cl.
| | |
|---|---|
| *G04G 5/00* | (2013.01) |
| *G04R 20/10* | (2013.01) |
| *B60R 11/02* | (2006.01) |
| *H05K 7/14* | (2006.01) |

(56) References Cited

U.S. PATENT DOCUMENTS

| | | |
|---|---|---|
| 3,940,578 A | 2/1976 | Pointon |
| 4,045,105 A | 8/1977 | Lee et al. |
| 4,245,003 A | 1/1981 | Oransky et al. |
| 4,323,755 A | 4/1982 | Nierenberg |
| 4,514,456 A | 4/1985 | Deal et al. |
| 4,515,867 A | 5/1985 | Bleacher et al. |
| 4,588,674 A | 5/1986 | Stewart et al. |
| 4,639,745 A | 1/1987 | Matsui et al. |
| 4,683,359 A | 7/1987 | Wojtanek |
| 4,685,563 A | 8/1987 | Cohen et al. |
| 4,739,453 A | 4/1988 | Kurokawa |
| 4,820,200 A | 4/1989 | Lau |
| 4,890,199 A | 12/1989 | Beutler |
| 4,939,012 A | 7/1990 | Dust et al. |
| 5,023,726 A | 6/1991 | Campisi |
| 5,028,490 A | 7/1991 | Koskenmaki |
| 5,061,341 A | 10/1991 | Kildal et al. |
| 5,098,311 A | 3/1992 | Roath et al. |
| 5,104,071 A | 4/1992 | Kowalski |
| 5,175,926 A | 1/1993 | Chapman |
| 5,227,956 A | 7/1993 | Johnson et al. |
| 5,312,273 A | 5/1994 | Andre et al. |
| 5,361,305 A | 11/1994 | Easley et al. |
| 5,362,932 A | 11/1994 | Inagaki et al. |
| 5,467,947 A | 11/1995 | Quilling, II |
| 5,473,111 A | 12/1995 | Hattori et al. |
| 5,506,563 A | 4/1996 | Jonic |
| 5,513,071 A | 4/1996 | Laviolette et al. |
| 5,515,240 A | 5/1996 | Rodeffer et al. |
| 5,521,342 A | 5/1996 | Bartley et al. |
| 5,537,300 A | 7/1996 | Kraines et al. |
| 5,544,007 A | 8/1996 | Inoue |
| 5,547,272 A | 8/1996 | Paterson et al. |
| 5,557,064 A | 9/1996 | Isern-Flecha et al. |
| 5,560,572 A | 10/1996 | Osborn et al. |
| 5,563,450 A * | 10/1996 | Bader ............... H01R 13/6485 257/678 |
| 5,566,055 A | 10/1996 | Salvi, Jr. |
| 5,594,200 A | 1/1997 | Ramsey |
| 5,613,011 A | 3/1997 | Chase et al. |
| 5,653,518 A | 8/1997 | Hardt |
| 5,727,675 A | 3/1998 | Leveque et al. |
| 5,727,866 A | 3/1998 | Kraines et al. |
| 5,757,617 A | 5/1998 | Sherry |
| 5,760,678 A | 6/1998 | Pavlacka et al. |
| 5,784,251 A | 7/1998 | Miller et al. |
| 5,784,254 A | 7/1998 | Stephan et al. |
| 5,839,910 A | 11/1998 | Meller et al. |
| 5,889,337 A | 3/1999 | Ito et al. |
| 5,913,581 A | 6/1999 | Stephan et al. |
| 5,920,460 A * | 7/1999 | Oldendorf ............... H05K 5/0269 361/737 |
| 5,940,518 A | 8/1999 | Augustyn et al. |
| 5,966,289 A | 10/1999 | Hastings et al. |
| 5,974,333 A | 10/1999 | Chen |
| 5,983,087 A | 11/1999 | Milne et al. |
| 5,991,151 A | 11/1999 | Capriz |
| 6,007,351 A | 12/1999 | Gabrisko et al. |
| 6,043,981 A | 3/2000 | Markow et al. |
| 6,054,647 A | 4/2000 | Ridener |
| 6,058,024 A | 5/2000 | Lyford |
| 6,067,708 A | 5/2000 | Wong et al. |
| 6,072,135 A | 6/2000 | O'Connor |
| 6,097,830 A | 8/2000 | Zelinka et al. |
| 6,102,608 A | 8/2000 | Hogan et al. |
| 6,104,611 A | 8/2000 | Glover et al. |
| 6,121,779 A | 9/2000 | Schutten et al. |
| 6,180,436 B1 | 1/2001 | Koors et al. |
| 6,187,514 B1 | 2/2001 | Kiyosawa et al. |
| 6,205,033 B1 | 3/2001 | Kelemen |
| 6,217,182 B1 | 4/2001 | Shepherd et al. |
| 6,220,539 B1 | 4/2001 | Anderson et al. |
| 6,258,438 B1 | 7/2001 | Loveland et al. |
| 6,262,364 B1 | 7/2001 | Yoshikawa et al. |
| 6,262,893 B1 | 7/2001 | Liu |
| 6,276,944 B1 | 8/2001 | Klatt |
| 6,286,972 B1 | 9/2001 | Shepherd et al. |
| 6,288,333 B1 | 9/2001 | Liu et al. |
| 6,307,742 B1 | 10/2001 | Diaz et al. |
| 6,362,538 B1 | 3/2002 | Reed et al. |
| 6,384,355 B1 | 5/2002 | Murphy et al. |
| 6,392,881 B1 * | 5/2002 | Saitoh ............... G06F 1/1626 345/205 |
| 6,407,910 B1 | 6/2002 | Diaz et al. |
| 6,413,598 B1 | 7/2002 | Motoki et al. |
| 6,428,340 B2 | 8/2002 | Okabe et al. |
| 6,431,259 B2 | 8/2002 | Hellbruck et al. |
| 6,449,238 B2 | 9/2002 | Furukawa et al. |
| 6,462,940 B1 | 10/2002 | Diaz et al. |
| 6,499,191 B1 | 12/2002 | Howie, Jr. |
| 6,522,547 B1 | 2/2003 | Diaz et al. |
| 6,524,117 B1 | 2/2003 | Murakami et al. |
| 6,545,871 B1 | 4/2003 | Ramspacher et al. |
| 6,578,935 B1 | 6/2003 | Garretson et al. |
| 6,608,965 B1 | 8/2003 | Tobimatsu et al. |
| 6,621,027 B1 | 9/2003 | Shimizu et al. |
| 6,639,800 B1 | 10/2003 | Eyman et al. |
| 6,651,936 B2 | 11/2003 | Upson et al. |
| 6,663,250 B1 | 12/2003 | Rada et al. |
| 6,705,005 B1 | 3/2004 | Blazier et al. |
| 6,709,299 B2 | 3/2004 | Listing et al. |
| 6,715,850 B1 | 4/2004 | Diaz et al. |
| 6,785,531 B2 | 8/2004 | Lepley et al. |
| 6,905,901 B1 | 6/2005 | Fye et al. |
| 6,930,643 B2 | 8/2005 | Byrne et al. |
| 6,940,730 B1 | 9/2005 | Berg, Jr. et al. |
| 6,950,525 B2 | 9/2005 | Harrell et al. |
| 6,951,365 B2 | 10/2005 | Chase et al. |
| 6,955,335 B2 | 10/2005 | Kawai et al. |
| 6,957,134 B2 | 10/2005 | Ramseyer et al. |
| 6,984,784 B2 | 1/2006 | Nagasaka et al. |
| 7,021,811 B2 | 4/2006 | Sylvester et al. |
| 7,180,745 B2 | 2/2007 | Mandel et al. |
| 7,208,686 B1 | 4/2007 | Chen et al. |
| 7,251,131 B2 | 7/2007 | Shah et al. |
| 7,254,820 B2 | 8/2007 | Bickford et al. |
| 7,286,943 B2 | 10/2007 | Saito |
| 7,350,954 B2 | 4/2008 | Snider et al. |
| 7,393,026 B2 | 7/2008 | Ikeda et al. |
| 7,404,798 B2 | 7/2008 | Kato et al. |
| 7,407,085 B2 | 8/2008 | Susheel et al. |
| 7,450,387 B2 | 11/2008 | Cheng et al. |
| 7,609,530 B2 | 10/2009 | Snider |
| 2001/0019477 A1 | 9/2001 | Murasawa |
| 2002/0008965 A1 | 1/2002 | Amari et al. |
| 2002/0080593 A1 | 6/2002 | Tsuge et al. |
| 2002/0180108 A1 | 12/2002 | Koshiba |
| 2002/0187751 A1 | 12/2002 | Gierl et al. |
| 2003/0053156 A1 * | 3/2003 | Satoh ............... G02B 26/0841 358/511 |
| 2003/0122457 A1 | 7/2003 | Diaz et al. |
| 2003/0128535 A1 | 7/2003 | Otani et al. |
| 2003/0210495 A1 | 11/2003 | Kano et al. |
| 2003/0221498 A1 | 12/2003 | Mere et al. |
| 2004/0042623 A1 | 3/2004 | Zapalski et al. |
| 2004/0095728 A1 | 5/2004 | Bird et al. |
| 2004/0105664 A1 | 6/2004 | Ivankovic |

(56) References Cited

U.S. PATENT DOCUMENTS

| | | |
|---|---|---|
| 2004/0121645 A1 | 6/2004 | Postrel et al. |
| 2004/0145457 A1 | 7/2004 | Schofield et al. |
| 2004/0172502 A1 | 9/2004 | Lionetta et al. |
| 2004/0203951 A1 | 10/2004 | Mazzara et al. |
| 2005/0001105 A1 | 1/2005 | Matsuda et al. |
| 2005/0036631 A1 | 2/2005 | Feit et al. |
| 2005/0059295 A1 | 3/2005 | Chen et al. |
| 2005/0139731 A1 | 6/2005 | Park et al. |
| 2005/0187677 A1 | 8/2005 | Walker |
| 2005/0201133 A1 | 9/2005 | Oba et al. |
| 2006/0065510 A1 | 3/2006 | Kiko et al. |
| 2006/0106965 A1 | 5/2006 | Falcon |
| 2006/0126274 A1 | 6/2006 | Iwano et al. |
| 2006/0134959 A1 | 6/2006 | Ellenbogen |
| 2006/0179446 A1 | 8/2006 | Bickford et al. |
| 2006/0232891 A1 | 10/2006 | Bushnik et al. |
| 2006/0250813 A1 | 11/2006 | Lippmann et al. |
| 2006/0277555 A1 | 12/2006 | Howard et al. |
| 2007/0025096 A1 | 2/2007 | Snider et al. |
| 2007/0067119 A1 | 3/2007 | Loewen et al. |
| 2007/0170910 A1 | 7/2007 | Chang et al. |
| 2007/0245758 A1 | 10/2007 | Binder et al. |
| 2008/0049949 A1 | 2/2008 | Snider et al. |
| 2010/0205622 A1 | 8/2010 | Snider et al. |

\* cited by examiner

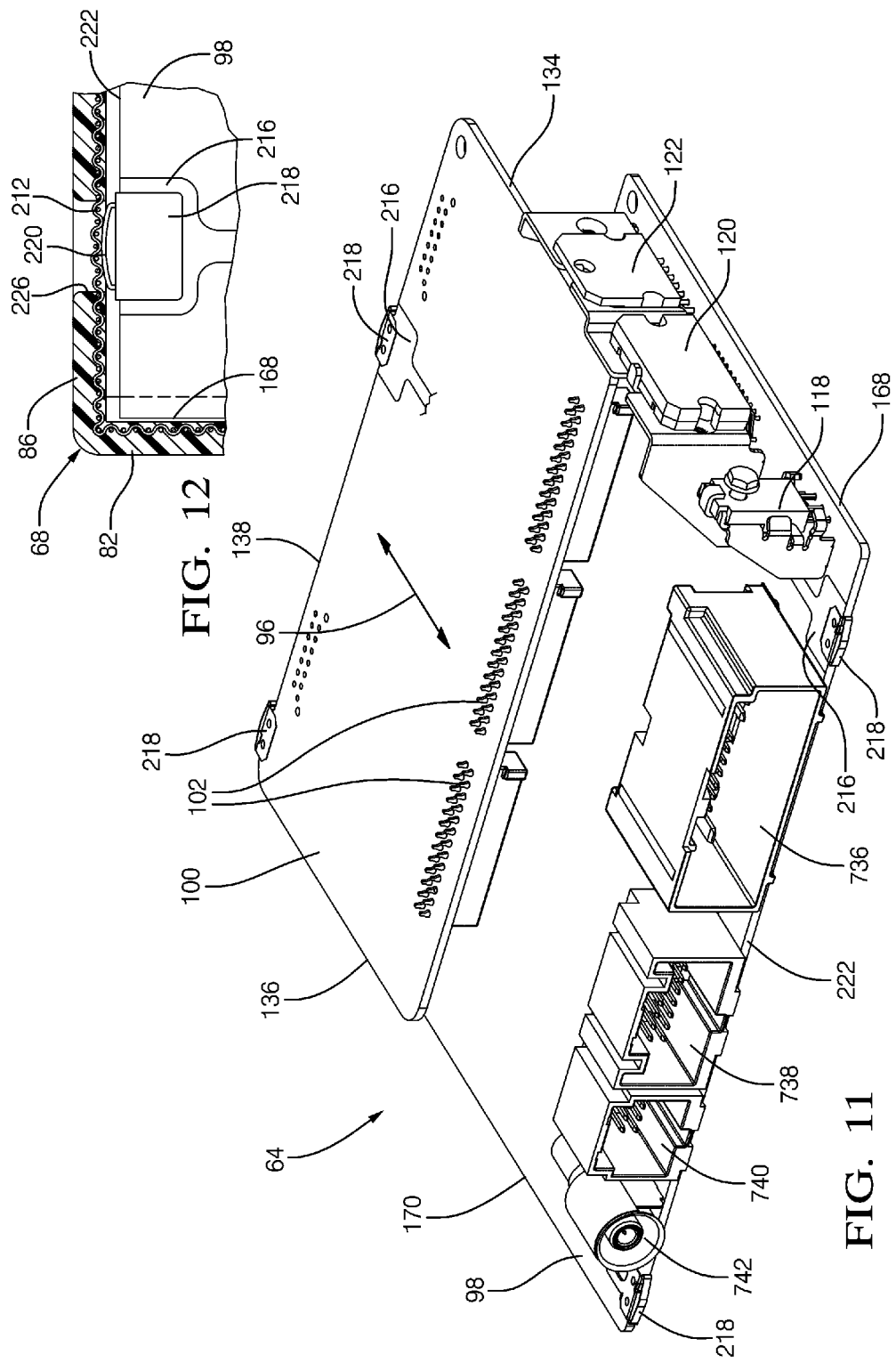

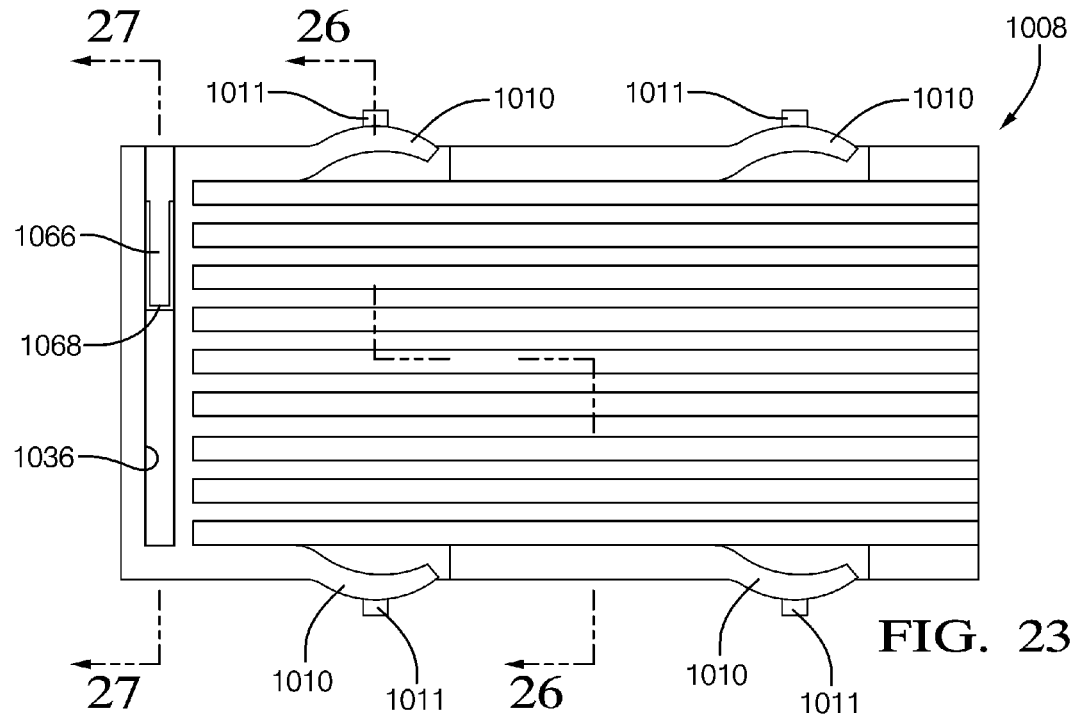
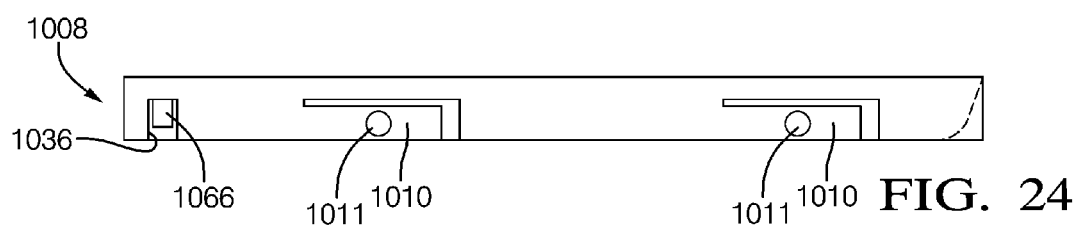
FIG. 23
FIG. 24
FIG. 25   FIG. 26   FIG. 27

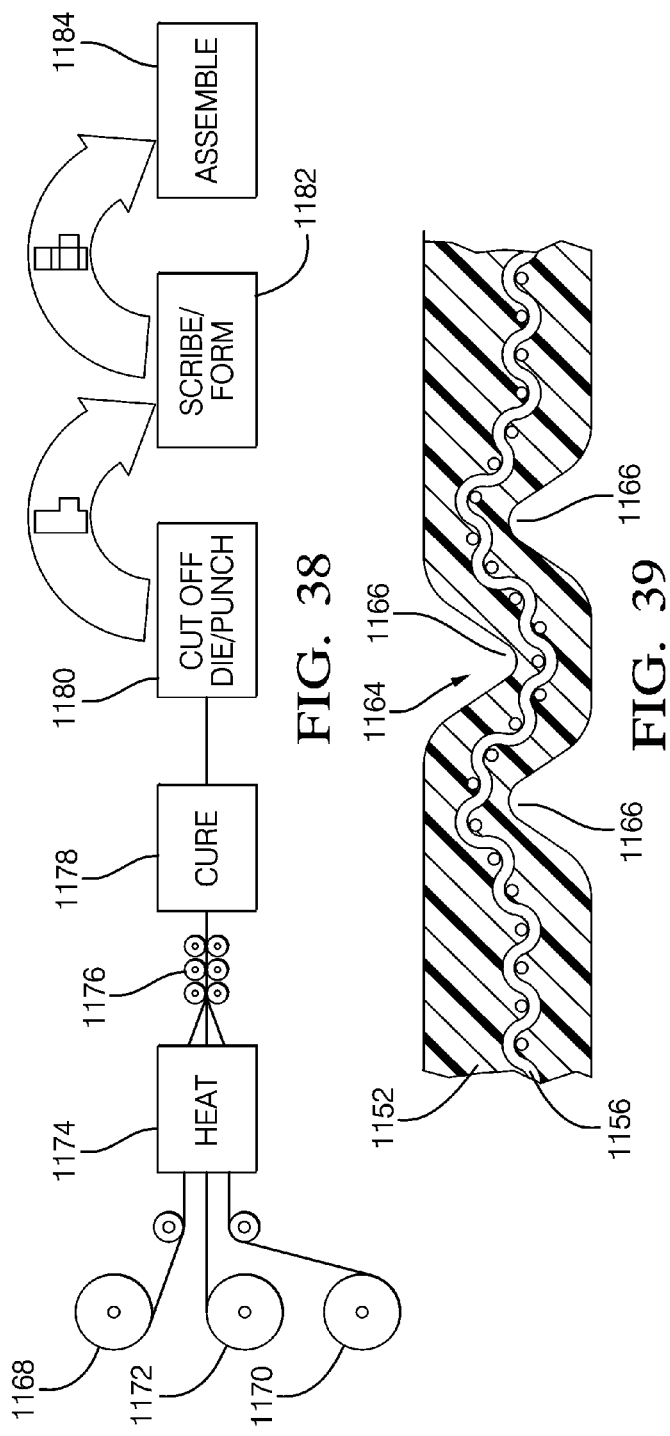
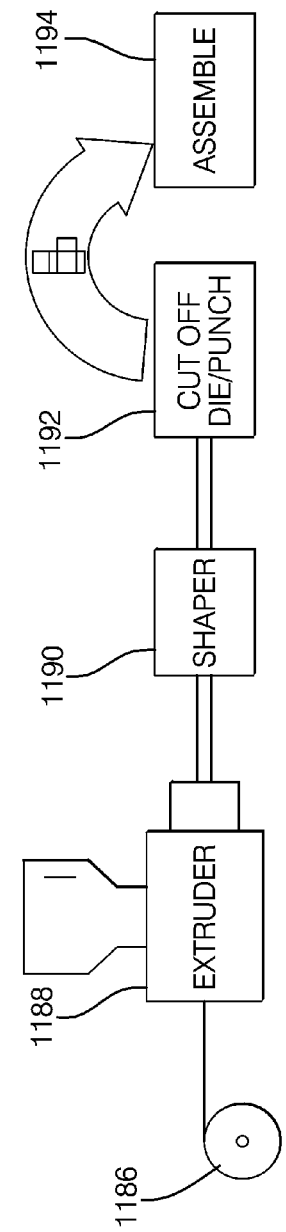

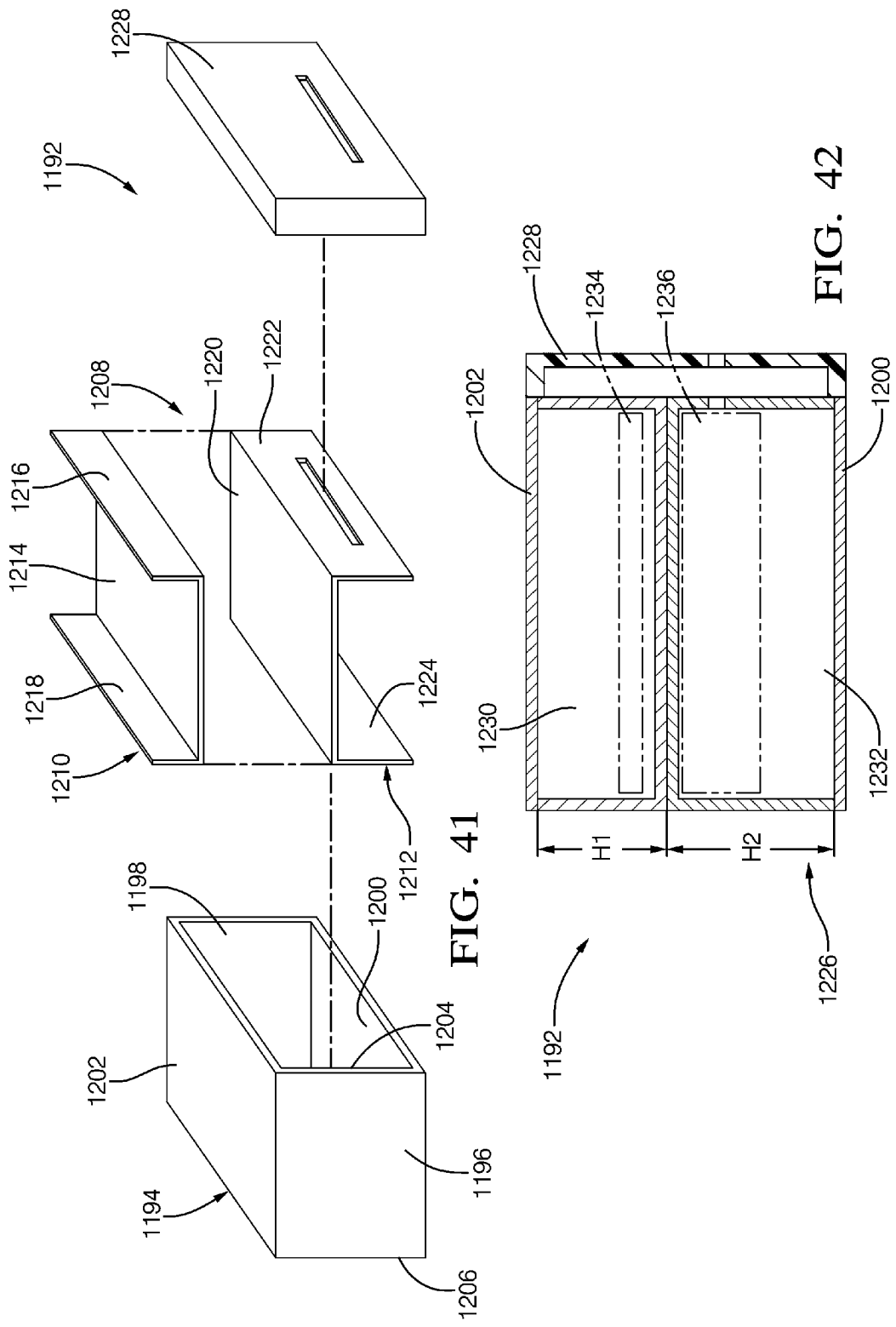

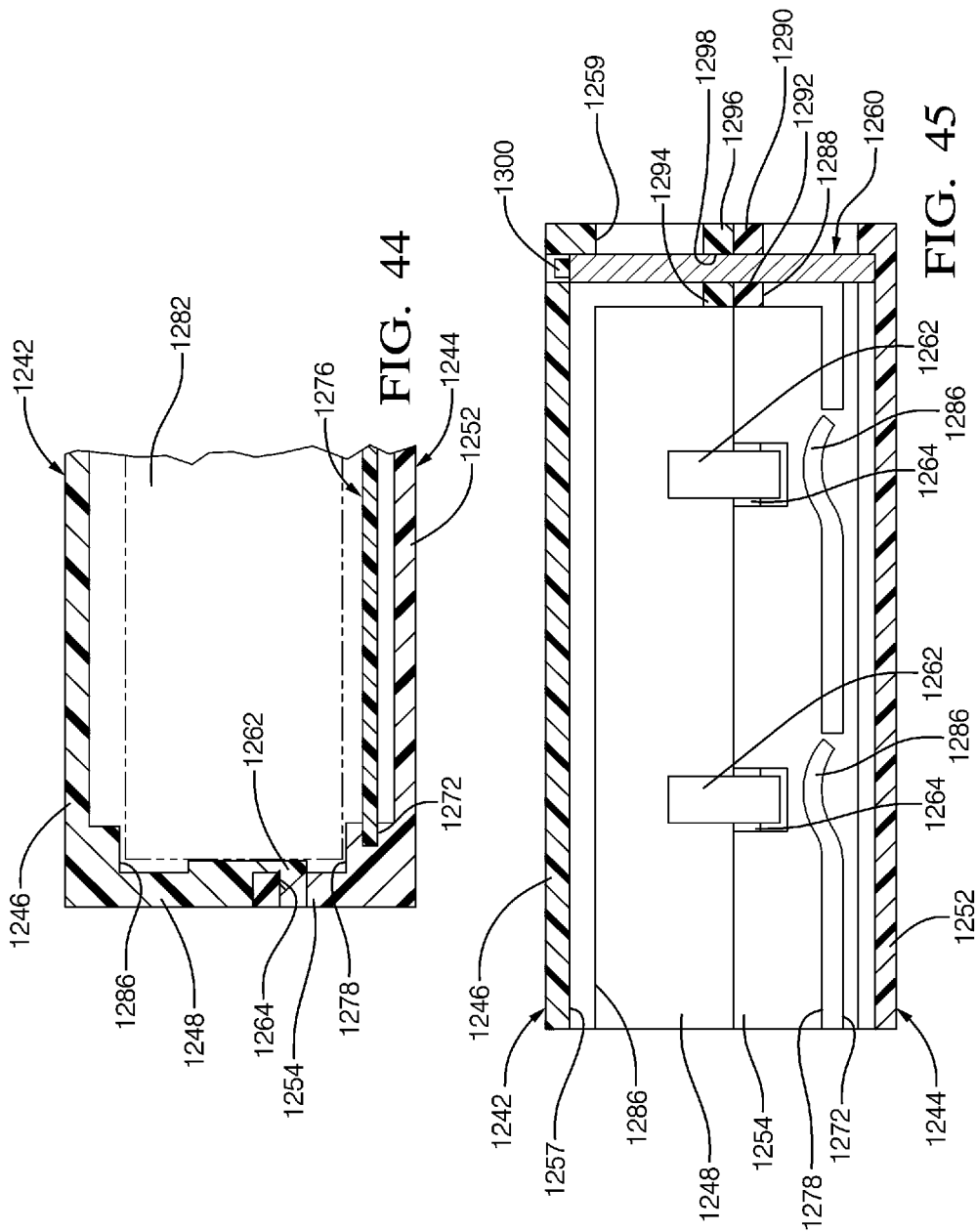

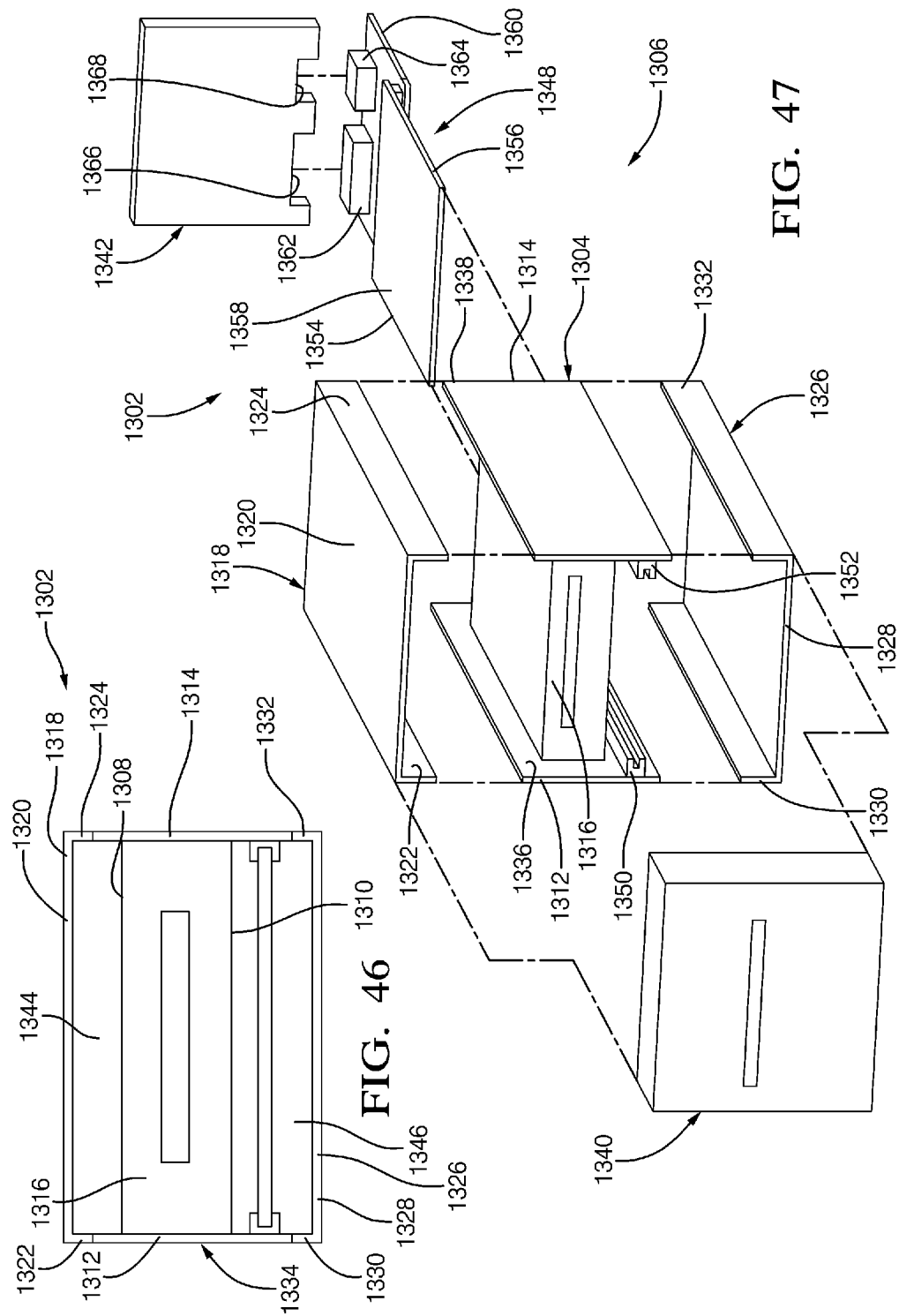

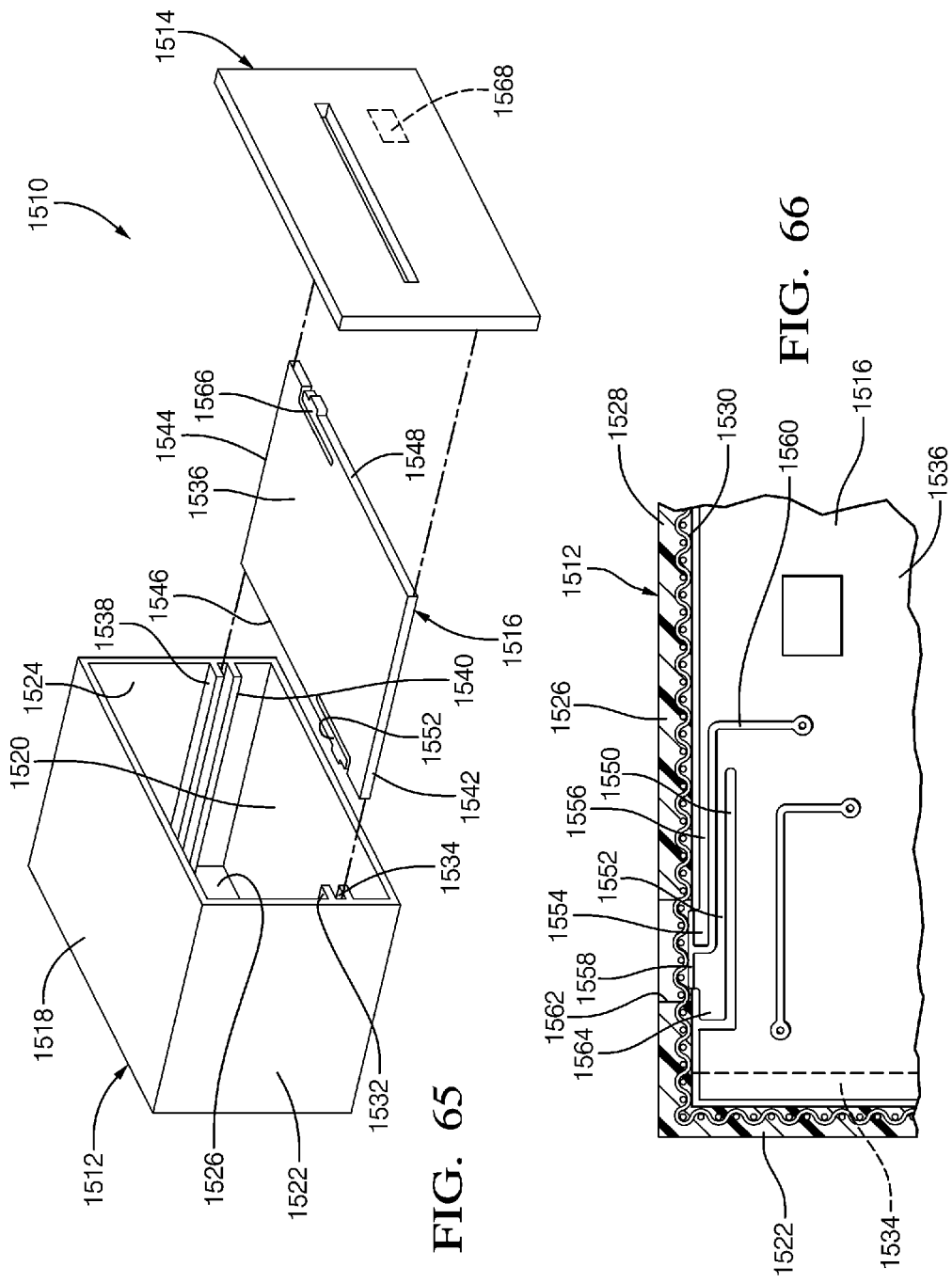

LIGHTWEIGHT AUDIO SYSTEM FOR AUTOMOTIVE APPLICATIONS AND METHOD

RELATED APPLICATIONS

The present application is a division of U.S. Ser. No. 13/455,411 filed 25 Apr. 2012, which is a division of U.S. Ser. No. 12/713,650, filed 26 Feb. 2010, now U.S. Pat. No. 8,264, 856 B2 issued 11 Sep. 2012, which claims the benefit of continuation-in-part of U.S. Ser. No. 11/893,357, filed 15 Aug. 2007, entitled "LIGHTWEIGHT AUDIO SYSTEM FOR AUTOMOTIVE APPLICATIONS AND METHOD", which claims the benefit of U.S. Ser. No. 60/838,698, filed 18 Aug. 2006 and U.S. Ser. No. 60/931,467, filed 23 May 2007. The present application also claims the benefit of U.S. Ser. No. 61/156,105 filed 27 Feb. 2009 entitled LIGHTWEIGHT AUDIO SYSTEM FOR AUTOMOTIVE APPLICATIONS AND METHOD. Furthermore, the present application is related to U.S. Ser. No. 12/370,319 filed 12 Feb. 2009, entitled LIGHTWEIGHT AUDIO SYSTEM FOR AUTOMOTIVE APPLICATIONS AND METHOD, all assigned to a common assignee. The teaching and specifications of the forgoing related applications are incorporated herein by reference.

TECHNICAL FIELD

The present invention relates generally to apparatus for enclosing electrical subassemblies, and more specifically relates to apparatus for efficiently securing subassemblies to a chassis of an electrical assembly such as an automobile radio, compact disc playing mechanism, cassette tape playing mechanism, navigational aid, personal computer, personal and telematic communication devices or disk drive mechanism.

BACKGROUND OF THE INVENTION

Devices such as automobile radios or personal computers contain subassemblies such as cassette playing mechanisms or disk drives that are attached to the chassis using threaded fasteners. The chassis provides structural support for the subassemblies and also provides electromagnetic shielding to limit electromagnetic interference (EMI) experienced by, and/or created by the device. The fasteners ensure that each subassembly within the chassis is properly located and securely retained within the chassis.

The use of such fasteners can have numerous drawbacks, particularly in a high volume production setting. The process for applying or installing fasteners can vary, but there is usually some degree of automation required, ranging from manually loading a screw into a bit on a pneumatic driver to using self-feeding automated machines. Typically, the torque applied by the device used to drive the fasteners must be monitored regularly and adjusted in order to assure proper seating of the fasteners. When fasteners are used, sheet metal tolerances, as well as tolerances of the fasteners themselves, have to be maintained at tight levels to allow for the minimization of stress in the assembly when aligning multiple fasteners with corresponding holes in the chassis and in the subassembly.

When threaded fasteners are used to assemble an electrical device, the assembly cycle time can be very long especially in high volume production. An operator assembling the device must typically first obtain the threaded fastener, orient and position it in alignment with the driver bit, then manipulate or actuate the machine to drive the threaded fastener. Furthermore, using threaded fasteners presents a risk of any one of the following upstream failures occurring: stripping of fastener threads; insufficient torque resulting in an unseated fastener; excessive torque resulting in distension/deformation of the fastener or adjacent electrical components; installation of the wrong fastener type or size; foreign object damage due to fasteners and/or metal shavings dropping onto the assembly and/or subassembly; and stripping of the head of the threaded fastener. Also, a fastener installation tool such as a driver and bit can slip off the fastener and impact an electrical component resulting in a damaged assembly.

If self-tapping fasteners are used, the process of driving the self-tapping fasteners into sheet metal often causes shavings of sheet metal to disperse into the assembly. Such shavings have been known to cause electrical failures, such as shorts or corruption of magnetic components that can permanently damage the product. If self-tapping fasteners are not used, an extra production step is required to pre-form threads in the sheet metal of the chassis and/or the subassembly to be installed within the chassis.

Fasteners further require an additional inventory burden on the production line in that the production line must be continuously stocked with part numbers (fasteners) other than the integral components that add value to the assembly. Also special tools specifically required for assembly, using fasteners, such as drivers and bits, must be continuously monitored and maintained for proper performance, wear and torque specifications. Typically, the top and/or bottom surface of the chassis must be secured in place after the subassembly is attached to the chassis.

Special fixtures are often required on the production line to secure a subassembly in a proper location and orientation while it is mounted within the chassis with fasteners. Such fixtures can be very complex, and the use of such fixtures usually requires extra handling of both the subassembly and of the resulting assembly thereby adding to the production cycle time and potentially compromising quality of the final product.

FIG. 1 illustrates the construction of a typical prior art automotive radio/compact disc (CD) player 10. Radio/CD player 10 comprises a radio subassembly whose principle circuit components are carried on a circuit board 12 and a CD player subassembly 14. The circuit board 12 and the CD player 14 are encased within a common chassis 16 made up of sheet metal components. Chassis 16 includes a wraparound housing 18 defining a back and sidewalls, a top cover 20, a bottom cover 22 and a front plate 24 which are interconnected by numerous threaded fasteners to collectively enclose the subassemblies. The top and bottom covers 20 and 22, respectively, are provided with large arrays holes or openings for airflow and ventilation of heat generated within the radio/CD player 10. A convector or heat sink 26 is carried on an outer surface of one of the chassis sidewalls and is interconnected through a port/window 28 to a power device assembly 30. A trim plate assembly 32, along with a support pad 34 and CD dust cover 36 are affixed to the front plate 24, providing an operator control interface with the radio/CD player 10. Circuit board 12 is electrically in-circuit with the CD player subassembly 14 through an intermediate flex wire cable 38 and with the power device assembly 30 through a jumper cable 40. Information bearing labels 42 and 44 are provided for future reference by the operator and service technicians. The radio/CD player 10 is electrically interconnected with an antenna, power supply, speakers and other related systems of a host vehicle by rear-facing connectors 46 carried on the circuit board 12 which are registered with openings 48 in the rear wall of wraparound housing 18. The radio/CD player 10 is mounted within a host vehicle by threaded fasteners passing through openings in mounting features 50 extending from front plate 24 and a rearwardly directed mounting bushing 52 which is threadably affixed to a stud 54 carried on the outer surface of the rear wall 56 of wraparound housing 18. As best seen in FIGS. 11 and 12, the shank of the stud 54 extends outwardly through a hole 58 disposed concentrically with a localized recess 60 and the stud 54 is seated within the recess 60. FIG. 9D illustrates another known stud design including a threaded shank secured to the rear wall 53 of a radio set 51 by a set nut 55 and receiving a molded rubber, plastic or vinyl stud 57 thereover. Note the large number of threaded fasteners 59.

The radio/CD player 10 of FIG. 1 is of ordinary complexity and may require fifty or more threaded fasteners to complete the manufacturing process. Installation of that many fasteners may require that the in-process chassis be re-positioned/re-fixtured ten to fifteen times as it passes along an assembly line of eight to ten skilled workers/work stations.

Vehicle entertainment systems usually include an audio component such as a radio to enable receiving signals from antennas, contain various forms of playback mechanisms, and have the capacity to accept data from user devices like MP3 players. Typically, the radio has a decorative assembly that provides man-machine interface as well as displaying pertinent data relative to the selected media and audio settings. Also, the back-end or chassis is constructed of metal to provide various functions to ensure the performance of the radio in the vehicular environment. The structure to contain the mass from playbacks, the heat conductive properties, and the electrical shielding and grounding are just a few of the advantages to using the metal construction. Unfortunately, with the density of the metal, the disadvantage of added weight is a side effect of the typical construction. In a vehicle, added weight impacts fuel economy, as well as other hidden costs during assembly that can effect the cost of the product, like sharp edges of metal can be a potential hazard for assemblers in the manufacturing plant as well as added weight can limit the packaging of multiple parts in containers for inter and outer plant distribution.

Static electricity (electrostatics) is created when two objects having unbalanced charges touch one another, causing the unbalanced charge to transfer between the two objects. This phenomenon commonly occurs in homes, vehicles and other environments when the air is dry (i.e. has a characteristic relatively low level of humidity). For instance, when a person slides onto a car seat, electrons may transfer between the two, causing the surface of the person's body to store a charge. When the person, then, touches a vehicle component, the charge may travel (discharge) from the body to the component, thus creating static electricity. If the object touched is an electronic device, such as a home stereo, home theatre system, computer, vehicle entertainment system or other electronic media system, this electrostatic discharge can be harmful to the sensitive electronic components of the device. For instance, when a person slides onto a vehicle seat and inserts a disc into the car stereo, a charge may travel from the body through the disc to the sensitive electronic components in the vehicle stereo. Similar problems may occur when using DVD and other magnetic media and disc players.

Accordingly, problems with the drainage of a static electric charge impacting sensitive electronic components continue to persist.

SUMMARY OF THE INVENTION

The present invention provides numerous product and process advantages which collectively result in substantial cost and labor savings. By way of example, the preferred design optimizes the assembly process. It minimizes the required handling of major components and subassemblies during the assembly cycle. Final assembly is optimized, wherein only seven major components and subassemblies are involved. This minimizes the number of work stations and fixtures, in-process transfers between work stations and total assembly cycle time. The inventive design permits selection of the optimal mechanical product configuration for a given receiver family. Furthermore, it permits idealized electrical and mechanical building block partitioning for common and unique elements.

The preferred embodiment of the invention contemplates screwless final assembly without the use of tools, fixtures and assembly machines. This greatly enhances in-process product flow in the factory, improves scheduling of final assembly, and allows labor intensive processes such as stick lead assembly to be largely moved off-line. This greatly reduces both direct and indirect labor requirements. Furthermore, inventory control is simplified inasmuch as position part proliferation is deferred to or near the end of process.

These and other features and advantages of this invention will become apparent upon reading the following specification, which, along with the drawings, describes preferred and alternative embodiments of the invention in detail.

BRIEF DESCRIPTION OF THE DRAWINGS

The present invention will now be described, by way of example, with reference to the accompanying drawings, in which:

FIG. 11, is a perspective view of the circuit board assembly with ground clips installed thereon;

FIG. 12, is a fragmentary, cross-sectional view of a ground clip and an associated portion of the printed circuit board on an enlarged scale in assembly with an adjacent portion of the case to effect a grounding point with the integral wire mesh;

FIG. 23, is a front plan view of one of two shelf guide inserts employed in the radio/CD player embodiment of FIG. 22;

FIG. 24, is a top plan view of the shelf guide insert of FIG. 23;

FIG. 25, is a front plan view of the shelf guide insert of FIG. 23;

FIG. 26, is a cross-sectional view of the shelf guide insert taken on broken lines 26-26 of FIG. 23;

FIG. 27, is a cross-sectional view of the shelf guide insert taken on lines 27-27 of FIG. 23;

FIG. 38, is a schematic representation of manufacturing process equipment for producing a continuous strip of composite/laminate (plastic-screen-plastic) material for subsequent formation of the case structure of the radio/CD player of FIG. 33;

FIG. 39, is a representative view, on a greatly enlarged scale, of laminate case material produced by the process equipment of FIG. 38, illustrating a localized deformation of the material to define a reduced thickness, undulating living hinge section;

FIG. 40, is a schematic representation of alternative manufacturing process equipment for producing a continuous strip of composite (plastic & screen) material for subsequent formation of a case structure suitable for the radio/CD player of FIG. 33;

FIG. 41, is an exploded, perspective view of a third alternative embodiment of a radio/CD player featuring an I-beam structure allowing both the control electronics PCB and the CD player to be assembled in a bottom-up sequence;

FIG. 42, is a cross-sectional view of the third embodiment of a radio/CD player of FIG. 41, on an enlarged scale, with the control electronics PCB and CD player illustrated in phantom;

FIG. 44, is a broken, cross-sectional view, on an enlarged scale, of internal features of the case assemble of the radio/CD player of FIG. 43, illustrating the self-engagement feature of the case halves and the mounting/positioning of the PCB and CD player (illustrated in phantom);

FIG. 45, is a cross-sectional view, on an enlarged scale, of additional internal features of the case assembly of the radio/CD player of FIG. 43, taken along lines 45-45 of FIG. 44, illustrating application of a guillotine heat sink and integral leaf springs for securing the CD player (not illustrated);

FIG. 46, is an exploded, perspective view of a fifth alternative embodiment of a radio/CD player featuring an "H" shaped case wherein CD player mounting brackets comprise sidewalls of the case which self-engage with top and bottom panels to effect closure of the case;

FIG. 47, is a simplified cross-sectional view of the radio/CD player assembly of FIG. 46 illustrating the mounting of the PCB and the CD player within the case;

FIG. 65, is an exploded front perspective view of still another embodiment of the present invention illustrating the juxtaposition of a housing case and front closure member of a lightweight automotive audio system and the printed circuit board portion of an electronic circuit component contained therein;

FIG. 66, is a broken, cross-sectional view of a portion of the lightweight automotive audio system of FIG. 65 as fully assembled, wherein the housing case is a composite of rigid polymer based material with an electrically conductive screen mesh insert molded therein, and wherein a resilient beam integrally formed with the PCB adjacent a leading edge thereof carries a grounding pad which electrically self-grounds with an exposed portion of the case rear wall screen upon installation;

FIG. 69 B, is a broken, cross-sectional view of a portion of the alternative configuration of FIG. 67 wherein the PCB is partially inserted within the case wherein the ramped, leading edge of each lateral beam extension bears against the opposed inner surfaces of the case side walls to momentarily laterally inwardly deflect the free end of the beam member, providing clearance for further insertion of the PCB;

FIG. 69 C, is a broken, cross-sectional view of a portion of the alternative configuration of FIG. 67 wherein the PCB is fully inserted within the case wherein the normally laterally outwardly extending, trailing edge of each lateral beam extension projects within corresponding window openings formed the case side walls to enable the free end of the beam member to resiliently return to its rest position, similar to that of FIG. 69 A, thus simultaneously effecting self-alignment, self-engagement and self-grounding (electrical) of selected circuit components carried on the PCB.

Figure 1:
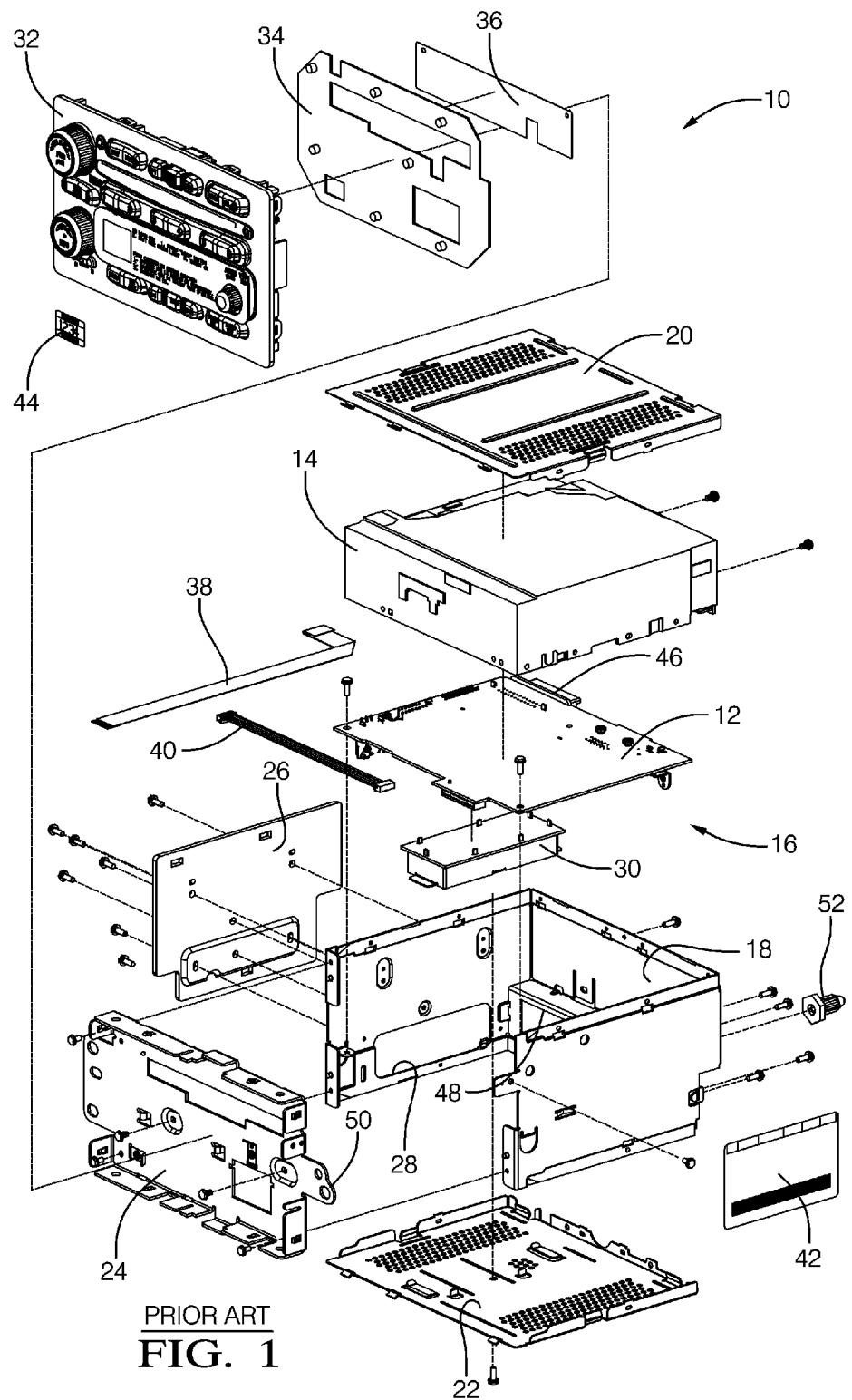
FIG. 1, is an exploded, perspective view of a prior art automotive radio/CD player combination in a common chassis constructed of sheet metal and a large number of threaded fasteners.

Although the drawings represent varied embodiments and features of the present invention, the drawings are not necessarily to scale and certain features may be exaggerated in order to illustrate and explain the present invention. The exemplification set forth herein illustrates several aspects of the invention, in one form, and such exemplification is not to be construed as limiting the scope of the invention in any manner.

DESCRIPTION OF THE ILLUSTRATIVE EMBODIMENTS

The present invention can be applied in its broadest sense to electronic devices and systems where shielding from radio frequency interference (RFI), electromagnetic interference (EMI), bulk current injection (BCI) and/or electrostatic discharge (ESD) is required. In addition to vehicle based radios and audio entertainment systems, the invention can be advantageously applied in "infotainment" and telematic systems. Furthermore, the present invention employs virtually "fastenerless" design architecture to facilitate low-cost, high volume production techniques.

A telematics product is a two-way communication/receiver system that enables access by a vehicle occupant to vehicle related information like geographic position/location through the use of a GPS module with antenna, vehicle diagnostics, crash sensors and air bag deployment. It also contains a phone module that is linked through a microphone in the vehicle and the radio speaker system for hands free calling via voice recognition and links to a call center for a variety of services, including but not limited to emergency help, concierge, vehicle theft recovery, turn-by-turn route guidance, vehicle diagnostics and vehicle unlock.

For convenience of understanding, the following description will be focused primarily upon an automotive radio/CD player system.

Lightweight Radio/CD Player for Vehicular Application (1)

The present invention reflects an improved design to reduce the overall weight of an automotive radio/CD player without compromising the strength of the unit. The present invention employs a polymer based material that can be molded to provide the necessary features for the chassis as well as the frontal interface to the decorative front-end assembly described for the man-machine interface. By molding a case with the necessary details to accept the playback mechanisms (if desired) as well as the circuit board(s) needed for the electrical control, the required functionality of the unit is maintained as compared to the typical metal box. The necessary shielding and grounding is accomplished by insert-molding a mesh screen wire that has been pre-formed to contour with the molding operation. The grounding of the circuit boards may be accomplished by using ground clips attached directly to the ground pads of the circuit board that would interface directly with exposed screen wire mesh of the molded part. While metal is also a good conductor for the thermal load inside the unit, openings must be incorporated to allow airflow for additional cooling. The same openings can compromise the shielding. With in-molded mesh screen wire, the mesh acts as a Faraday cage to shield the electronics, but the open weave allows airflow to promote the dissipation of the thermal load from inside the unit, to the exterior. Besides the reduction of mass offered by the molded polymer material for the unit chassis and front plate, the hidden benefits include ease of handling in the assembly process as well as less container and shipping weight.

To facilitate assembly, the molded polymer chassis and front plate can use integral or molded in guideways and snaps, thereby eliminating the typical screw fastener assembly method previously used for these components. To enhance the rigidity, the component parts that comprise the assembly are sandwiched at the common vehicle instrument panel attachment points such that when the mounting screws are driven, they firmly clamp the component pieces to the host vehicle. In the event a playback mechanism of substantial mass and volume is required, the sub-assembly structure for the mechanism would utilize formed attachment tabs that would be an intermediate layer in the aforementioned component part sandwich. Another benefit for the mounting at the back of the radio is often vehicles have a receptive hole or slot in the inner cavity of the instrument panel carrier that accepts a mounting bushing or "bullet" shaped extension that is screwed to a mounting stud that is typically swaged to the back of the metal enclosure of the radio. The mounting "bullet" can be molded directly in the polymer-based case eliminating the additional part and the assembly of that additional part.

To replace the metal structure of the vehicle radio, a galvanized (or appropriately coated) steel mesh wire screen will be cut, formed, and molded with a polymer resin to provide necessary details for assembly of components required for the functionality of the radio including, but not limited to, a circuit board assembly, a heat sink for audio power and switching components, a playback mechanism, and a man-machine interface or trim plate assembly, as well as vehicle mounting features. While the polymer or plastic provides the majority of the mechanical structure for the radio, the in-molded mesh screen wire provides the needed protection from various electrical anomalies including electromagnetic contamination, radio frequency interference, bulk current injection, and electrostatic discharge, to name a few. The screen mesh also allows openings necessary for air passage or venting of heat from the radio by molding the radio back end or case and front plate. The many details and features needed in a typical assembly can be incorporated directly into the parts, eliminating the need for fasteners and separate additional parts often required with parts fabricated in metal.

The specific materials selected for fabricating the radio case and front plate will vary depending upon the application, including the contained mass of the mechanisms employed as well as the severity of the contemplated environment (esp. temperature and vibration). Examples of materials that could be employed for typical automotive applications are:

Case: Glass-filled polyester, Glass-filled polypropylene, Polycarbonate, ABS.

Front Plate: Polycarbonate, ABS, PC/ABS and Noryl.

Major components which contact one another or are mechanically interconnected preferably are formed from material having substantially differing surface finish and hardness characteristics to minimize the possibility of resulting squeaks, rattles and the like.

Although presently viewed as cost prohibitive for automotive applications, it is contemplated that nano carbon tube filler can be employed within the plastic material forming the case and front plate to provide effective shielding and enhance the structural strength of the case assembly.

In addition to weight savings, which may amount to well over one pound (0.4536 Kg), the part handling is improved to reduce the amount of fasteners as well as separate component parts. Often a radio may be constructed from a wrap-around, a cover and the fasteners along with a mounting bushing or "bullet" screwed to a "swaged" threaded stud in the metal case. Also, the metal pieces require assembly personnel to wear gloves during handling to avoid any cuts or damage to their hands as well as protection from any metal fabrication fluid residue. Molded plastic does not require any special gloves, or the concerns of cuts to the skin. Aside to the benefit to the vehicle by reducing the radio weight by over one pound (0.4536 Kg), the savings for a manufacturer include reduced shipping cost through the weight reduction and potential container efficiency improvements. Product labeling can be improved through laser engraving the plastic with the desired number, customer logos, etc. Metal typically requires a stamping detail (not easily changed) and/or a printed label that is adhesively applied. This offers greater flexibility and eliminates additional parts (like labels) to use the plastic, as well as better durability than a label.

Referring to FIGS. 2-10, a consolidated radio/CD player apparatus 62 embodying many aspects of the present invention is illustrated. The radio/CD player 62 is an assemblage of six major components or subassemblies, a circuit board subassembly 64, a CD player subassembly 66, a box-like housing case 68, a front closure member or front plate 70, a convector or heat sink 72 and a trim plate subassembly 74.

It is envisioned that each of the major components/subassemblies would be produced "off-line" and the final assembly process would comprise the efficient, high volume joining of the major components/subassemblies and end-of-line testing of the completed units.

FIGS. 2 and 8-10 depict plan and perspective views of the fully assembled radio/CD player apparatus 62. FIG. 3 is an exploded view illustrating the juxtaposition of the respective major components during the assembly process. FIGS. 4-7 depict specific assembly steps of the major components as will be described hereinbelow.

The case 68 and front plate 70 are each preferably injection molded of polymer based material and collectively comprise a substantially closed housing assembly 76. The case 68 has a box-like structure, including upper and lower wall portions 78 and 80, respectively, left and right side wall portions 82 and 84, respectively, and a rear wall portion 86. The case 68 also has mounting features extending externally of the case walls, including left and right front mounting flanges 88 and 90, respectively, extending from the forward edges of the left and right side walls 82 and 84, respectively, and a mounting stud 92 extending rearwardly from the rear wall 86. All of the case wall portions and mounting features of the case 68 are integrally formed in a single injection molding process. The case defines a front opening 94 which, upon assembly, is closed by front plate 70. An assembly axis 96 extends symmetrically from front to rear of the case 68, exiting opening 94 along the nominal centerline of the case 96.

The circuit board subassembly 64 consists of a common or main printed circuit board (PCB) 98 and a unique, application specific PCB 100 which are electrically and mechanically interconnected by several pin connectors 102. It is envisioned that edge connectors, ribbon connectors or the like could be substituted for the pin connectors 102. The common PCB 98 contains all surface mount components. The circuit board subassembly 64 comprises an audio component.

The CD player subassembly 66 consists of a conventional multi-disc player unit 104 and substantially minor-image left and right side mounting brackets 106 and 108, respectively, affixed thereto by integral fastener devices such as "squirts". Note that there are slight differences between the left and right mounting brackets 106 and 108, but they are deemed to be inconsequential for purposes of the present invention. The left and right mounting brackets 106 and 108 have outwardly directed mounting flanges 110 and 112, respectively, which, upon assembly, register with case mounting flanges 88 and 90, respectively. The CD player subassembly 66 comprises an audio component.

The heat sink 72 comprises a substantially flat, stamped aluminum plate adapted for mounting to the outer surface of the left case sidewall 82 and includes a recessed portion 114 which, upon installation, extends inwardly through a port 116 in left case sidewall 82 for thermal interconnection to heat generating and power circuit components 118, 120 and 122 carried on the main PCB 98.

The trim plate subassembly 74 is configured to organize audio system input/output and display devices, informational indicia and decorative display devices for an associated host vehicle operator.

Referring particularly to FIGS. 4-7, a method of assembly of the lightweight audio system 62 of the present invention is illustrated. Audio system 62 can be assembled manually by an ordered process wherein a single (preferably, but not limited to) operator, who sequentially assembles the six major components or subassemblies on a designated work surface 124. No specialized tools or separate/dedicated fixtures are required. No threaded fasteners/screws are required. Each or the major components and subassemblies form integral features which cooperate to interact with features of the other components and subassemblies to register, align and guide the components and subassemblies during adjoining thereof as well as to removably affix the components and subassemblies to one another when in their final design position. This process is referred to herein as the Slide-lock Snap-lock™ Screwless Assembly Technology and Method or "SLAT". In effect, the components "self-fixture" one another in combination during the manipulation of the components in the assembly process.

Figure 4:
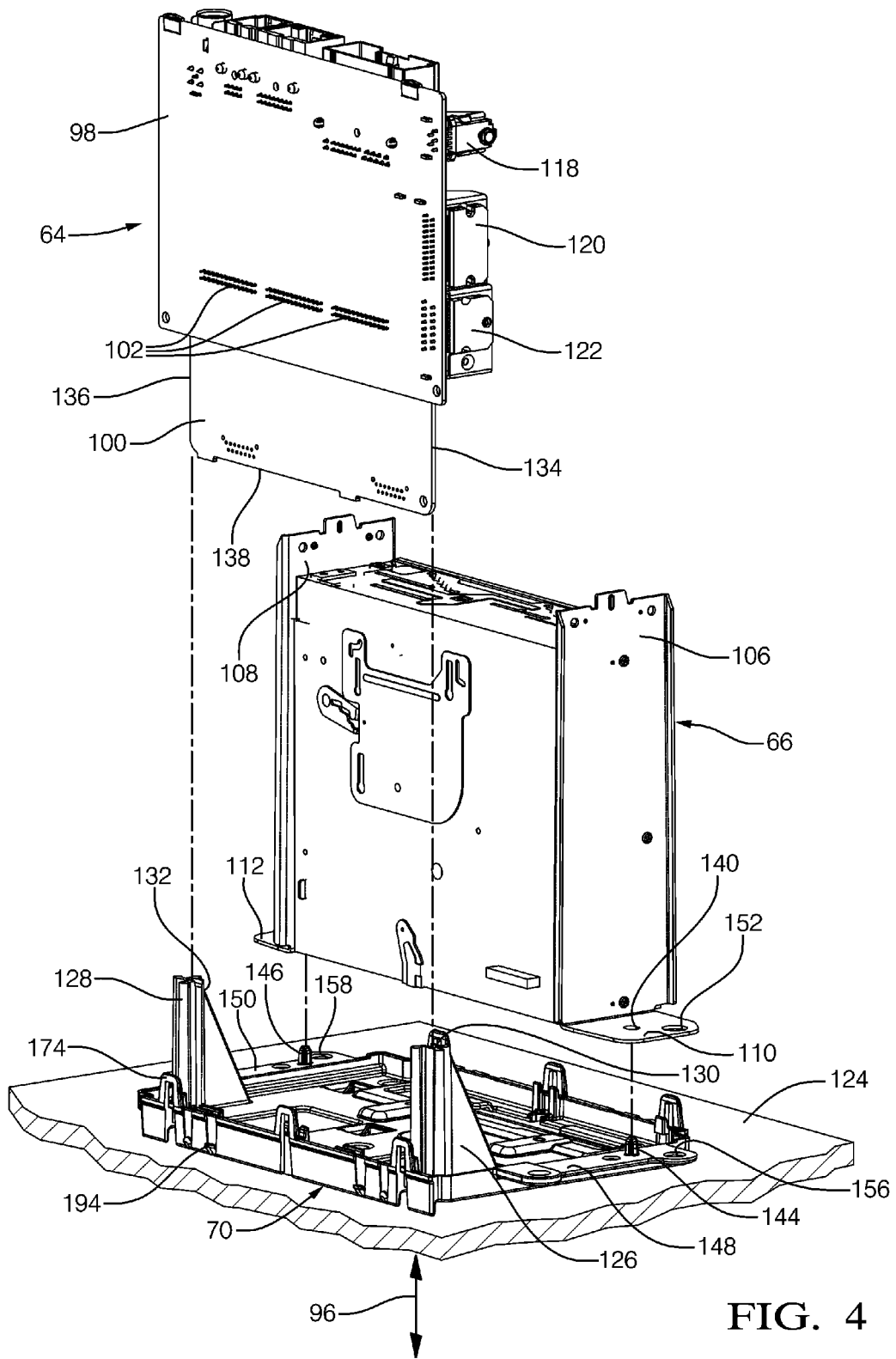
FIG. 4, is an exploded, perspective view of the radio/CD player of FIG. 2, illustrating final assembly step I in the production thereof wherein the playback mechanism and circuit board assembly are slid and snapped to the faceplate.

Assembly of the radio/CD player 62 is affected by the assembly technician or operator taking the following steps:

As illustrated in FIG. 4, place the front plate 70 on the work surface 124 in an inverted position with the outer surface of the front plate disposed upon the work surface 124. The centerline of the front plate 70 defines an assembly axis, as designated by arrow 96 extending normally to the work surface 124.

The front plate has two laterally spaced, rearwardly directed extensions 126 and 128 integrally formed therewith. Extensions 126 and 128 form guideways or opposed slots 130 and 132, respectively, which open towards one another and are directed parallel to the assembly axis 96. Lateral edge guide surfaces 134 and 136 of the application specific PCB 100 register within slots 130 and 132 and are guided thereby during the insertion process until the leading edge surface 138 of the PCB 100 contacts the inside (upward facing in FIGS. 4 and 5) surface of front plate 70. At this point, common PCB 98 is cantilever suspended from PCB 100 via pin connectors 102 and other supports (not illustrated). Referring FIG. 5, the circuit board subassembly 64 is retained in position by the interfit of the edge surfaces 134 and 136 within slots 130 and 132.

The CD player subassembly 66 is next installed by manipulating it along the assembly axis 96 until through holes 140 and 142, formed in bracket mounting flanges 110 and 112, register with locating pins or nibs 144 and 146 integrally formed in laterally extending mounting flanges 148 and 150, respectively, integrally formed in front plate 70. Thereafter, the CD player subassembly is displaced downwardly along the assembly axis 96 until the lower surfaces of bracket mounting flanges 110 and 112 abut the upper surfaces of front plate mounting flanges 148 and 150. The CD player subassembly 66 is retained in the position illustrated in FIG. 5 by an interference fit between the front plate nibs 144 and 146, and the mounting bracket flange through holes 140 and 142.

Mounting bracket flanges 110 and 112 have secondary, larger diameter through holes 152 and 154 formed therein which register with similarly dimensioned through holes 156 and 158, respectively, formed in front plate mounting flanges 148 and 150 for receiving attachment means such as bolts, for affixing the completely assembled radio/CD player 62 to a host vehicle.

The steps of installing the circuit board subassembly 64 and the CD player subassembly can be reversed from that describer hereinabove.

The housing case 68 is next installed by manipulating it along the assembly axis 96 whereby the case wall portions 78, 80, 82, 84 and 86 fully envelop the circuit board subassembly 64 and CD player subassembly 66 in combination with the front plate 70.

Figure 5:
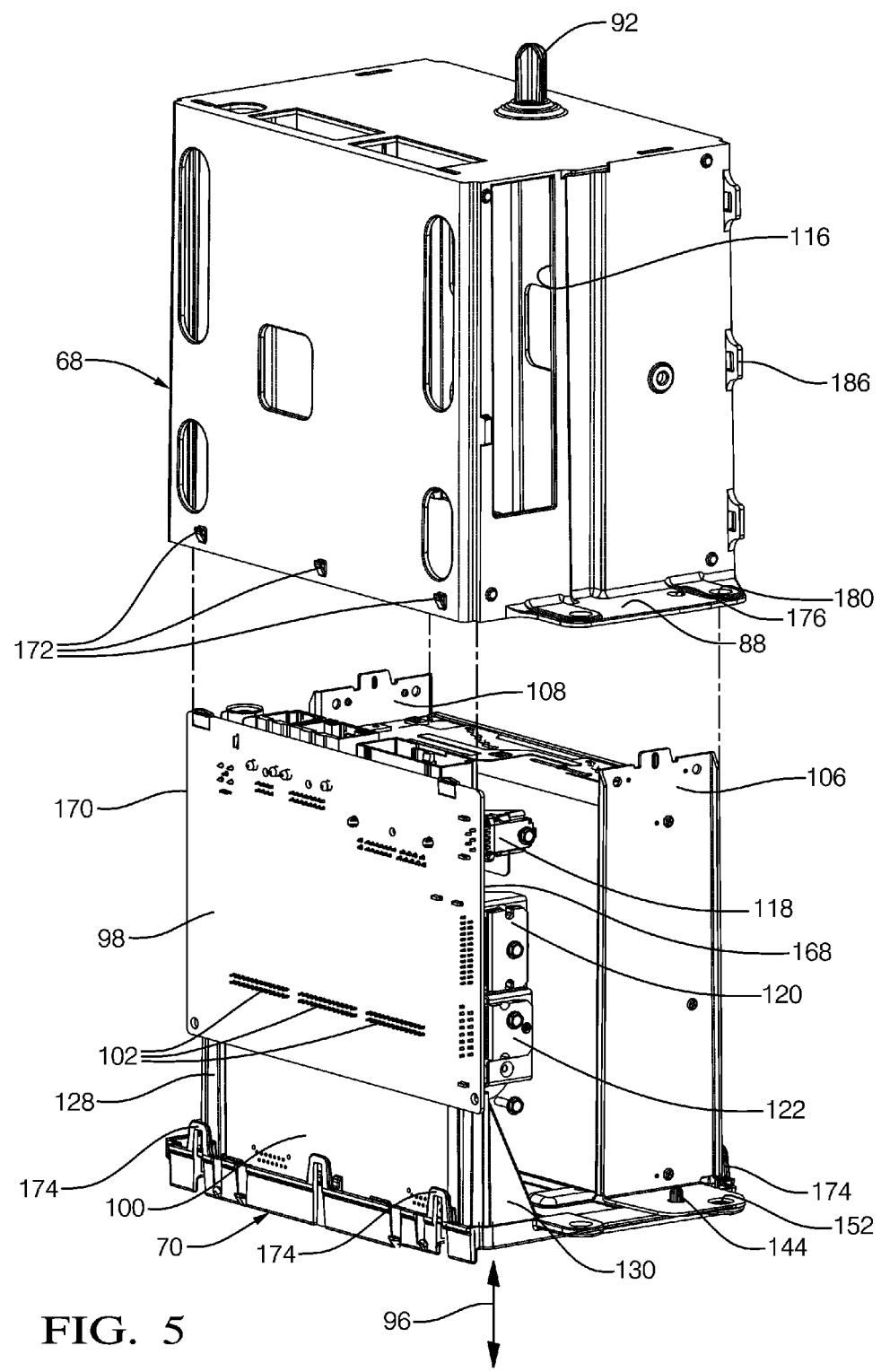
FIG. 5, is an exploded, perspective view of the radio/CD player of FIG. 2, illustrating final assembly step II in the production thereof wherein the case is slid and snapped to the faceplate.
Figure 49:
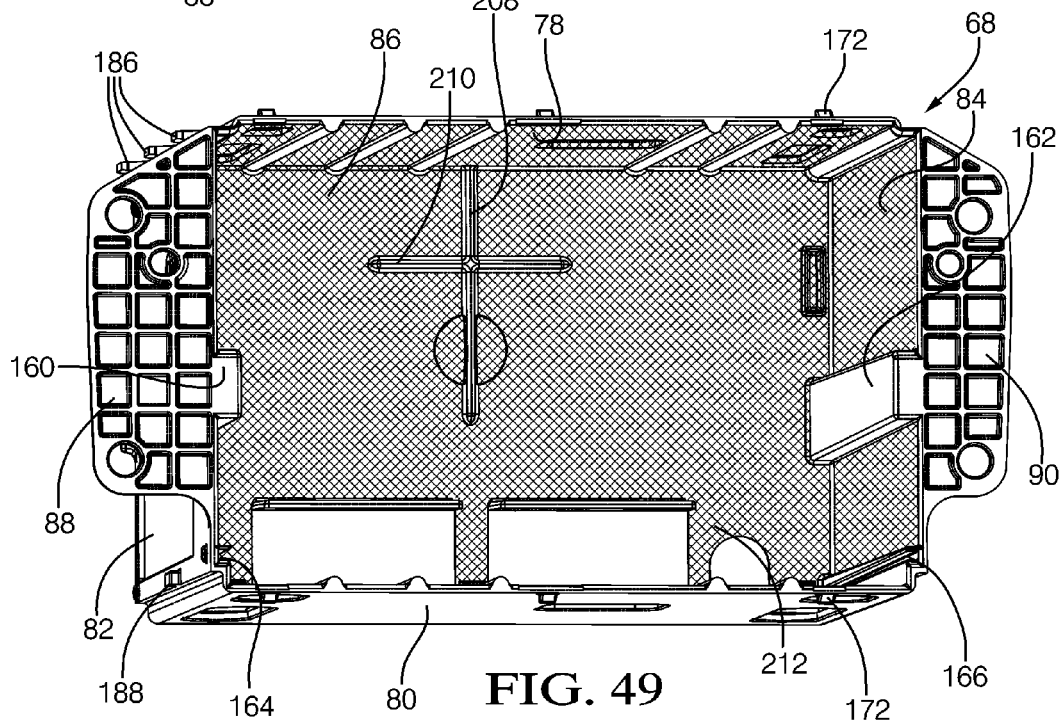
FIG. 49, is a front perspective view of the interior surface details of the case/back-end illustrating the wire mesh screen which has been insert molded within the case adjacent the inner surface portions thereof.

As best viewed in FIGS. 3, 5 and 49, the centerline of the case 68 is first manually aligned with the assembly axis 96 and rotationally positioned with the subassembly consisting of the circuit board subassembly 64, CD player subassembly 66 and the front plate 70, whereby a first cooperating pair of guideways 160 and 162 integrally formed in case sidewall portions 82 and 84 register with the CD player mounting brackets 106 and 108 and, simultaneously, a second cooperating pair of guideways 164 and 166 integrally formed in case sidewall portions 82 and 84 register with lateral edge guide surfaces 168 and 170 of common PCB 98. The case 68 is then manually displaced along the assembly axis 96 until the leading edge thereof defining front opening 94 contacts the rear surface of the front plate 70. Thereafter, cooperating ramped snap-engagement features 172 and 174 integrally formed with upper and lower wall portions 78 and 80 of the case 68 and the front plate 70, respectively, momentarily self-displace one another and snap back to self-engage to establish a positive interlock therebetween.

The case mounting flanges 88 and 90 form through holes 176 and 178 which register and self-engage with nibs 144 and 146, respectively, to provide a redundant engagement feature. Furthermore, the case mounting flanges 88 and 90 form a second set of through holes 180 and 182, respectively, which register with through holes 152 and 154 of mounting brackets 106 and 108, and through holes 152 and 154 of front plate mounting flanges 148 and 150, respectively.

Figure 2:
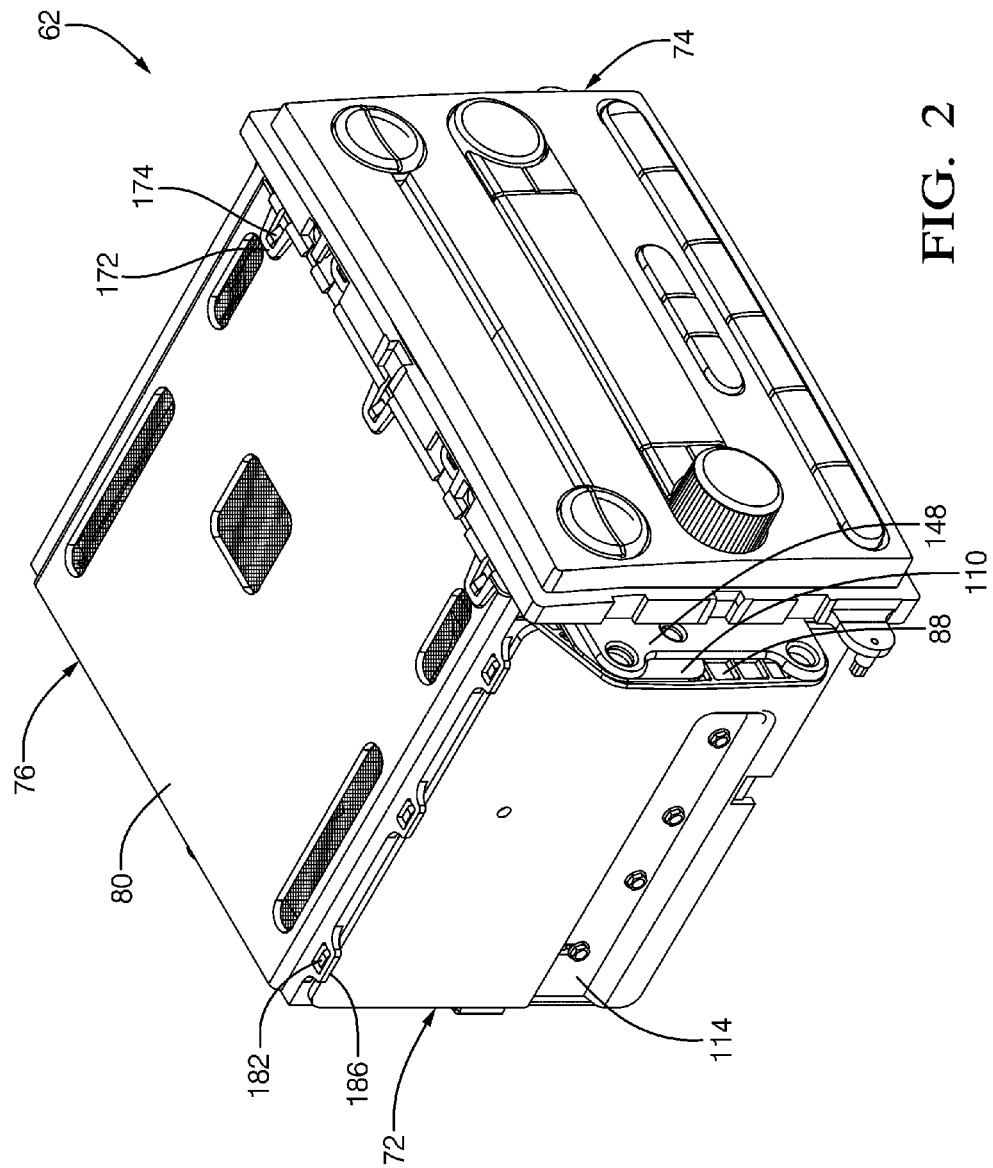
FIG. 2, is a front-left perspective view of the preferred embodiment of the present invention embodied in an automotive radio/CD player.
Figure 3:
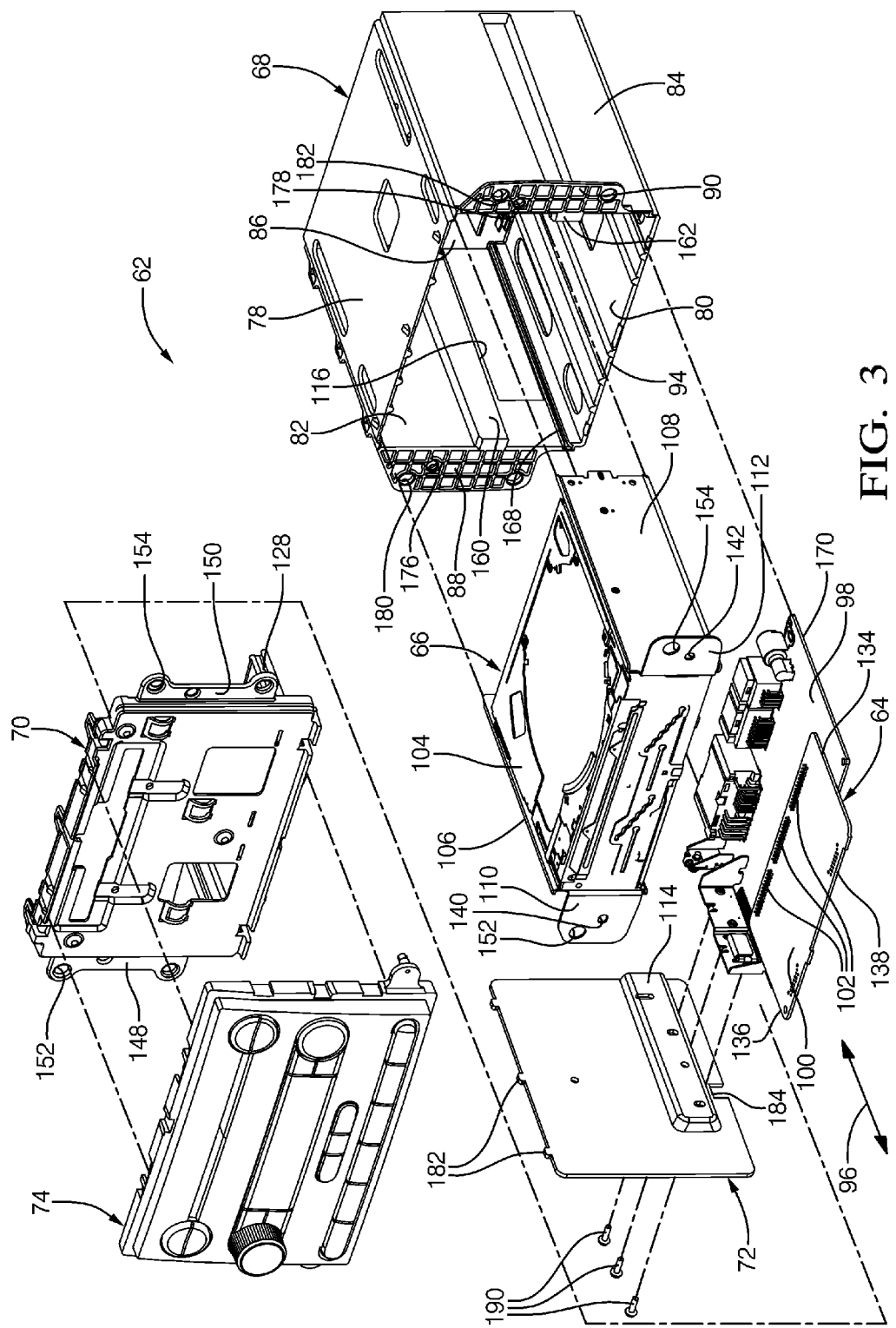
FIG. 3, is an exploded, perspective view of the radio/CD player of FIG. 2, illustrating the major subcomponents and subassemblies thereof.
Figure 6:
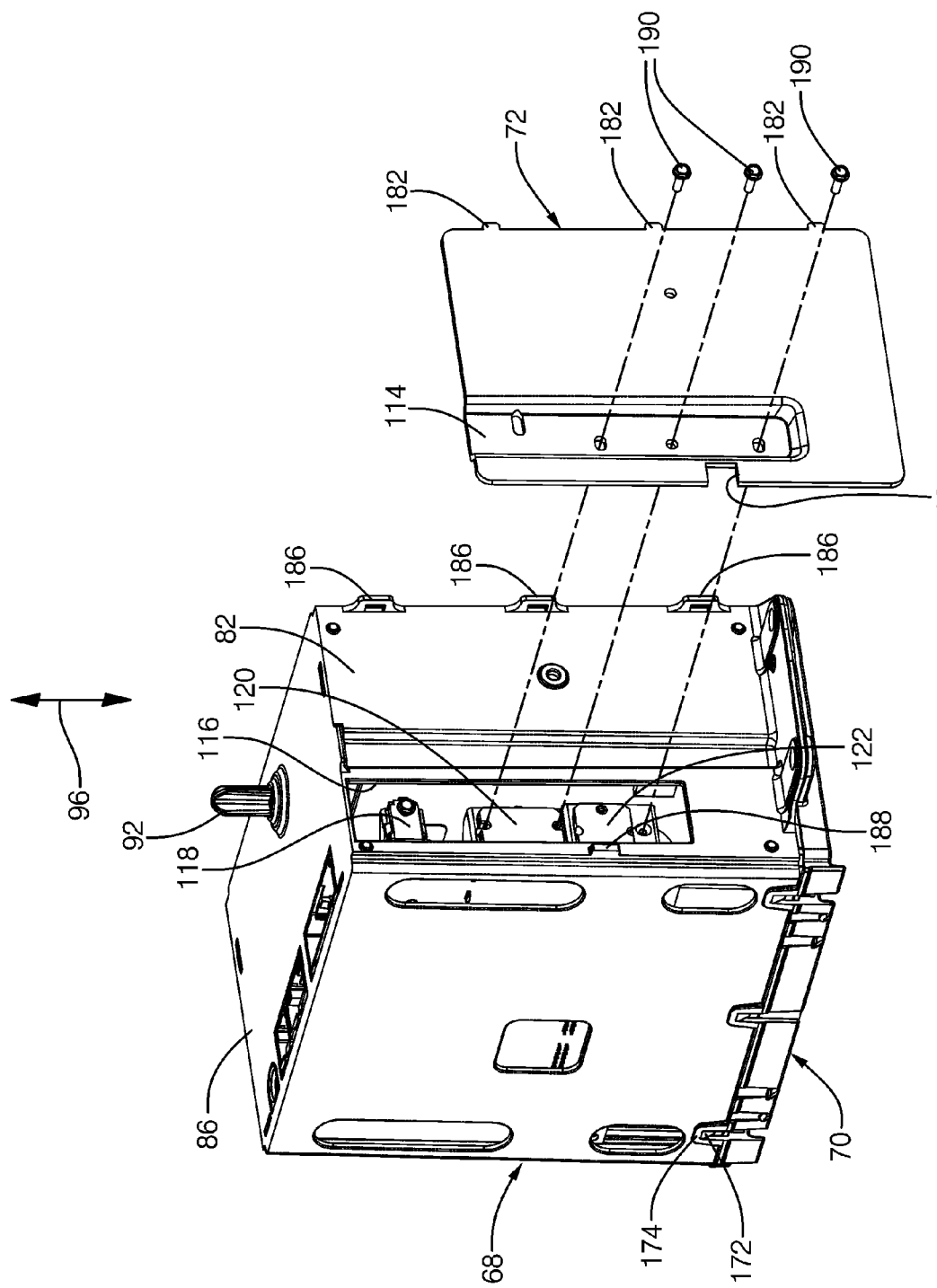
FIG. 6, is an exploded, perspective view of the radio/CD player of FIG. 2, illustrating final assembly step III in the production thereof wherein the power device retainer clip and heat sink are consecutively anchored, pivoted and snapped to the side of the case.
Figure 7:
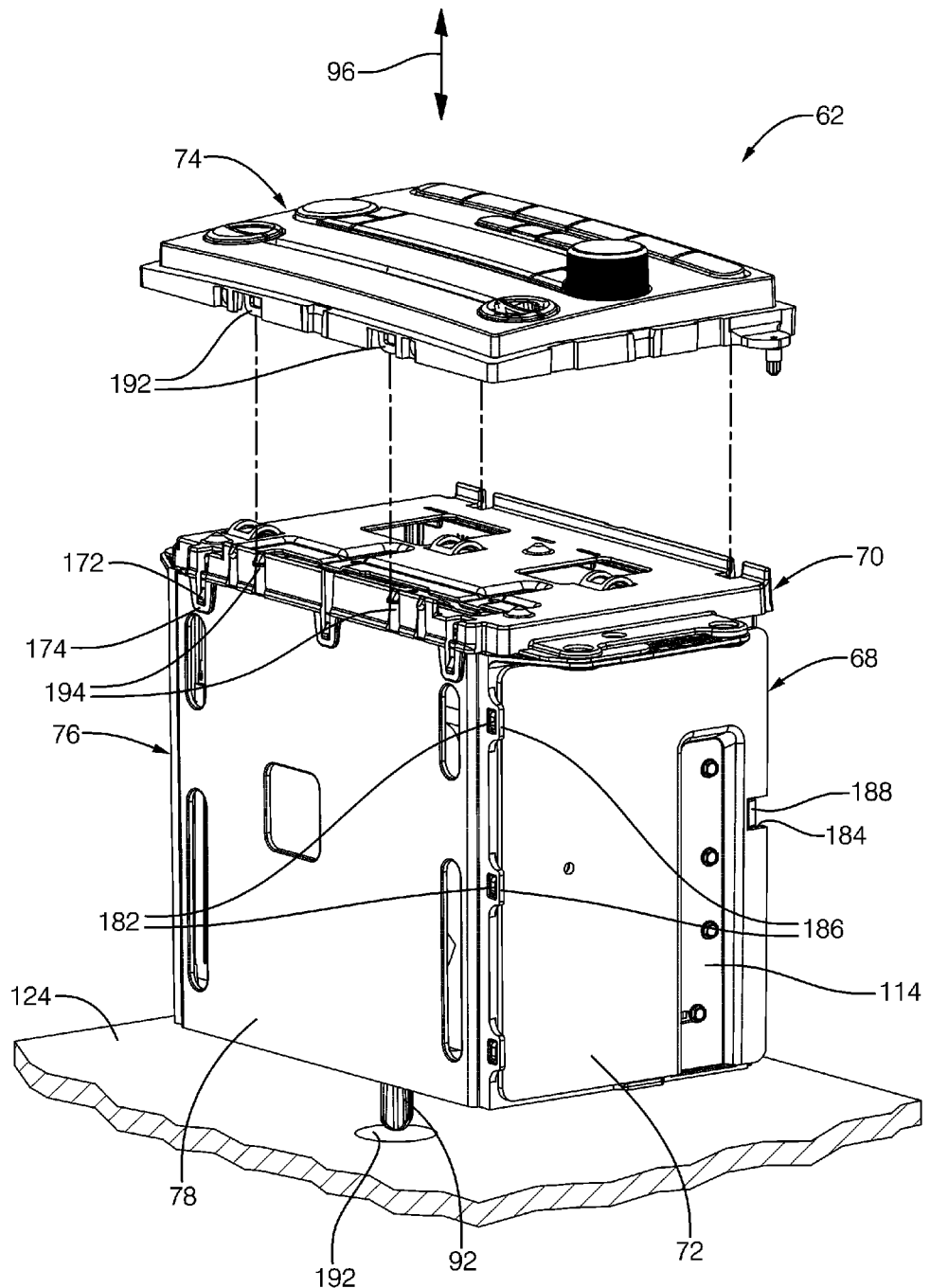
FIG. 7, is an exploded, perspective view of the radio/CD player of FIG. 2, illustrating final assembly step IV in the production thereof wherein the trim plate assembly is snapped to the faceplate/back-end assembly.

As best viewed in FIGS. 2, 6 and 7, the heat sink 72 is next installed. The heat sink 72 includes several locating tabs 182 integrally formed along one edge thereof and a locator recess 184 formed in an opposed edge. The heat sink 72 is manually affixed to the outer surface of the case left side wall portion 82 which defines integral tab receiving extensions 186 along the upper edge thereof. Once the heat sink locating tabs 182 are inserted within their respective case wall portion extensions 186, the heat sink 72 is rotated into its design position illustrated in FIG. 7 wherein a resilient ramped catch member 188 integrally formed along the bottom edge of the left side wall portion 82 snap engages the recess 184 to fixedly interlock the heat sink 72 to the case 68.

When the heat sink 72 is in its installed position, the recessed portion 114 extends inwardly into the case 68 through the port 116. The inner surface of the recessed portion 114 establishing an abutting relationship against the power circuit components 118, 120 and 122 to provide a cooling thermal convector to the exterior of the case 68. Means are provided to ensure that components 118, 120 and 122 remain in intimate contact with the heat sink 72 such as screws 190, or, preferably (as illustrated in FIGS. 22-29 and 41-43) to continuously resiliently urge the components into engagement with the recessed portion 114 of the heat sink 72.

It is contemplated that the heat sink 72 could be alternatively mounted to the case rear wall portion 86, whereby it would be installed along the assembly axis 96.

Referring to FIG. 7, the final step of assembling the major components and subassemblies is illustrated. First, the subassembly of the components illustrated in FIG. 6 is manually inverted, with the case rear wall portion 86 disposed on the designated work surface 124. Due to the localized outward projection of the stud 92, a stability enhancing spacer (not illustrated) or, alternatively, a recess 192 in the work surface 124 ensures a stable platform to complete assembly.

The trim plate subassembly 74 is then manipulated to become in register with the case 68 and manually displaced along the assembly axis 96 until the lower surface of the trim plate assembly 74 contacts the upper surface of the front plate 70 (as depicted in FIG. 7). Thereafter, cooperating ramped snap-action engagement features 192 and 194 integrally formed with upper and lower edge skirt surfaces of the case trim plate assembly 74 and the front plate 70, respectively, momentarily self-displace one another and snap back to self-engage to establish a positive interlock therebetween.

The completed assembly of the major components and subassemblies is depicted in FIGS. 2, 8-10 and 48. Following the assembly process, the completed radio/CD player 62 is placed in a queue for testing and quality checks.

As is best illustrated in FIG. 49, vertical and horizontal bosses 208 and 210, respectively, are located directly interiorly of the stud 92 to reinforce the rear wall portion 86 of the case 68 to prevent "oil-canning" and allows use of relatively thin wall section for enhanced weight saving.

Figure 50:
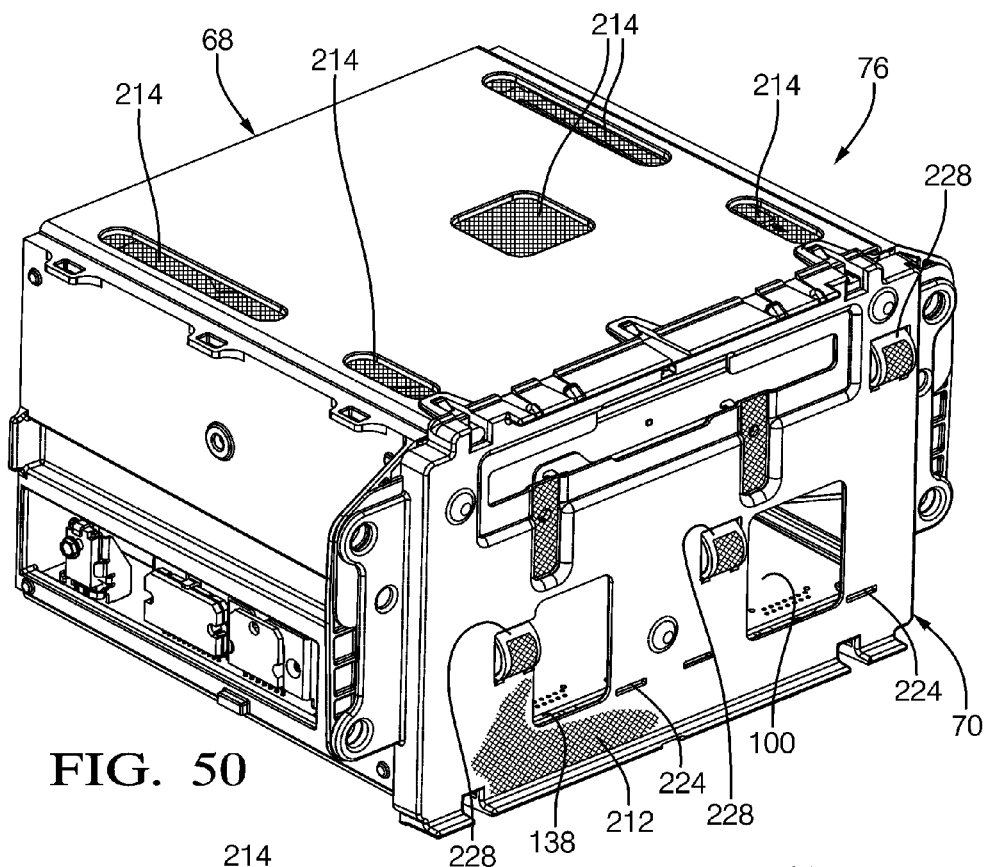
FIG. 50, is a front-above perspective view of a partially assembled radio/CD player, substantially similar to that illustrated in FIG. 7 (prior to installation of the trim plate assembly), illustrating, inter alia, (1) three outwardly directed spring contacts carried by resilient members integrally formed with the faceplate and (2) the juxtaposition of the wire mesh within the faceplate adjacent the outer surface thereof.
Figure 51:
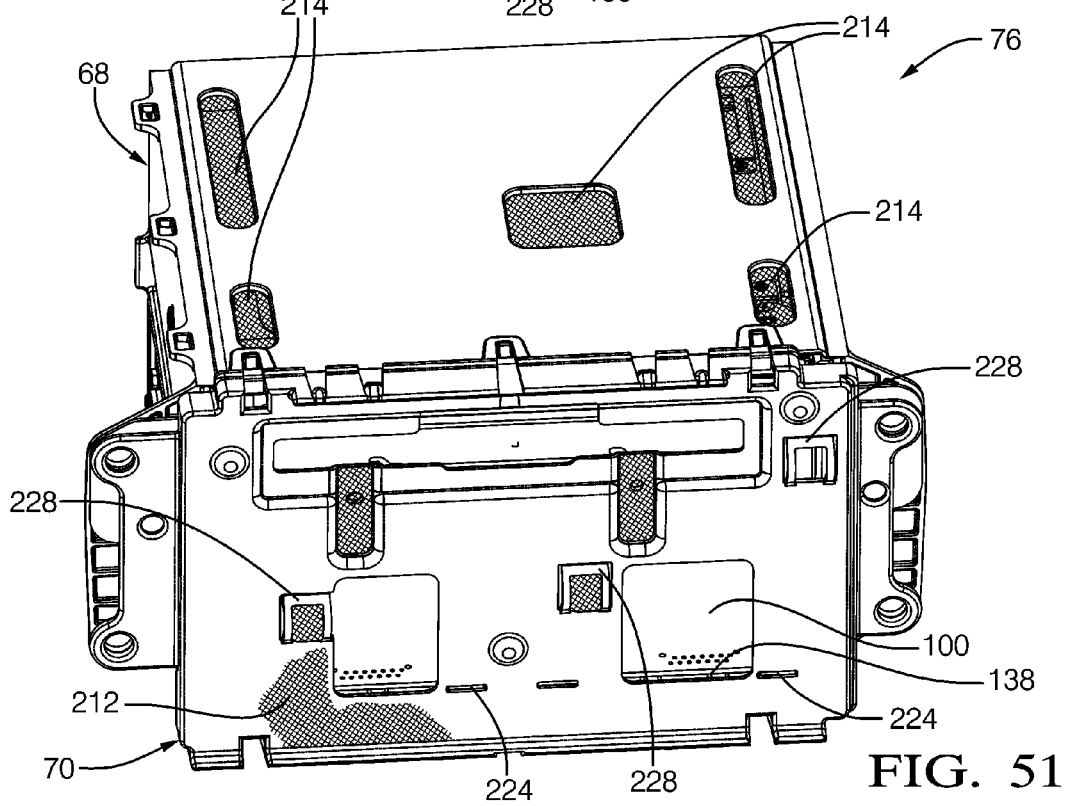
FIG. 51, is a front-left perspective view of the partially assembled radio/CD player of FIG. 50, illustrating the same features from a different perspective.
Figure 52:
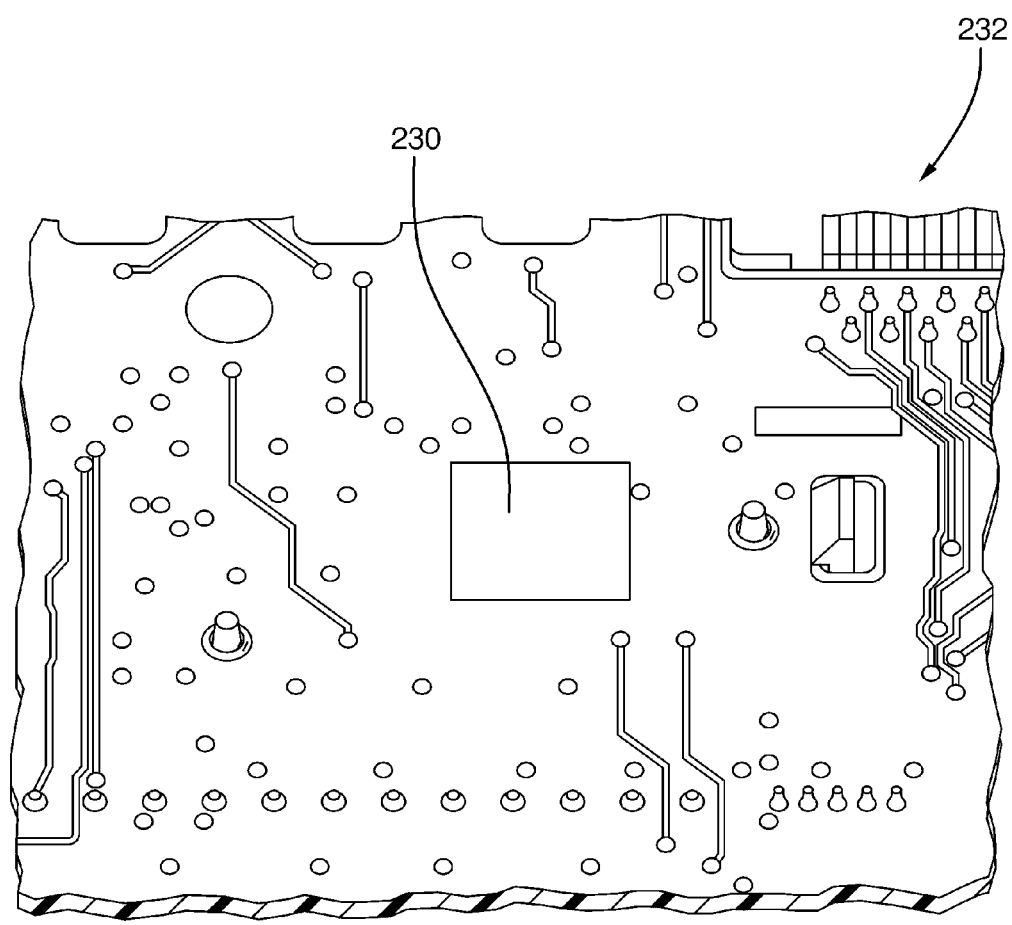
FIG. 52, is a fragmentary, perspective view of a keyboard assembly printed circuit board carried on the inside surface of the trim plate assembly illustrating one of three contact pads which, after assembly, register with and establish electrical interconnection with spring contacts illustrated in FIGS. 50 and 51.
Figure 53:
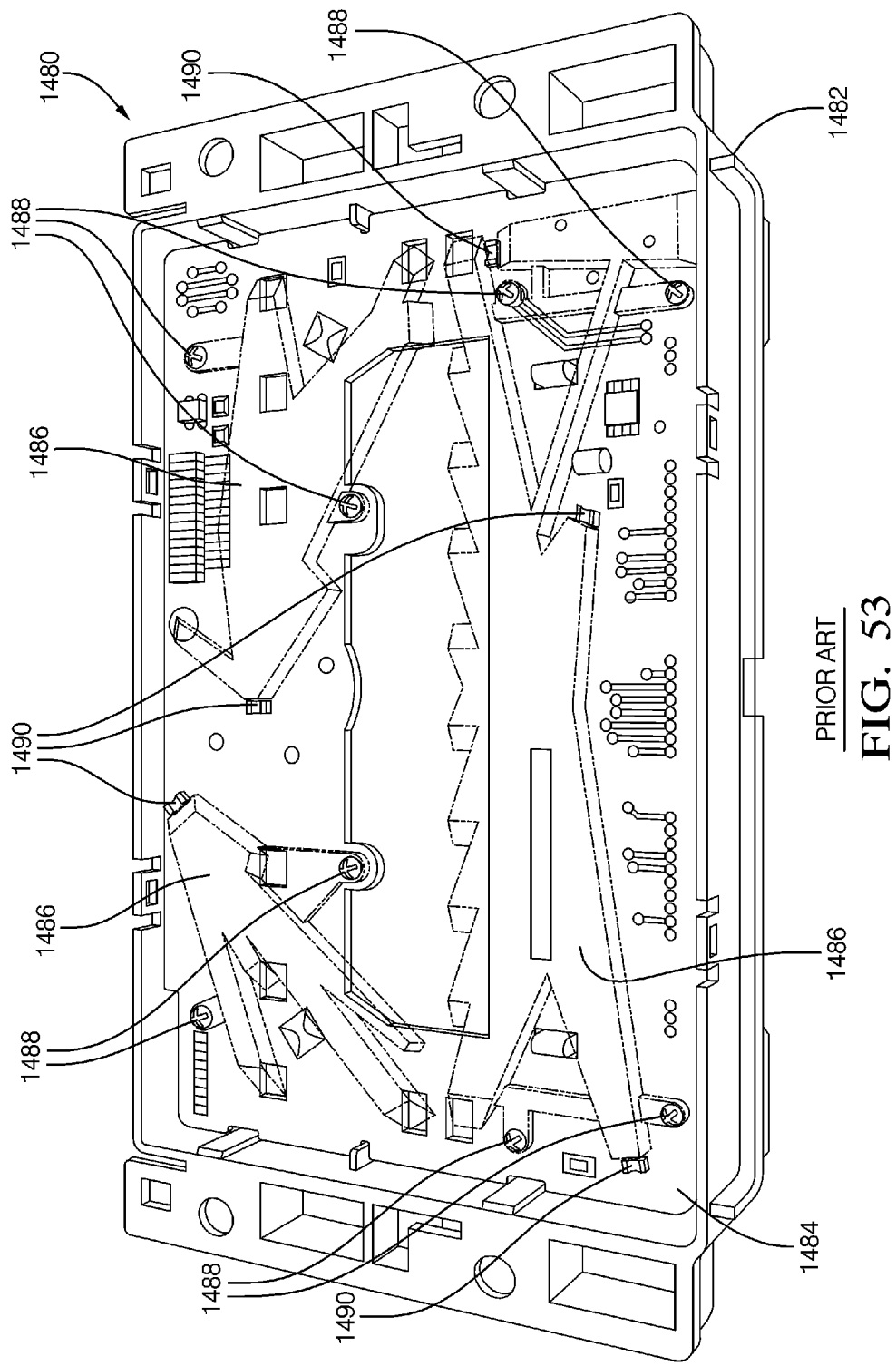
FIG. 53, is a perspective view of the back side of the trim plate assembly of the prior art radio/CD player illustrated in FIG. 1, illustrating the surface details thereof.

FIGS. 49-51 illustrate an alternative construction of the case 68 and front plate 70 of the housing assembly 76 wherein both elements of the case assembly 76 are formed of a composite of relatively rigid polymer material and electrically conductive material operable to shield the audio components (such as the circuit board subassembly 64 and the CD player subassembly 66) from electrical anomalies including radio frequency interference (RFI), electromagnetic interference (EMI), bulk current injection (BCI) and electrostatic discharge (ESD). The electrically conductive material comprises substantially continuous planer sheet portions applied to surfaces of or within polymer housing assembly wall portions as discrete elements, electrically conductive paint, foil or electrostatic or vacuum deposition applied material. Alternatively, the electrically conductive material comprises a wire mesh screen 212 which has been cut and folded to net shape and inserted within a mold cavity whereby it is effectively insert molded within the polymer based material. Preferably, the wire screen 212 is centered within the wall portions of the case and front plate whereby electrically insulating polymer material effectively covers the wire screen 212, both inside and out, to prevent inadvertent grounding of the housing assembly to interior or exterior structures.

Through empirical testing and development, the inventors have found that it is preferable to locate the wire screen 212 near the inside surface of the case 68 and the outside surface of the front plate 70. Openings 214 are provided in the case 68 by locally eliminating the polymer material but leaving the wire screen intact, whereby judiciously positioned openings 214 provide natural convection cooling to the ambient without having a break or gap in the electrical anomaly protection provided by the wire screen 212.

Circuit Board Grounding to Wire Mesh System (3)

The common circuit board and the unique circuit board are grounded to the molded in wire mesh by using a grounding clip that contacts the ground plane on the circuit board to the metal mesh by pressing the circuit board with the clip installed into a hole or recess in the plastic box that exposes the mesh. A point/ridge/protuberance is used on the clip to press into the mesh and increase the pressure for intimate contact. An alternative of this clip is one that gets surface mounted and soldered to the board and does not require manual assembly.

Referring to FIGS. 11 and 12, one form of grounding the ground plane 216 of the circuit board subassembly 64 to the wire screen 212 is illustrated. The leading edge surface 138 of the unique PCB 100 carries two beryllium copper grounding clips 218, which are electrically and mechanically connected to the PCB ground plane 216. Similarly, a trailing edge surface 222 of the common PCB 98 carries two grounding clips 218. Each grounding clip 218 includes a resilient contact arm 220 extending outwardly along the assembly axis 96. Upon assembly, the grounding clips 218 carried on the leading edge surface 138 of PCB 100 register with exposed wire screen 212 within windows 224 in front plate 70 (refer FIGS. 50 and 51), and the grounding clips 218 carried on the trailing edge surface 222 of PCB 98 register with exposed wire screen 212 within windows 226 in the rear wall portion 86 of the case 68. The contact are 220 of each grounding clip 218 is configured to continuously bear against the adjacent exposed wire screen 212 to maintain electrical contact therewith.

Referring to FIGS. 54-60 and 61-64, alternative forms of grounding the ground plane 216 of the circuit board subassembly 64 to the wire screen are illustrated. FIG. 133 illustrates a radio/CD player 622 similar in all material respects to the radio/CD player 62 described hereinabove in connection with FIGS. 2-10 and 11-16 inter alia, with the exceptions described immediately hereinbelow. In essence, in this embodiment, the four ground clips 218 contained on the circuit board subassembly 64 are deleted and replaced by connectors integrally formed with the housing assembly 76.

Figure 54:
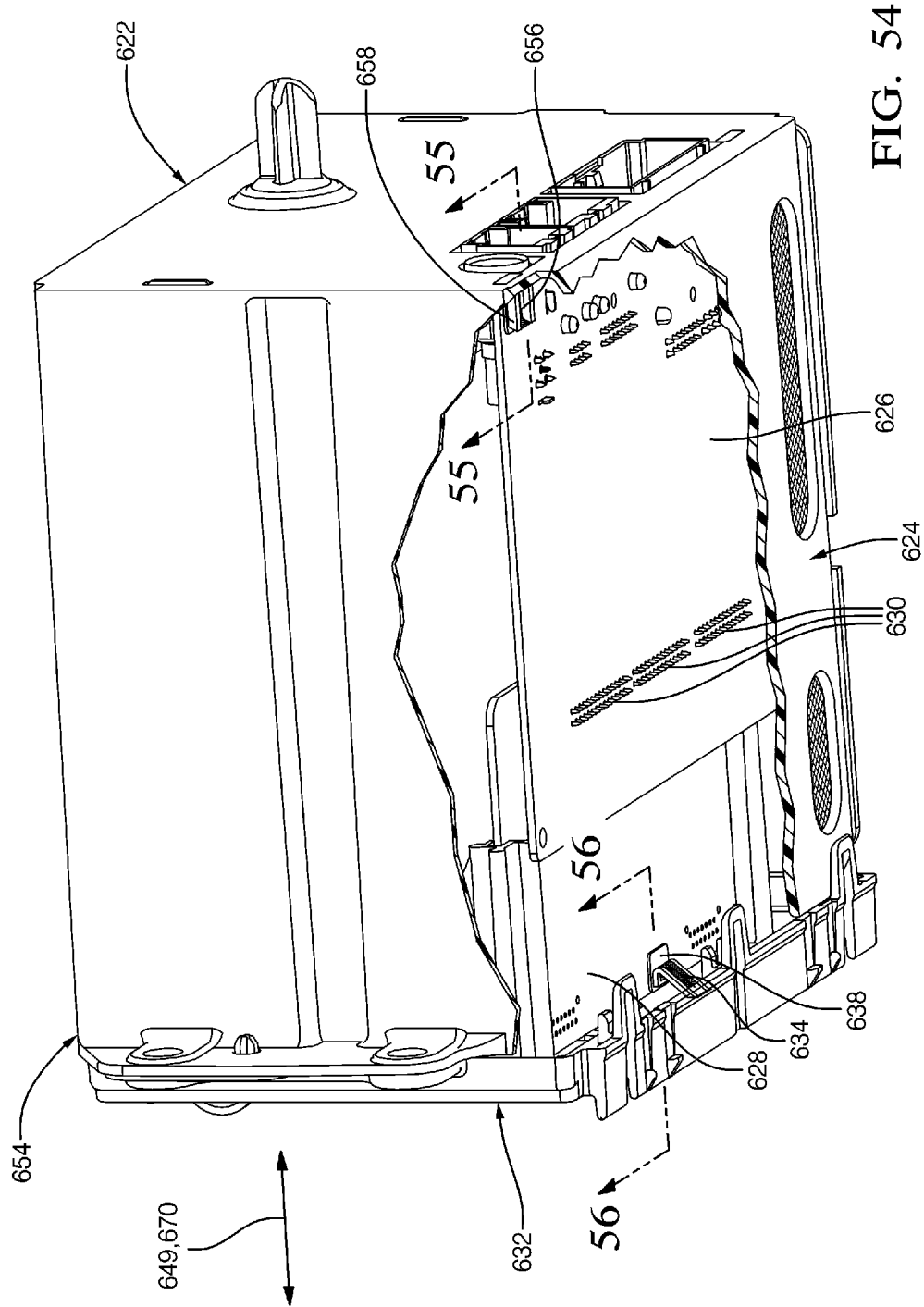
FIG. 54, is a broken, bottom-rear perspective view of an audio system assembly embodying an alternative embodiment of the present invention illustrating internal PCB front and rear edge self-grounding with integral features of the audio system housing assembly.
Figure 56:
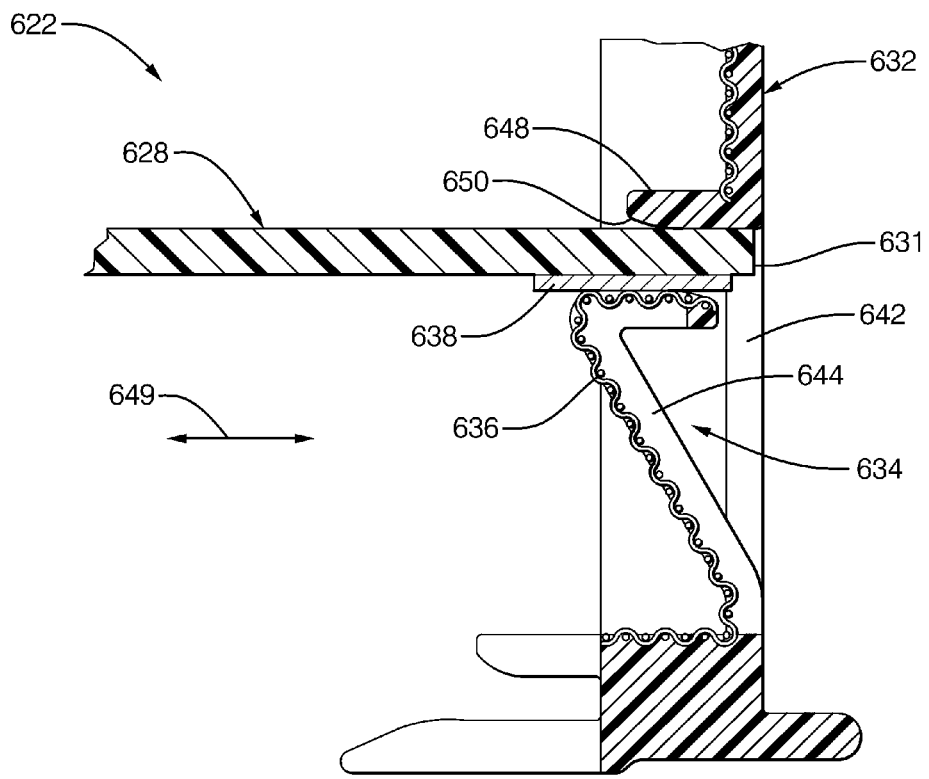
FIG. 56, is a broken, cross-sectional view, on an enlarged scale, of the front edge of the PCB of FIG. 54 self-engaging and self grounding with exposed electrically conductive shield and guide tangs integrally formed with the audio system housing assembly.
Figure 58:
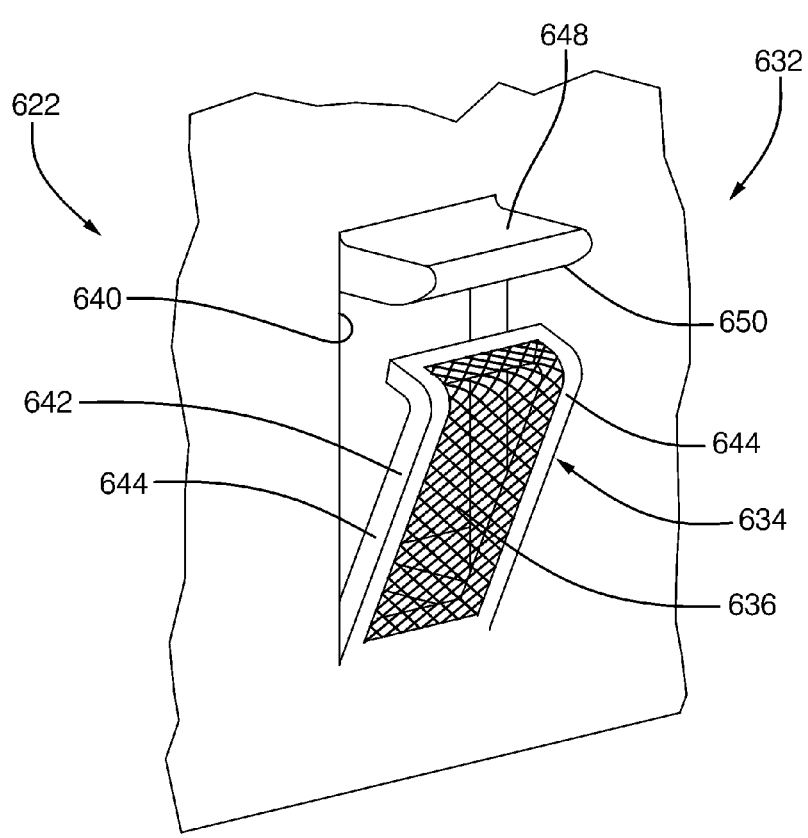
FIG. 58, is a broken, forward facing perspective view of the exposed electrically conductive shield and guide tangs of FIG. 56, with the PCB removed.

Referring to FIGS. 54, 56 and 58, a circuit board subassembly 624 includes a common PCB 626 interconnected with a unique PCB 628 by pin connectors 630. A leading edge 631 of the unique PCB 628, when installed within a front plate 632, engages two Z-clips 634 integrally formed within the front plate 632, whereby wire screen 636 exposed in the Z-clip 634 engages a contact pad/plane 638 carried on the unique PCB 628 adjacent its leading edge 631. A trailing edge 652 of the common PCB 626, when installed in a housing case 654, engages two grounding clips 658 integrally formed within the case 654, whereby wire screen 636 exposed in the grounding clip 656 engages a contact pad/plane 658 carried on the common PCB 626 adjacent its trailing edge 652.

As best viewed in FIGS. 56 and 58, the Z-clip 634 includes a frame 640 integrally formed adjacent one side of an associated opening 642 and extending inwardly (within an associated housing case 643) therefrom as a resilient cantilever. The frame 640 includes two parallel "L' or "J" shaped leg portions 644 interconnected by a cross support portion 646. A flap of wire screen 636 is die-cut prior to being injection molded within the front plate 632. During the injection molding process, the edges of the wire screen flap are insert molded within the leg portions 644, the cross-support portion 646 and the adjacent front panel of the front plate 632, thereby exposing the wire screen flap 636 for electrical connection with the unique PCB contact pad 638. An inwardly directed boss 648 is integrally formed on the front plate 632 adjacent an edge of the opening 642 opposite from the leg portions 644, and extends substantially parallel to an assembly axis 649. The boss 648 forms a guide/abutment surface 650 which is spaced from the exposed wire screen flap 636 by a dimension slightly less than the thickness of the unique PCB 628 to ensure a tight compressive fit when the leading edge 631 of the unique PCB 628 is inserted therebetween. The natural resiliency of the polymer material forming the Z-clip frame 640 ensures continued continuity of the electrical connection between the exposed wire screen 636 of the Z-clip and the unique PCB contact pad 638.

Figure 55:
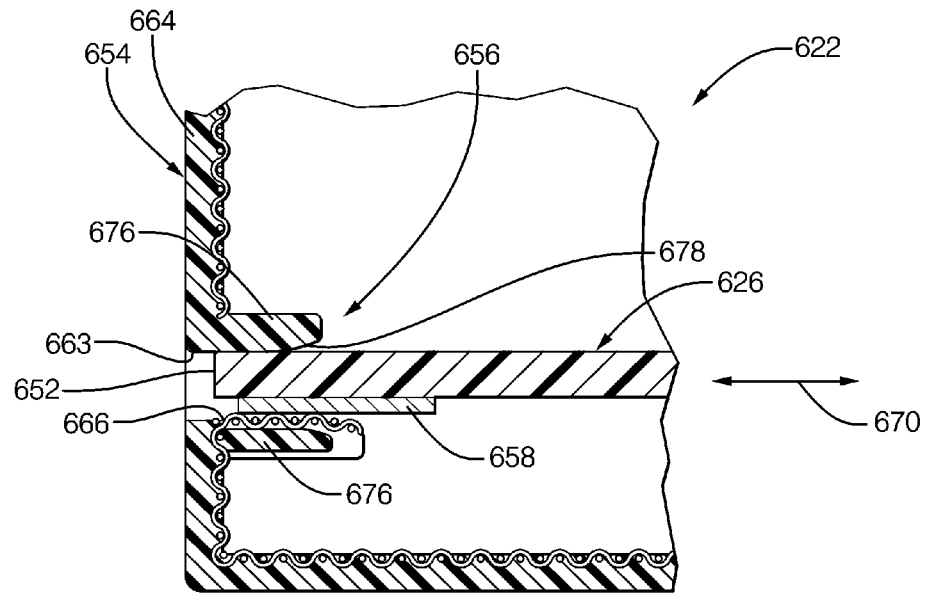
FIG. 55, is a broken, cross-sectional view, on an enlarged scale, of the rear edge of the PCB of FIG. 54 self-engaging and self-grounding with exposed electrically conductive shield and guide tangs integrally formed with the audio system housing assembly.
Figure 57:
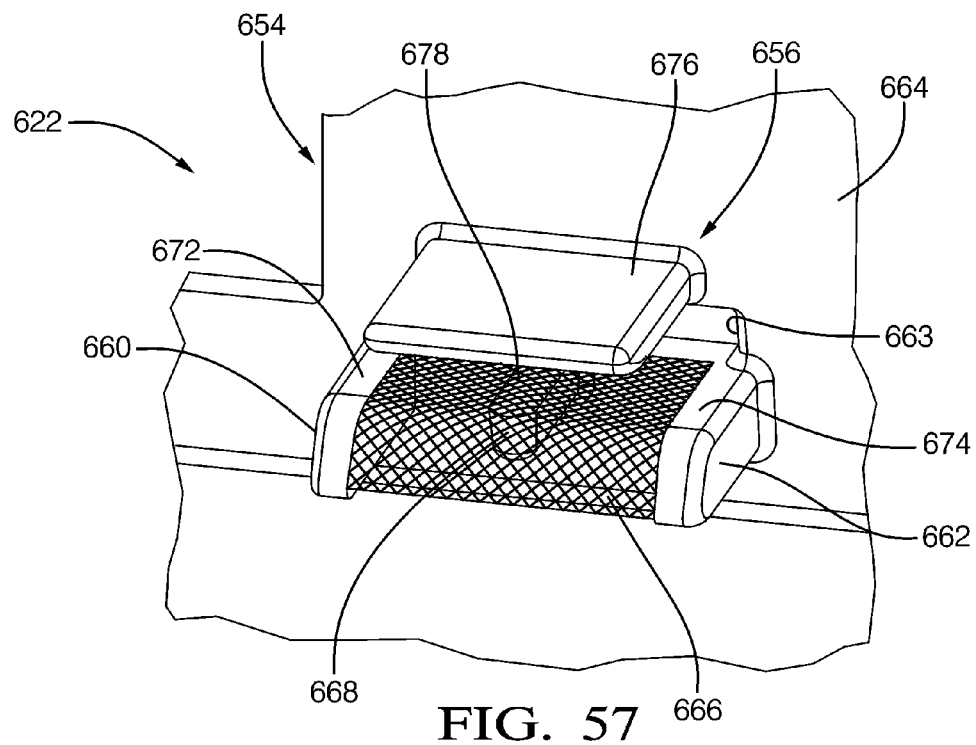
FIG. 57, is a broken, rear facing perspective view of the exposed electrically conductive shield and guide tangs of FIG. 55, with the PCB removed.

As best viewed in FIGS. 55 and 57, the grounding clip 656 includes a cooperating pair of laterally spaced support members 660 and 662 integrally formed in a rear wall portion 664 of the case 654 adjacent the bottom edge of an associated opening 663 and extending inwardly therefrom. A flap of wire screen 666 is die-cut prior to being injection molded within the case 654. During the injection molding process, the lateral edges of the wire screen flap 666 are insert molded within the support members 660 and 662 and the adjacent portion of the case rear wall portion 664, thereby exposing the wire screen flap 666 for electrical connection to the common PCB 626 contact pad 658. A wire screen positioning finger 668 is integrally formed in the rear wall portion 664 of the case 654 laterally intermediate the support members 660 and 662, and extends inwardly from the rear wall portion 664 substantially parallel to an insertion axis 670 as a resilient cantilever. The positioning finger 668 is vertically positioned with respect to the support members 660 and 662 to continuously contact the lower surface of the wire screen flap 666 to ensure that the lateral center portion of the wire screen flap 666 is bowed slightly upwardly and resiliently maintained at least slightly above the upper surface portions 672 and 674 of the support members 660 and 662, respectively. An inwardly directed boss 676 is integrally formed on the rear wall portion 664 of the case 654 adjacent the top edge of the opening 663 opposite from and laterally centered with the support members 660 and 662. The boss 676 forms a guide/abutment surface 678 which is spaced from the exposed wire screen flap 666 by a dimension slightly less than the thickness of the common PCB 636 to ensure a tight compressive fit then the trailing edge 652 of the common PCB 636 is inserted therebetween. The natural resiliency of the polymer material forming the ground clip 656 structural elements ensures continued continuity of the electrical connection between the exposed wire screen 666 of the ground clip 656 and the common PCB contact pad 658.

Figure 59:
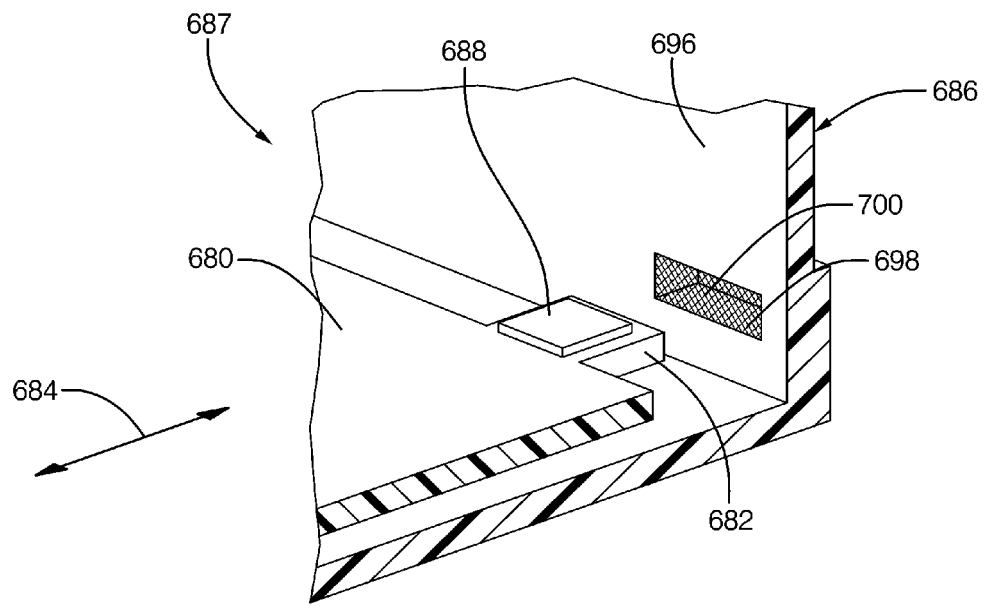
FIG. 59, is a broken, perspective, cross-sectional view of an alternative approach to self-grounding a PCB, wherein a rearwardly directed extension of the PCB containing grounding pads on the top or bottom (or both) surfaces thereof registers with an opening formed in the rear wall of the case exposing electrically conductive screen.
Figure 60:
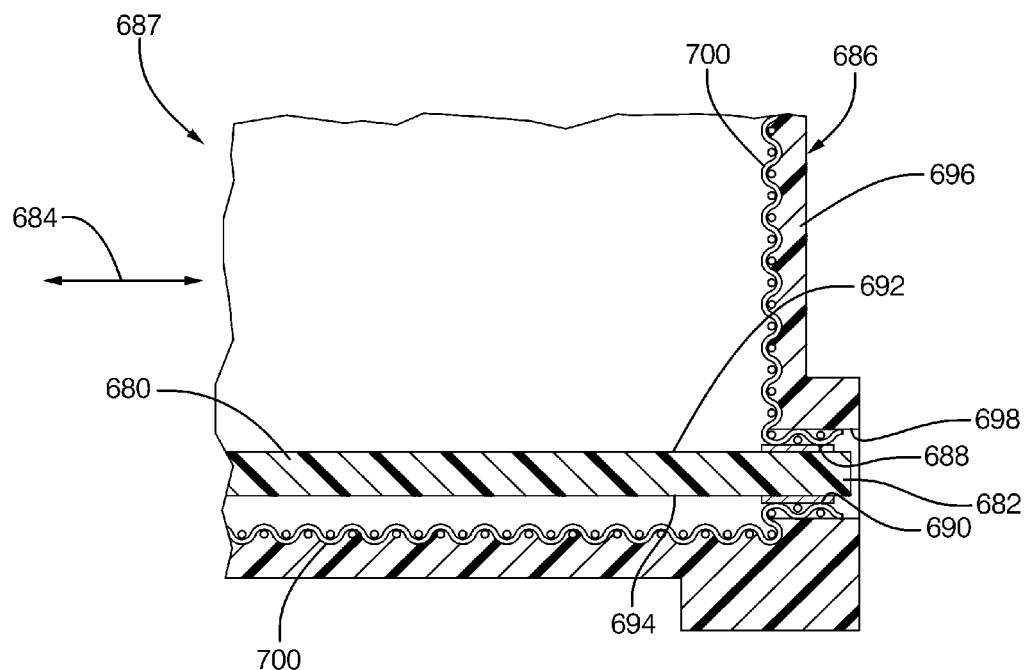
FIG. 60, is a broken, cross-sectional view of the alternative embodiment of FIG. 59, with the PCB is in its installed design position wherein the extension has pierced the exposed screen and established electrical connection between the grounding pads and the screen.

Referring to FIGS. 59 and 60, another example of self-grounding is illustrated wherein a PCB 680 includes an extension 682 projecting forwardly therefrom in line with an assembly axis 684 of a housing case 686 for an audio system 687. Contact pads 688 and 690 are carried on upper and lower surfaces 692 and 694 of the PCB extension 682. A rear wall portion 696 of the case 686 forms a window 698 exposing a portion of wire screen 700 which is aligned with the PCB extension 682. When the wire screen 700 is insert molded within the polymeric material forming the case 686, the portion thereof coinciding with the window 698 is left intact. During the assembly process of the audio system 687, wherein the PCB is installed by insertion along guideways (not illustrated) within the case 686, the PCB is inserted with sufficient force to locally rupture and penetrate the exposed wire screen 700 within the window 688. Following the rupture of the wire screen 700, the residual separation edges thereof are drawn into the window 698 by friction caused by motion of the upper and lower PCB surfaces 692 and 694, respectively. When the PCB 680 assumes its installed position, as illustrated in FIG. 139, the rended portions of the wire screen 700 are compressively fit between the contact pads 688 and 690 and the adjacent edges of the window 698, ensuring continued continuity of the electrical connection between the exposed wire screen 700 and the PCB contact pads 688 and 690. It is contemplated that a single (one side of the PCB) contact pad can also be employed. However, the redundancy afforded by the dual contact pads 688 and 690 is preferable.

Figure 61:
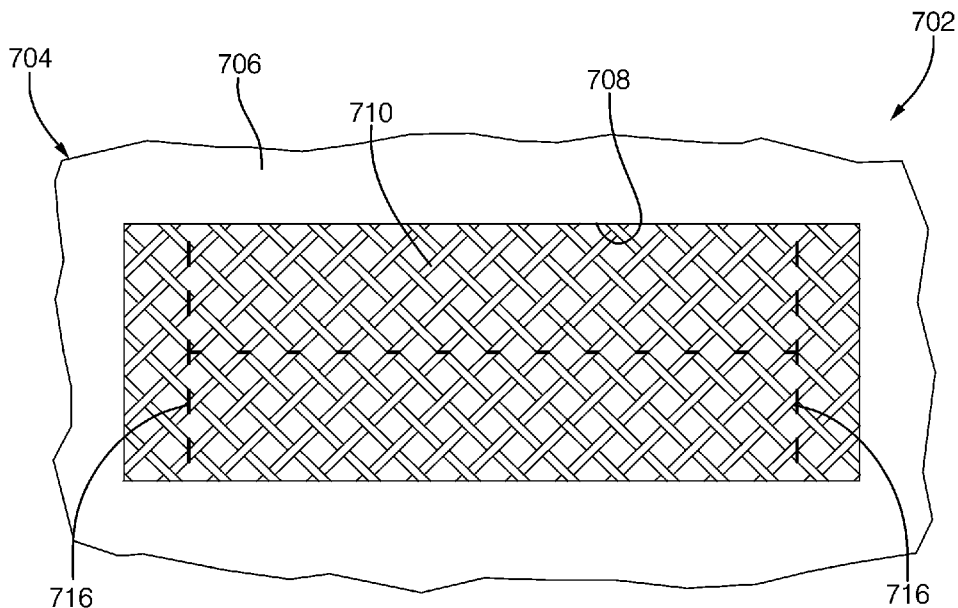
FIG. 61, is a broken, plan view of the rear case wall screened opening of FIG. 138, on an enlarged scale, with the exposed screen having a pattern of perforations formed therein.
Figure 62:
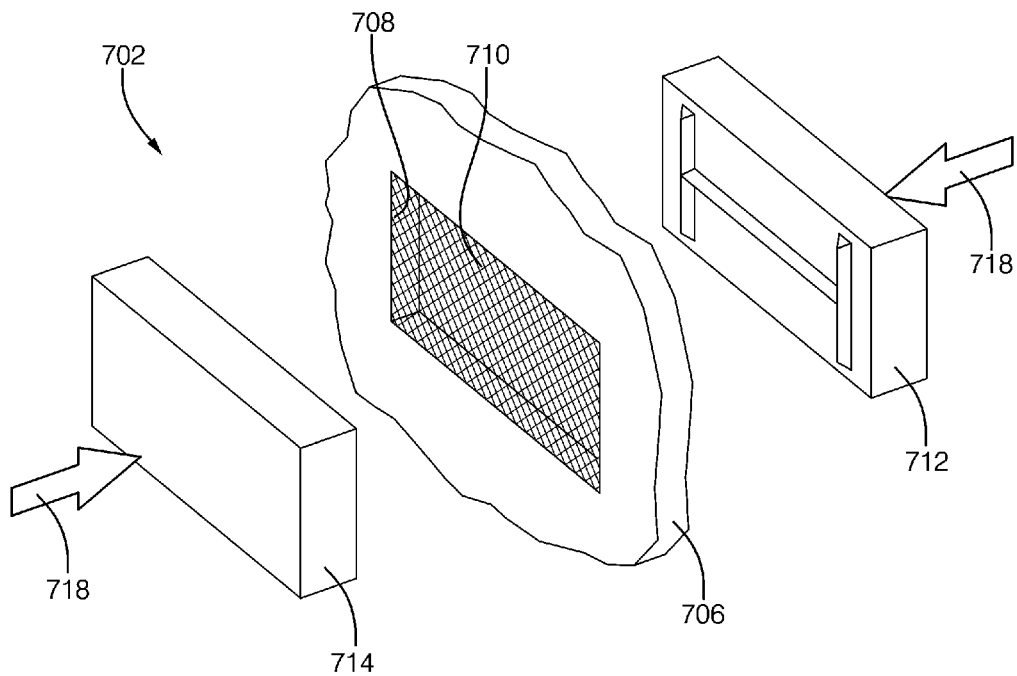
FIG. 62, is a broken perspective view of the exposed screen of FIG. 61, prior to formation of the perforations, and its juxtaposition with an aligned pair of punch-type forming dies.

Referring to FIGS. 61 and 62, a modification of the self-grounding system described in connection with FIGS. 138 and 139 can enhance assembly of an audio system 702 for simplified and improved unit-to-unit repeatability. A housing case 704 includes a wall portion 706 forming a window 708 exposing a wire screen 710 to establish a point of electrical connection to an audio component within the case 704. After the wire screen 710 is insert molded within the polymer material forming the case 704, but before the assembly if the audio system 702, a tool, such as a cooperating punch 712 and die 714 is pressed simultaneously against the inner and outer surfaces of the exposed screen 710 within the window 708 to form perforations or weakenings, indicated by dotted lines 716. This process step is indicated by arrows 718. The perforations 716 make the exposed wire screen 710 more predictably frangible for improved unit-to-unit quality. Thereafter, during final assembly of the audio system 702, the wire screen 710 separates along the perforations 716 when contacted by the leading edge of a PCB extension 682 (refer FIGS. 59 and 60).

Figure 63:
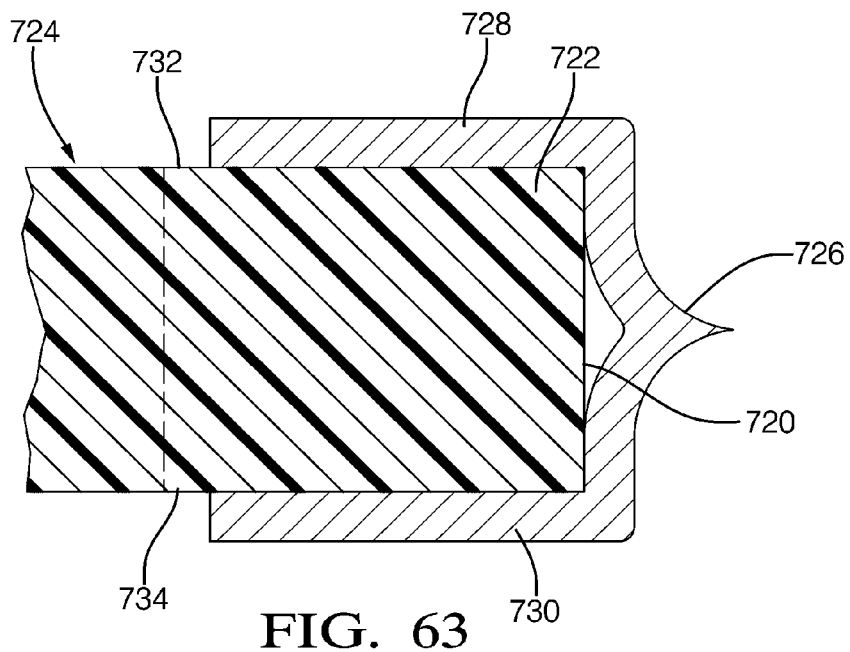
FIG. 63, is a cross-sectional view, on an enlarged scale, similar to FIG. 138, wherein the PCB extension carries a screen piercing tool which is integrally formed with the upper and lower grounding pads.
Figure 64:
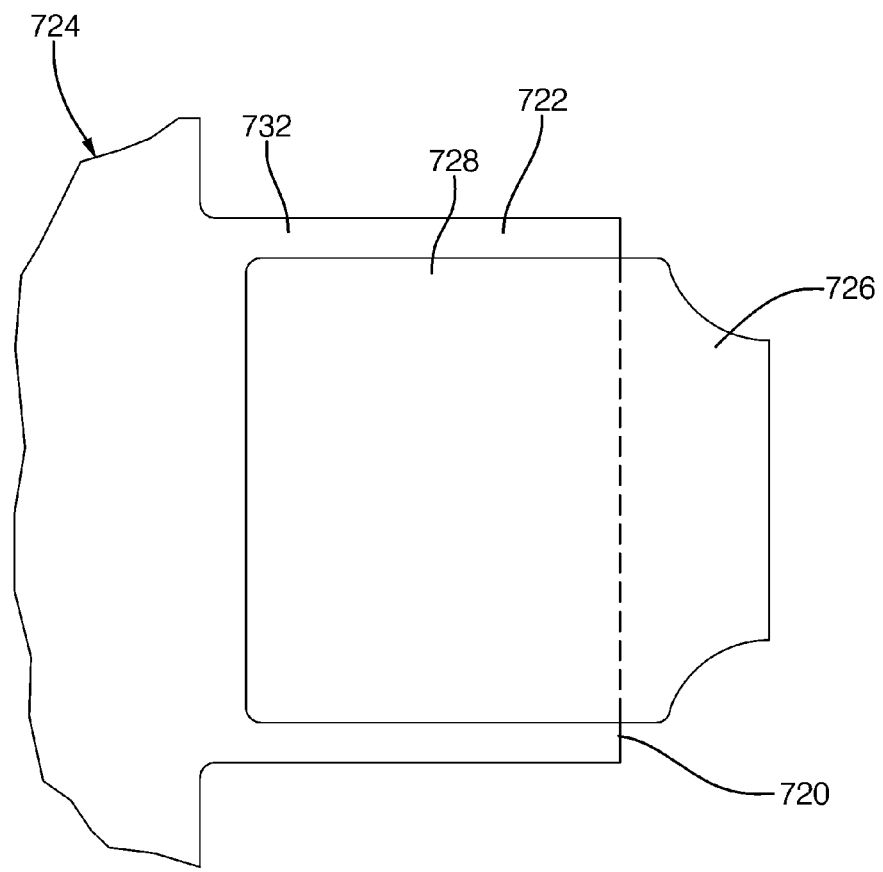
FIG. 64, is a broken, top view of the integrated grounding pad/piercing tool as carried on a PCB extension.

Referring to FIGS. 63 and 64, an alternative self grounding approach involves modifying a leading surface 720 of an extension 722 of a PCB 724 to form a sharpened, laterally extending leading edge 726. The leading edge 726 can be formed by the PCB material itself or, preferably, by hardened material, such as a metal appliqué or band formed in a "U" or a "V" configuration engaging the PCB 724 by upper and lower members 728 and 730 affixed to the upper and lower surfaces 732 and 734 of the PCB extension 722 such as by soldering. The upper and lower members 730 and 732 can serve as electrical ground pads. Upon installation of the PCB 724, the sharp leading edge 726 first contacts and cleaves the exposed wire screen 710 into the form illustrated in FIG. 139.

In addition to the forgoing, punch dies 712/714 such as those depicted in FIG. 156 can be employed in modified form to actually sever and/or remove a portion (or all) of the wire screen 710 after the molding of the housing case 704, but before the final assembly of the audio system 702. Furthermore, one or more service access windows can be provided elsewhere in the walls of the housing case 704. The service windows are closed at the time of manufacture by exposed screen including perforations, as depicted in FIG. 61. The exposed screen could be severed by a tool or process later in the service life of the audio system 702 to service or modify the system.

Front Plate ESD Grounding to Keyboard Through Wire Mesh (4)

The method of grounding the plastic front plate (with molded in metal mesh) to the keyboard is by using plastic spring clip that contains an open window to expose the mesh where the spring clip comes into contact with a tinned pad on the keyboard. This provides an ESD path to ground when inserting a static charged CD into the CD changer.

Referring to FIGS. 13-17 and 50-52, several spring clip structures 228 are integrally formed in the front plate 70 which, in assembly, continuously resiliently bear locally exposed segments of the wire screen 212 against a tinned grounding pad 230 (only one is illustrated) on a keypad PCB 232 to establish a ground path therebetween.

Each spring clip structure 228 has a frame 234 including two parallel arc shaped portions 236 and 238 and a cross-support portion 240 integrally formed with front plate 70 and extending therefrom as a resilient cantilever. An opening 242 in the front plate registers with each spring clip 228 to permit flexure thereof.

Prior to molding of the wire screen 212 within the front plate 70 the screen preform is die-cut to form an integral flap which is captured within the mold and the edges thereof encased within arc-shaped portions 236 and 238 and cross-support portion 240. The central portion of the exposed wire screen is expanded or stretched to form an outward bow shape (refer FIGS. 18 and 20) to ensure that the resulting exposed screen protuberance firmly contacts the PCB grounding pad 230.

Figure 17:
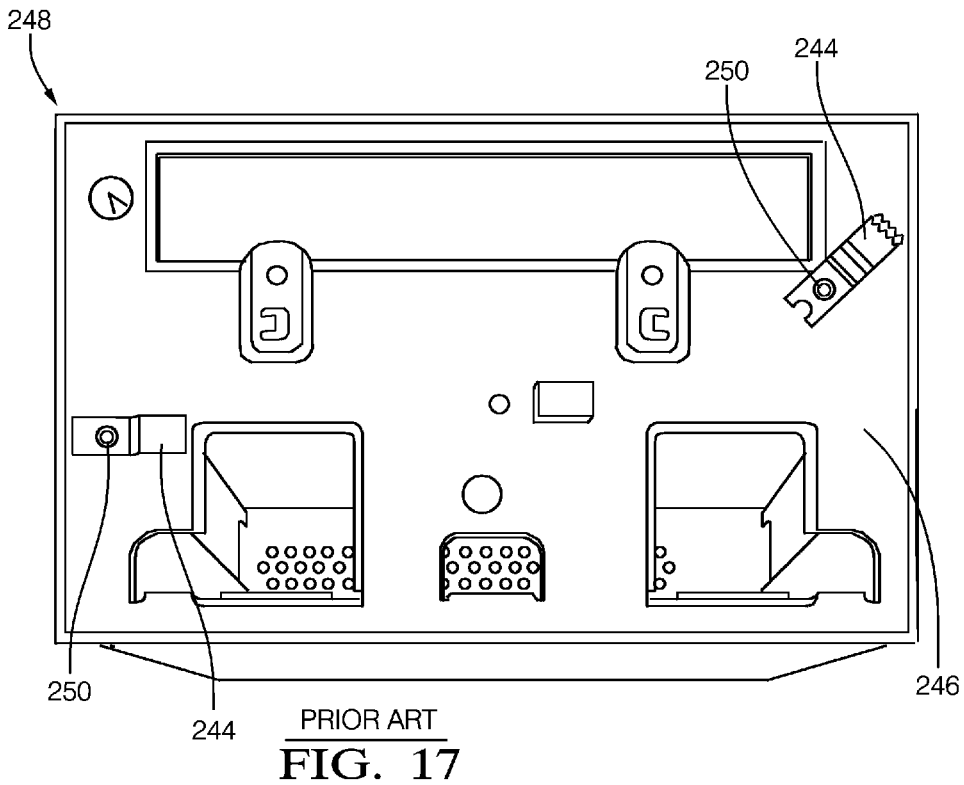
FIG. 17, is a front perspective view of a prior art faceplate illustrating rivet/staked spring clips for ESD protection to associated contact pads on a trim plate assembly.

Referring to FIG. 17, a prior approach is illustrated wherein separate spring grounding clips 244 are each mechanically affixed to the front plate 246 of a radio/CD player assembly 248 by a rivet 250 or other suitable fastener. The rivets are required to establish an electrical ground path as well as to mechanically secure the spring clips 244 to the front plate 246, adding labor, cost and complexity to the manufacturing process.

Front Plate with Integral Assembly Fixturing (5)

Using a plastic front plate enables assembly fixturing for the CD mechanism and circuit boards for slide lock and snap lock assembly instead of the screws used in a traditional receiver.

Referring to FIGS. 4 and 5, guideways in the form of slotted extensions 126 and 128, as well as locator/retention features 144 and 146 integrally formed on the reverse (inside) surface of the front plate 70 provides a number of significant advantages in the manufacture and final assembly of the radio/CD player 62 by reducing product part count, assembly time, and substantially eliminates dedicated hard fixturing and tools to affect assembly.

Wire Mesh for Structural Component (9)

Molding in metal mesh into the plastic receiver case and front_plate increases the strength of the material (much like putting re-bar into_concrete) while still weighing less than a steel case. The gauge of the wire forming the mesh can be increased and the amount of plastic material can be substantially reduced, resulting in a very thin wall, robust structure.

Figure 18:
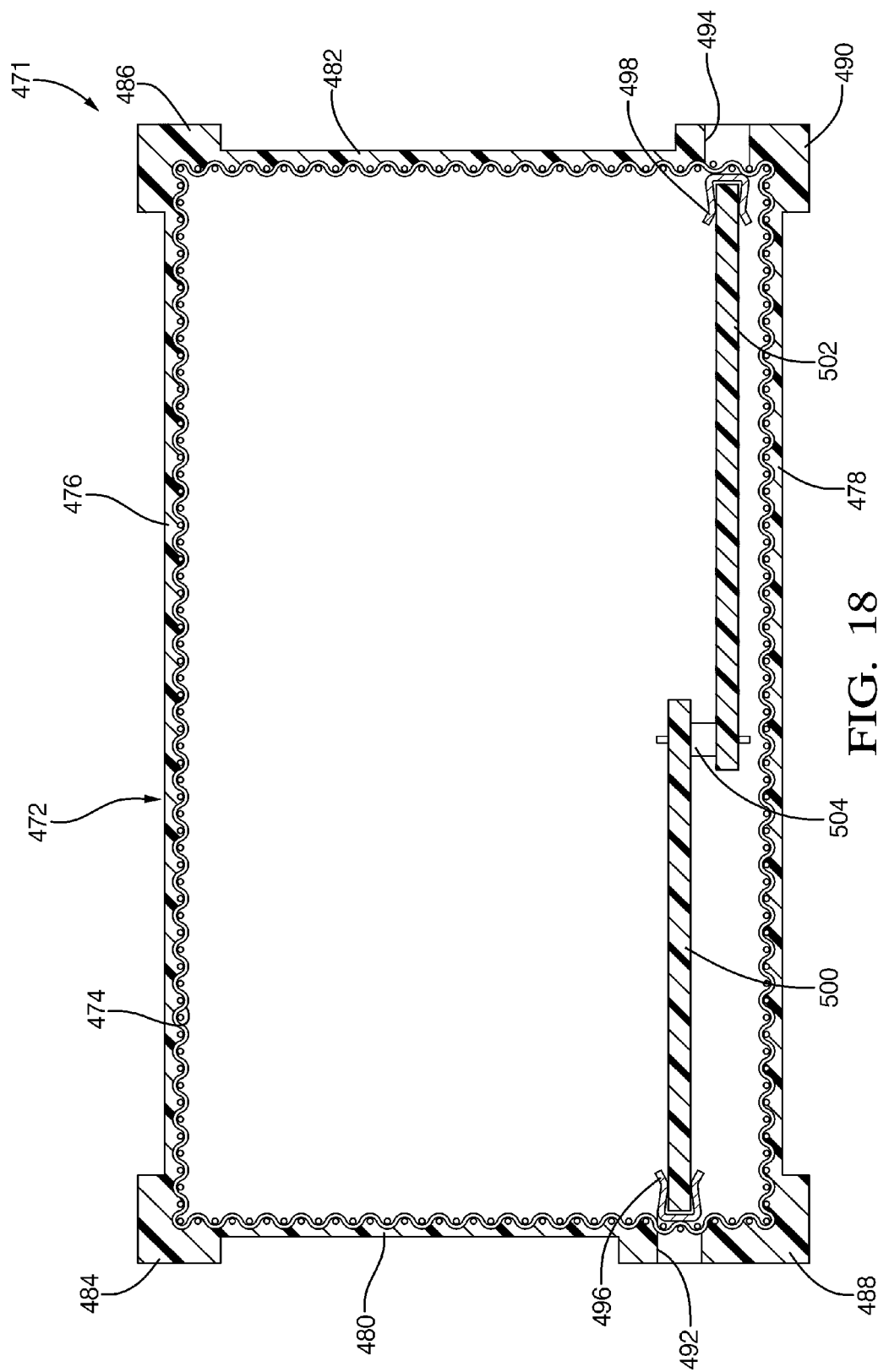
FIG. 18, is a cross-sectional view of an alternative, lighter weight outer case configuration in representative assembly with a bifurcated PC board wherein wire screen mesh provides both electromagnetic shielding as well as a significant portion of the overall structural strength of the case.

As an alternative to the structure illustrated in FIG. 18, the plastic can be eliminated from the center portions of some or all of the individual side, front, back, top and/or bottom panel portions of the case and front plate. This configuration would have the appearance of a screen box, with a molded plastic peripheral frame circumscribing each panel portion.

Referring to FIG. 18, a lightweight automotive audio system 471 can include a housing case 472 constructed of a composite of polymer based material with a wire screen 474 insert molded therein to isolate audio components therein from various electrical anomalies. To further reduce overall weight, the gauge of the wire screen can be increased whereby the screen contributes a significant component of the resulting overall structural strength of the case, while the nominal section or thickness of the polymer material can be substantially reduced. By way of example, the case 472 top and bottom wall portions 476 and 478, respectively, and left and right side wall portions 480 and 482, respectively, injection molded into a single unified structure, with the enlarged gauge wire screen 474 insert molded adjacent the inner surfaces thereof. Edges and corners of the case 472 formed at the intersection of two or three adjacent wall portions can be locally thickened to increase structural rigidity of the case 472 as well as to provide internal and external mounting and interface ports. The intersecting edges of the top wall portion 476 and the left and right side wall portions 480 and 482, respectively, form thickened left and right upper edge frames 484 and 486, respectively. Likewise, the intersecting edges of the bottom wall portion 478 and the left and right side wall portions 480 and 482, respectively, form thickened left and right lower edge frames. Lower edge frames 488 and 490 are locally vertically extended openings 492 and 494 for exposing the wire screen 474 to establish electrical contact with contact clips 496 and 498 carried by PCBs 500 and 502, respectively, interconnected by pin connectors 504 within the case 472.

Slide-Lock Snap-Lock Screwless Assembly Method (13)

Using plastic for a receiver case enables low cost assembly of the components. The circuit boards and the CD mechanism can slide into place and then be locked or they can be snapped into place without screws. This reduces the number of parts required in the assembly and reduces the amount of direct and indirect labor to put a receiver together. The plastic case can be easily molded into a net shape forming the slides and snaps needed for assembly.

Referring to FIGS. 2-10, the apparatus and assembly method described substantially reduces the labor and component cost of the radio/CD player 62, as well as the required capital costs. Furthermore, it substantially enhances product quality by substantially eliminating the possibility of extraneous or missing (small) parts and/or improper assembly.

EMC, RFI, BCI, ESD Wire Mesh Protection System (14)

Using the molded in metal mesh in the receiver plastic box that is grounded to the circuit boards creates a Faraday cage that provides shielding protection for RFI (Radio Frequency Interference), EMI (Electro Magnetic Interference), BCI (Bulk Current Injection), and ESD (Electrostatic Discharge). Refer to FIGS. 12 and 18 and their associated descriptions.

Guillotine Heat Sink (18)

The guillotine heat sink uses a flat aluminum plate as a heat sink. It slides down a slot on each side of the plastic box until it comes to rest on the quad bridge amplifier (QBA) IC and the power supply IC. Each IC will have a silpad on top to provide compliance and facilitate heat transfer. A downward force will be applied to the heat sink through a molded leaf spring in the lid of the plastic bob when it is snapped into place. An additional feature of the plastic box is to provide pillars under the FR-4 board in the location of the power ICs to provide a backstop for the leaf spring force.

Figure 19:
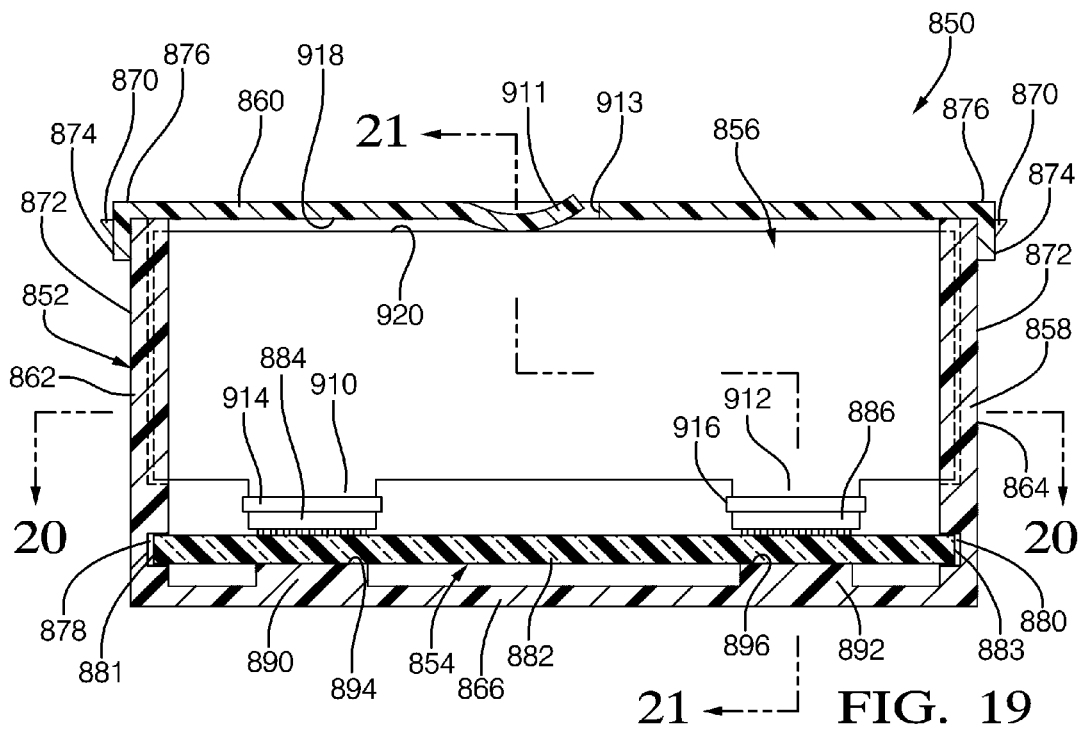
FIG. 19, is a cross-sectional view of an alternative, guillotine or drop in place type aluminum plate heat sink in representative assembly with PC board mounted power ICs within a radio housing assembly.
Figure 20:
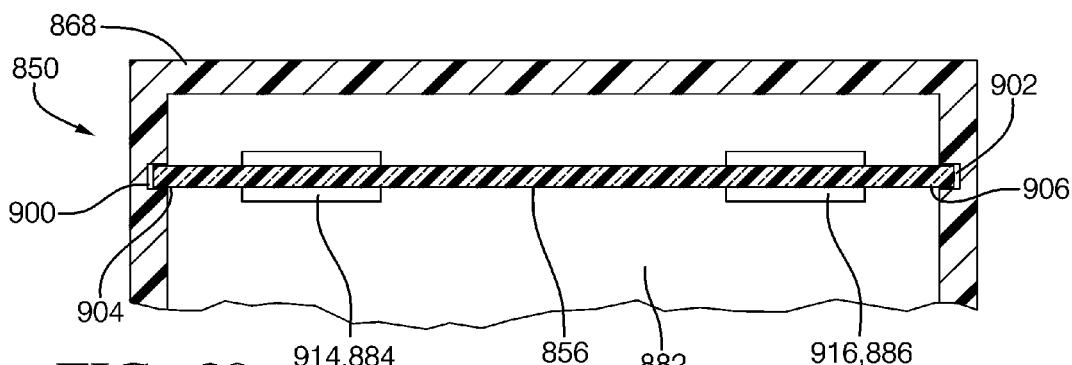
FIG. 20, is a cross-sectional top view taken along lines 20-20 of FIG. 19.
Figure 21:
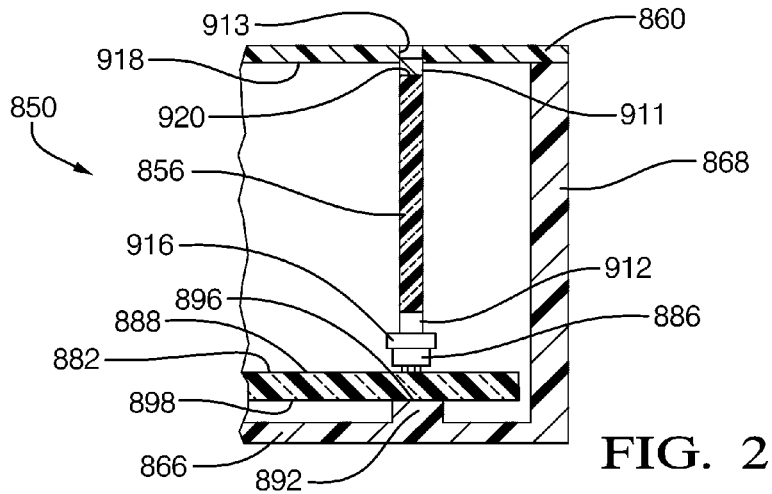
FIG. 21, is a broken, cross-sectional side view taken along lines 21-21 of FIG. 19.
Figure 22:
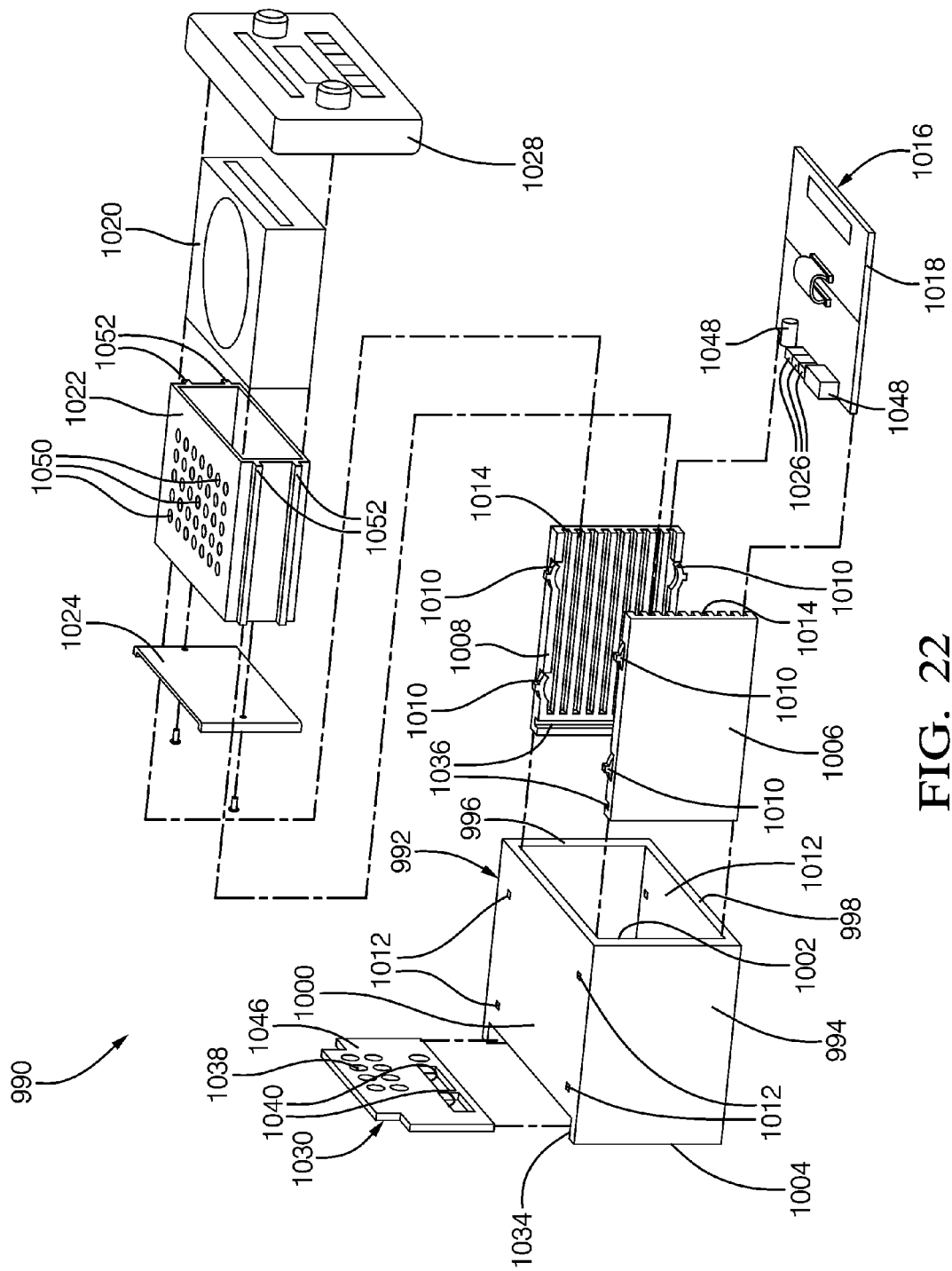
FIG. 22, is an exploded, perspective view of an alternative embodiment of a radio/CD player featuring an adjustable shelving feature for positioning a CD player and one or more PC boards.
Figure 28:
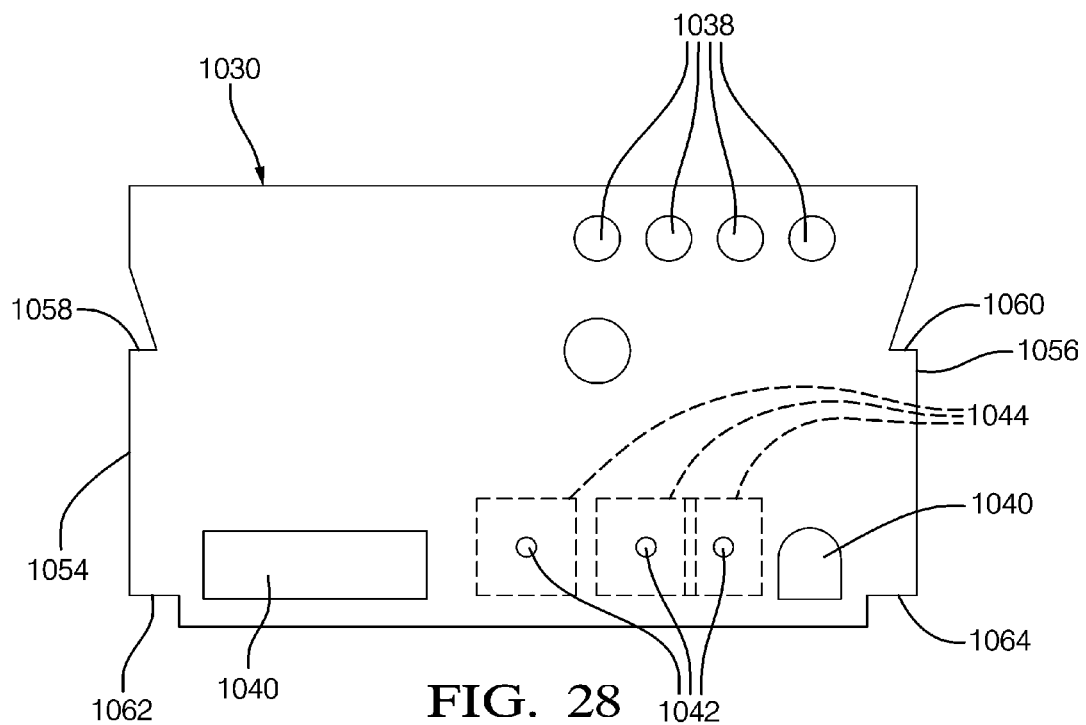
FIG. 28, is a front plan view of a heat sink employed in the radio/CD player embodiment of FIG. 22.

Referring to FIGS. 19-21, a fastener-less electronic device 850 includes a housing assembly 852, an electrical assembly 854 and a heat sink structure 856. The housing assembly 852 comprises a generally box-like case 858 and a closure member 860. The case 858 and closure member 560 form guideways for positioning and supporting the heat sink 856 and electrical assembly 854.

In the illustrated embodiment, the case 858 and closure member 860 are formed of polymer based material. The case 858 includes left and right side wall portions 862 and 864, respectively, a lower wall portion 866 a rear wall portion 868 and a front wall portion (not illustrated) substantially similar to the rear wall portion 868 in configuration and function. The case 858 includes ramped, outwardly extending features 870 integrally formed on outside wall surfaces 872 which cooperatively engage catch features 874 integrally formed on edges 876 of the closure member 860 which snap-lock with the ramped features 870 to affect tool-less, fastener-less assembly of the case 858 and closure member 860.

Longitudinally extending inwardly opening guideways or slots 878 and 880 are formed in the lower portion of the left and right sidewalls 862 and 864 for slidably receiving edge surfaces 881 and 883 of a carrier 882 such as a PCB. First and second heat generating electrical components 884 and 886, respectively, are mounted to the upper surface 888 of the PCB 882. Localized pillars 890 and 892 are integrally formed in the lower wall portion 866 defining upper abutment surfaces 894 and 896, respectively, supporting the lower surface 898 of the PCB 882 in locations registering with the electrical components 884 and 886.

Vertically extending inwardly opening guideways or slots 900 and 902 are formed in the left and right case sidewalls 862 and 864 for slidably receiving edge guide surfaces 904 and 906, respectively, of the heat sink 856. Slots 900 and 902 are longitudinally aligned with the electrical components 884 and 886 as well as the pillars 890 and 892. The heat sink 856 is substantially planer and formed of aluminum. The heat sink has a bottom edge 908 including two integrally formed extensions 910 and 912, respectively which laterally register with the electrical components 884 and 886, respectively. The heat sink extensions 910 and 912 are configured to either bear downwardly against the exposed upper heat liberating surfaces of the electrical components 884 and 886 or, alternatively, can support "silpads" or similar thermal coupling devices 914 and 916 therebetween.

A leaf spring 911 is integrally formed within an opening 913 in closure member 860. The leaf spring 911 extends as a cantilever downwardly below a lower surface 918 of the closure member 860. The leaf spring 911 is elongated along an axis that extends laterally and in register with a top edge 920 of the heat sink 856.

The electronic device 850 is assembled simply by manually engaging the edge surfaces 881 and 883 of the PCB 882 of the electrical assembly 854 within the slots 878 and 890 and displacing it rearwardly into its illustrated design position. Next, the edge surfaces 904 and 906 of the heat sink 856 are manually positioned in their respective vertical slots 900 and 902 and the heat sink lowered "like a guillotine" until its extensions 910 and 912 abut their respective heat generating components 884 and 886 (possibly with an intermediate silpad 914 and 916). The closure member 860 is then manually snapped into its illustrated assembled position wherein the leaf spring 914 continuously bears downwardly against the top edge 920 of the heat sink 856 for radiating heat away from the heat generating components 884 and 886.

Adjustable Shelf Case

In this mechanical configuration the case starts out as a sheet metal sleeve. Plastic inserts for the left and right side are then snapped into place that contain/define slides for the circuit boards and for a plastic shelf that would hold the CD mechanism at the proper height for registering with its associated CD slot. The back of the receiver would be an aluminum plate guillotine heat sink that slides in slots in the back of the plastic inserts.

Referring to FIGS. 22-32, an automotive audio system 990 is configured to be hand assembled and is virtually fastenerless. Furthermore, this embodiment is easily reconfigurable, both at the time of original manufacture and later in service life to facilitate field repairs and change-over to upgraded technology. The audio system comprises a simple sheet metal housing sleeve 992 defining left and right side walls 994 and 996, respectively, a bottom 998, a top 1000, and front and rear openings 1002 and 1004, respectively. Plastic inserts 1006 and 1008 are snap-engaged adjacent the inner surface of the left and right walls 994 and 996, respectively, within the sleeve 992 by a system of resilient tabs 1010 integrally formed as cantilevers within inserts 1006 and 1008 and cooperating locking holes 1012 formed in the top 1000 and bottom 998 of the sleeve 992. Each resilient tab 1010 includes a vertically extending pin 1011 integrally formed thereon. The inserts 1006 and 1008 have a plurality of vertically spaced, longitudinally extending mirror-image slots and grooves 1014 formed therein for receiving audio components such as a radio receiver circuit 1016 carried on a PCB assembly 1018, and a CD player subassembly 1020 carried within a vented inner sleeve 1022. The sleeve has a vertically disposed heat shield 1024 affixed to the rear surface thereof which, in assembly, bifurcates the cavity defined by the sleeve 992 into a relatively warm rear portion containing the heat generating electrical power devices 1026 on the PCB assembly 1018, and a relatively cool front portion containing the CD player subassembly 1020 as well as the low power electrical components on the PCB assembly 1018. A trim plate subassembly 1028 snap engages the sleeve 992 to close the open front end 1002.

Referring to FIGS. 22-29, a modified "guillotine" type heat sink 1030 closes the open rear end 1004 of sleeve 992 by sliding vertically downwardly through a recess 1034 formed in the rear portion of the sleeve 992 and edge engaging vertical slots 1036 formed in the inserts 1006 and 1008. The heat sink 1030 forms convection air cooling openings 1038, audio system interconnection ports 1040, and electrical power device attachment passages 1042 therein. The attachment passages 1042 register with their respective electrical power devices 1026 whose profile outlines are indicated in phantom at 1044. The electrical power devices are attached to the inside surface 1040 of the heat sink 1030 by screws (not illustrated) extending inwardly through passages 1042 or alternatively, by other screw-less resilient means as described elsewhere herein. Ports 1040 register with audio system connecter assemblies 1048 carried on the rear portion of the PCB assembly 1018.

FIGS. 23-27 illustrate the structural detail of the right side insert 1008. The slots 1014 are equally dimensioned and equally vertically spaced whereby the side edges of the PCB assembly can longitudinally slide therein. The CD player subassembly retaining inner sleeve 1022 has convection cooling passages 1050 in the top surface thereof and parallel, longitudinally extending guide bosses 1052 projecting laterally outwardly from the sleeve left and right side walls to engage the slots 1014 in the inserts 1006 and 1008.

The heat sink 1030 form left and right vertical edge surfaces 1054 and 1056, respectively. The edge surfaces 1054 and 1056 define opposed upper steps 1058 and 1060, respectively, and opposed lower steps 1062 and 1064, respectively. The heat sink is manually installed by orienting its lateral edges 1054 and 1056 within the opposed vertical slots 1036 formed in the inserts 1006 and 1008, and lowering in into its installed position. Refer FIG. 68. As the heat sink 1030 descends, the lower step 1064 in the edge surface 1056 will initially slidingly engage a retention tab 1006 (refer FIG. 29) which is integrally formed with insert 1008 and extends (in the relaxed condition) downwardly and laterally inwardly, forming a downwardly facing catch or abutment surface 1068. As the heat sink 1030 further descends, the lower step 1064 will momentarily displace the free end of the retention tab 1066 laterally outwardly. Refer FIG. 30. As the heat sink 1030 approaches its design intent installed position, the upper step 1061 will vertically align with the abutment surface 1068 of the retention tab 1066, which will snap back into its relaxed position, thereby positively locking the heat sink 1030 in the installed position. Refer FIG. 68. The heat sink 1030 assumes its installed position when the lower step 1064 contacts a base surface 1070 of the insert 1008.

The PCB assembly 1018 and the CD player subassembly 1020 are installed like drawers, and can be conveniently exchanged and repositioned within the confines of the sleeve 992, requiring only the replacement of the trim panel 1028 to accommodate any new configuration.

Figure 32:
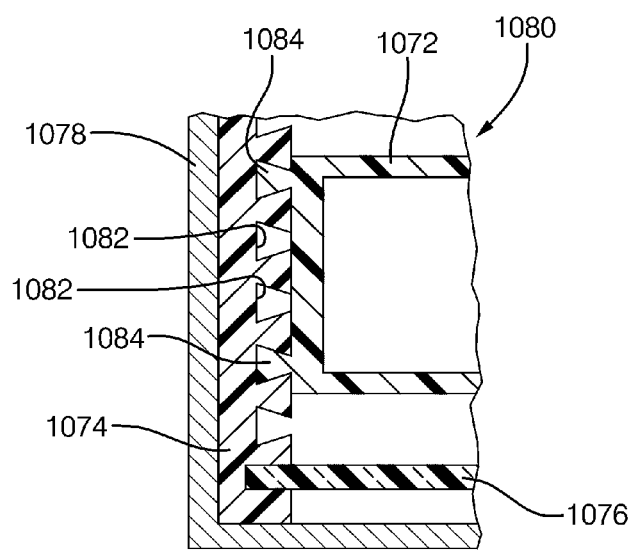
FIG. 32, is a broken, cross-sectional view on an enlarged scale of a variant of the radio/CD player of FIG. 59 wherein the interconnecting features between the shelf guide inserts and the CD player retention shelf are complimentary dovetails.
Figure 29:
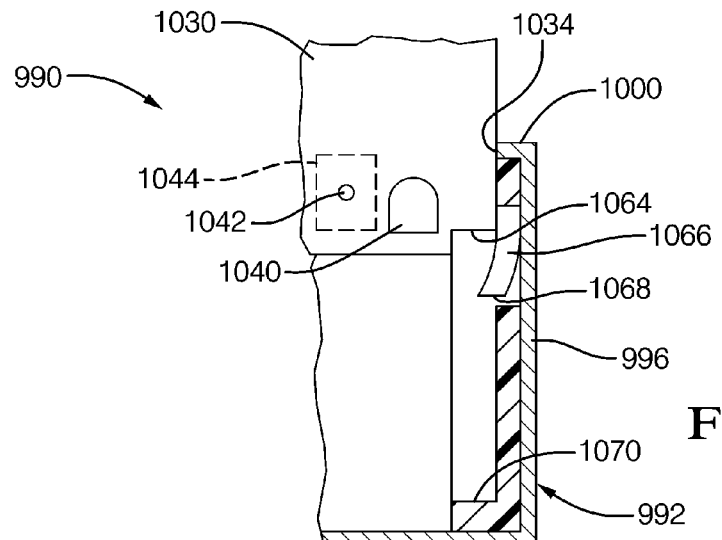
FIG. 29, is a broken, cross-sectional view of initial positioning of the heat sink of FIG. 28 with respect to one of the shelf guide inserts of FIG. 23 as part of the assembly process of the embodiment of the radio/CD player of FIG. 22.
Figure 30:
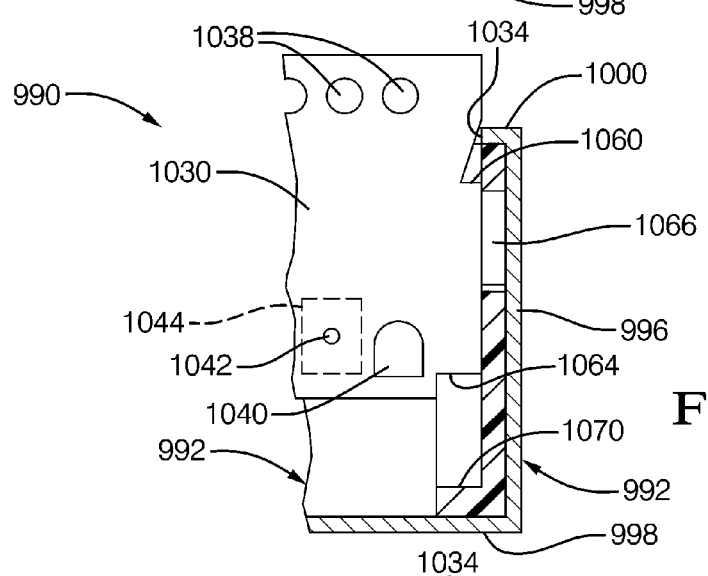
FIG. 30, is a broken, cross-sectional view similar to that of FIG. 29, but with the heat sink in an intermediate position in the assembly process.
Figure 31:
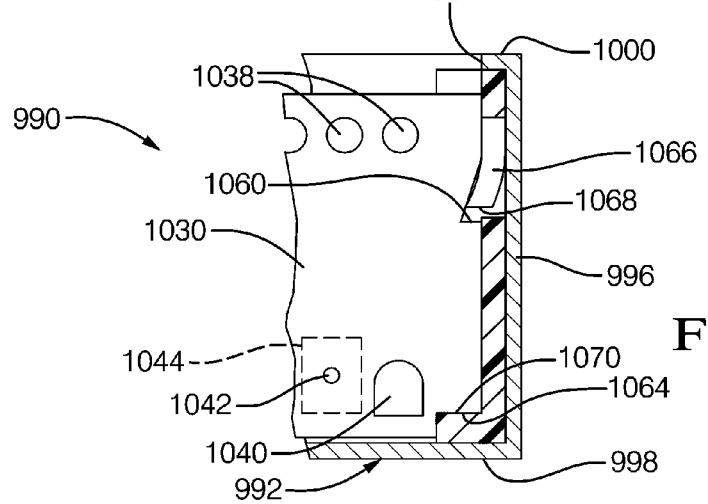
FIG. 31, is a broken, cross-sectional view similar to that of FIG. 66, but with the heat sink in a fully installed position in the assembly process wherein it is self-engaged and retained by an integral engagement tab of the shelf guide inserts.
Figure 69:
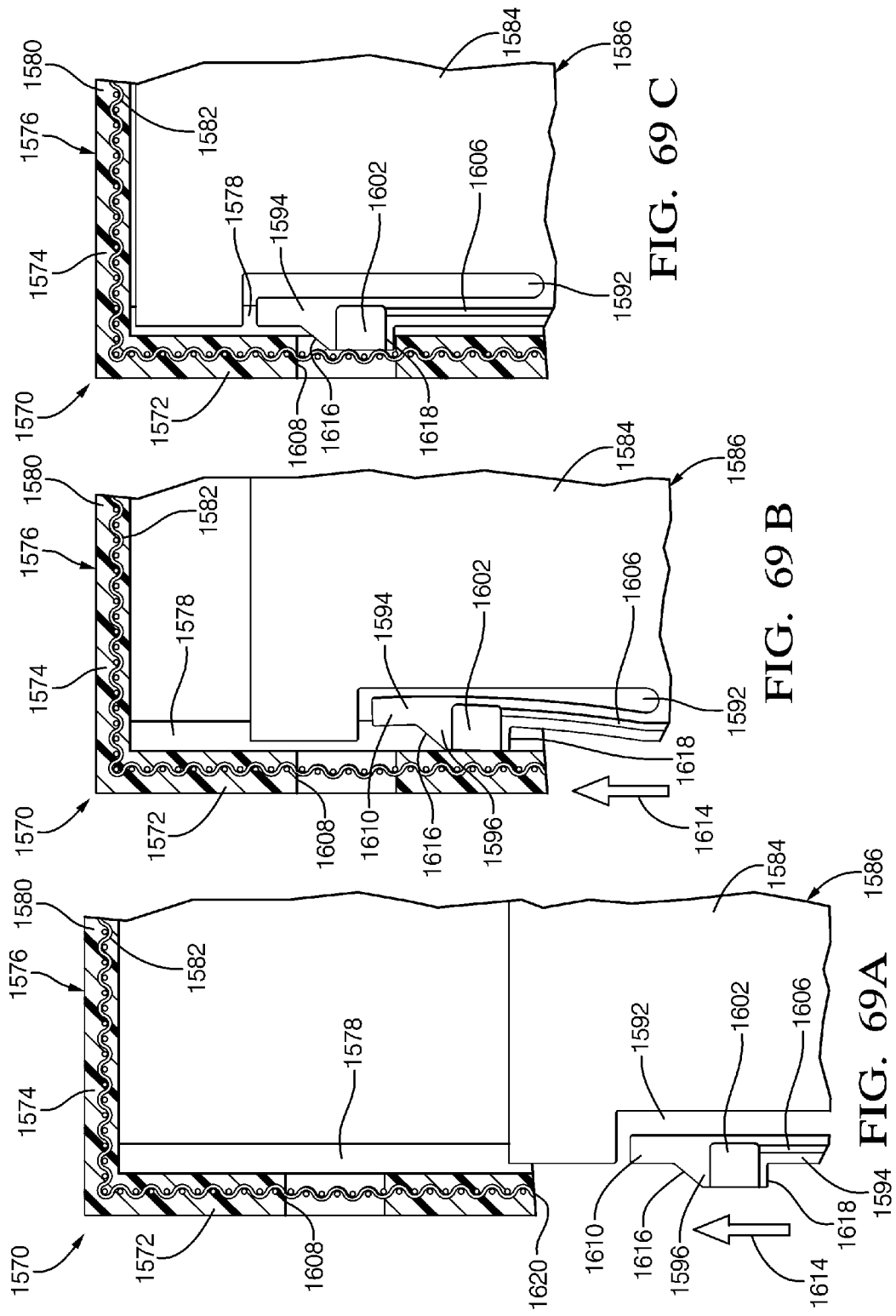
FIG. 69 A, is an exploded broken, cross-sectional view of a portion of the alternative configuration of FIG. 67 wherein the PCB is pre-positioned for insertion within the case wherein the leading portions of the PCB side edges form guide surfaces with corresponding guideways formed in the case side walls.

Referring to FIG. 32, an alternative method of interconnecting a CD player subassembly inner sleeve 1072 with a left side insert 1074 and a PCB assembly 1076 within a housing sleeve 1078 of an alternative automotive audio system 1080 is illustrated. The only material difference of the embodiment of FIG. 69 contrasted with the embodiment of FIGS. 22-31, is the insert 1074 forms vertically spaced longitudinal slots 1082 and the inner sleeve 1072 forms cooperating laterally outwardly extending longitudinal guide bosses 1084 which are of a dovetail configuration to laterally interlock the two.

Fold-Up Case

In this mechanical configuration, the case starts out as a flat set of plastic sides with molded in metal mesh to act as the hinges for folding the case into a three-dimensional structure. This approach allows for bottom-up assembly that starts by snapping the board to molded features in the bottom plate. The heat sink is snapped to features in the back plate and the CD mechanism is attached to the front plate with two screws. The box is then folded up and snapped together.

Figure 34:
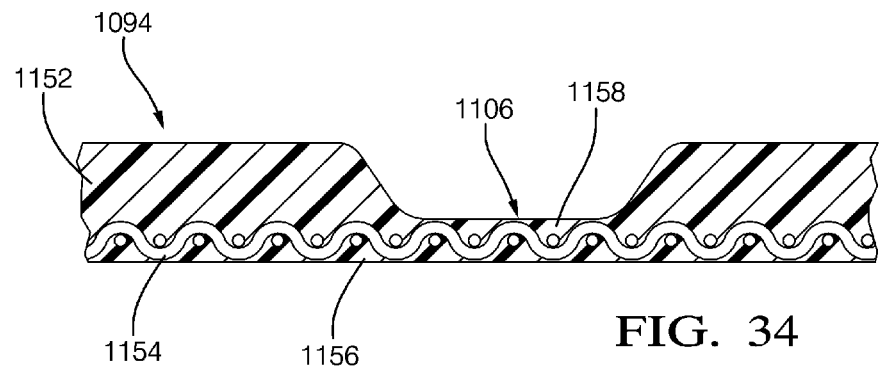
FIG. 34, is a representative cross-section of the case wall structure of the radio/CD player of FIG. 33, on a greatly enlarged scale, illustrating a thin wall section forming a living hinge.
Figures 35, 36:
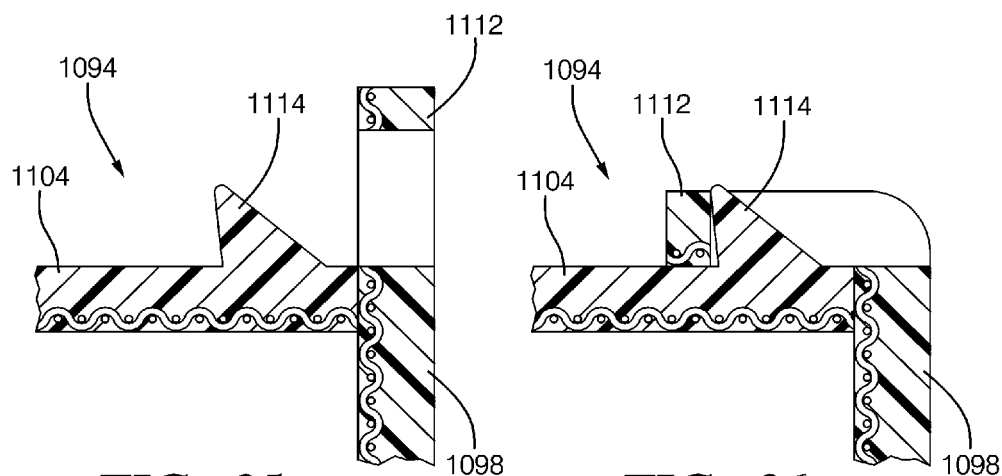
FIG. 35, is a fragmentary, cross-sectional detail of adjacent case panel edge portions of the radio/CD player of FIG. 33, on an enlarged scale, in a post assembly orientation prior to engagement of cooperating integral latch features.
FIG. 36, is a fragmentary, cross-sectional detail of adjacent case panel edge portions of the radio/CD player of FIG. 33, similar to that of FIG. 72, in a post assembly orientation after engagement of cooperating integral latch features.
Figure 37:
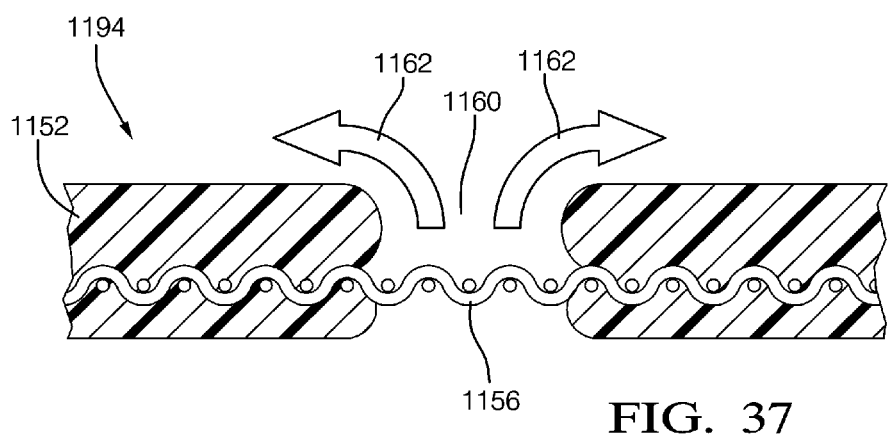
FIG. 37, is a representative cross-sectional detail of a variant of the case wall structure of the radio/CD player of FIG. 33, on a greatly enlarged scale, illustrating a screen only section forming a living hinge.

The common edges of adjacent case panels define living hinges extending partially or entirely along the length thereof. The living hinge can consist of wire mesh only, where there is a gap in the plastic material, as illustrated in FIG. 37. Alternatively, the living hinge can comprise a thin web of plastic only, wherein the wire mesh has been interrupted. In another embodiment, the plastic-wire mesh composite can be molded to define a thin web as the living hinge, as illustrated in FIG. 34. In another embodiment, the plastic-wire mesh composite can be crushed or deformed to define the living hinge, as illustrated in FIG. 39. Finally, a portion of the plastic and/or wire mesh can be scribed or machined away to expose the wire mesh to define the living hinge. If the case material is thin enough at the hinge point, the hinge can be segmented, rather than continuous.

Referring to FIGS. 33-40, several variants of a housing assembly 1086 for an automotive audio system 1088 are illustrated. This version of the audio system 1088 is configured to be hand assembled and is nearly fastener-less. The fasteners which are employed are extremely elemental and require only the most rudimentary of hand tools to affect assembly. In essence, the audio system housing assembly 1086 comprises a case portion 1090 and a closure member or front plate 1092. The case 1090 is presented to the assembler in an unfolded, two-dimensional arrangement whereby he/she can easily complete the final assembly process on a table top, eliminating complex and expensive tooling fixtures and multiple work stations.

The case portion 1090 is initially created as a sheet-like preform 1094 consisting of a number of flat panels interconnected along their adjacent edges. As best viewed in FIG. 33, the preform 1094 defines five distinct panels, which will constitute a bottom or lower wall portion 1096, a right side wall portion 1098, a left side wall portion 1100, a top or upper wall portion 1102 and a rear wall portion 1104. The adjacent panels are commonly joined or integrally interconnected by living hinges 1106, enabling the panels to be repositioned normally to one another to form a three-dimensional box-like case 1090.

Figure 33:
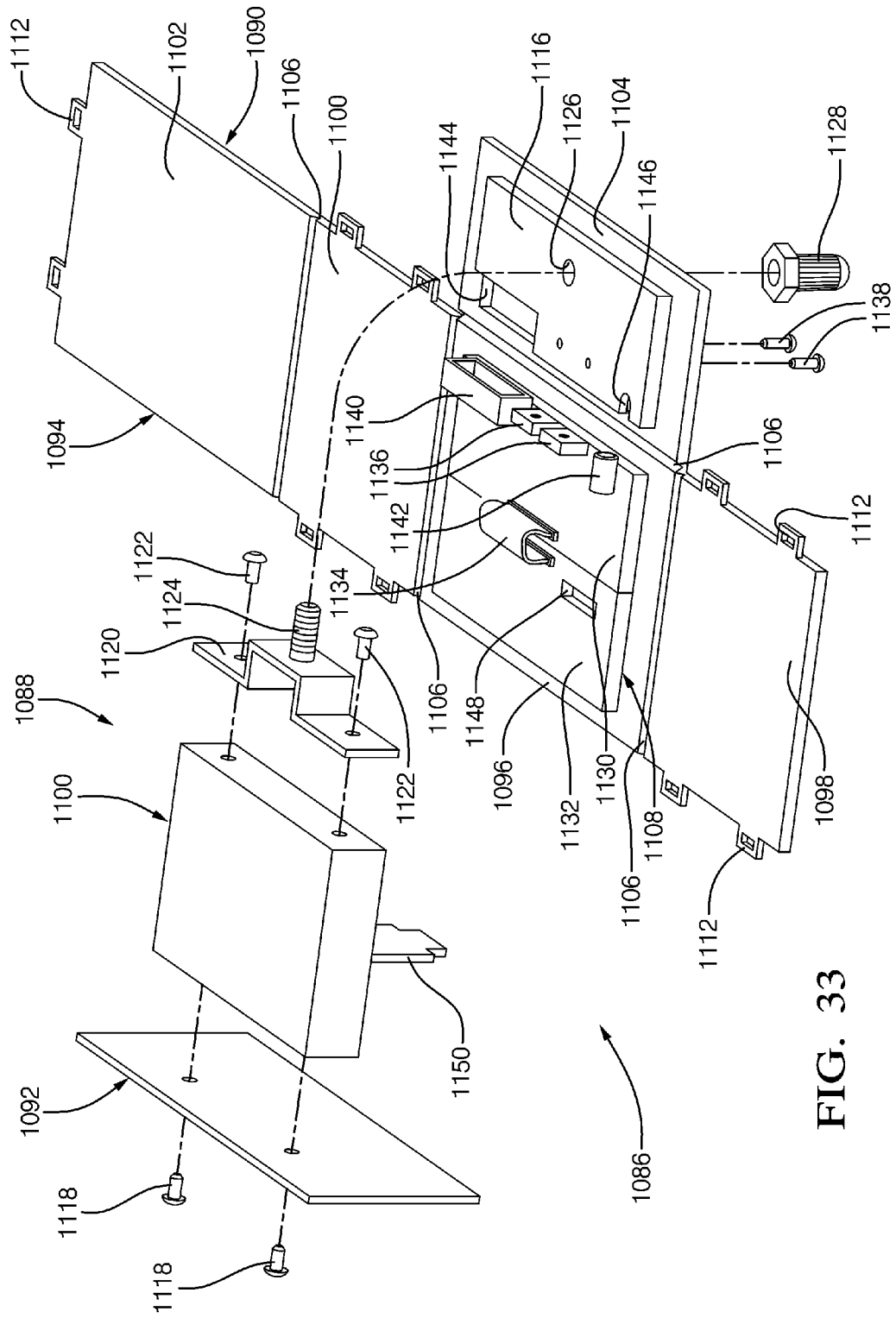
FIG. 33, is an exploded, perspective view of a second alternative embodiment of a radio/CD player featuring an unfolded case which provides a single plane bottom up assembly configuration.

The preform 1094 can be die cut from a continuous sheet of source material or, alternatively, injection molded in a net shape as illustrated in FIG. 33. In either case, the material employed to make the preform is a composite of at least one layer of relatively rigid polymer based material and at least one layer of electrically conductive material capable of shielding audio components, such as a radio receiver circuit 1108 or a CD player subassembly 1110 from electrical anomalies such as radio frequency interference (RFI), electromagnetic interference (EMI), bulk current injection (BCI), and electrostatic discharge (ESD). Cooperating engagement features such as tabs 1112 and catches 1114 are affixed to or integrally formed with the preform 1094. Refer FIGS. 35 and 36. By way of example, after installation of the internal sub-components, the case preform is folded to assume its ultimate box-like configuration. This places cooperating associated pairs of tabs 1112 and catches 1114 in an assembly orientation with the tab 1112 carried on the edge of one panel (the right side wall portion 1098, for example) and the catch 1114 carried adjacent the edge of a now adjoining panel (the rear wall portion 1104, for example). Final structural fixation of the preform 1094 in the form of the housing case 1086 is completed by simply snap-engaging the tab 1112 with the catch 1114 from the configuration of FIG. 35 to the configuration of FIG. 36. After all of the tab 1112/catch 1114 pairs are interconnected, the formation of the case 1090 is complete.

Prior to folding up the case 1090, the radio receiver circuit 1108 is positioned and affixed to the exposed surface of the lower wall portion 1096. A heat sink 1116 is similarly positioned and affixed to the exposed surface of the rear wall portion 1104. The positioning and attachment of the internal components can be accomplished by features integrally formed in the formation of the preform 1094 (such as snaps, locating guides and the like), adhesives, discrete attachment and guide elements or inter-engagement with the various wall portions and other assembly elements within the case 1090.

After formation of the case 1090, the CD player subassembly 1110 can be pre-assembled with the closure member 1092 via screws 1118 or other interconnecting features described herein. A rear bracket 1124 secured to the back side of the CD player subassembly 1110 by screws 1122 includes a rearwardly extending threaded post 1124 which, upon final assembly extends through registering passageways 1126 in the heat sink 1116 and rear wall portion 1104 and engages a mounting bushing 1128. This arrangement provides an extremely robust overall structure to the overall audio system.

The electrical components comprising the radio receiver circuit 1108 are arranged on a "common" component PCB 1130 and a "unique" PCB 1132. The common and unique PCBs 1130 and 1132 are electrically interconnected by a ribbon connector 1134. The heat generating electrical components 1136 are arranged on the common PCB 1130 and are affixed to the heat sink 1116 by screws 1138 or other suitable means, to enhance thermal coupling therebetween. Electrical connectors 1140 and 1142 are also arranged on the common PCB 1132 in register with port openings 1144 and 1146 in the rear wall portion 1104 of the case 1090. A vertically opening electrical socket 1148 is centrally disposed in the unique PCB 1132 to receive a rigid connector 1150 extending downwardly from the CD player subassembly 1110. This arrangement electrically interconnects the two audio components as well as provides structural support thereof.

One embodiment of the composite material employed for the housing assembly 1086 consists of a layer of elastomeric material 1152 with a continuous wire screen 1154 insert molder therein adjacent an interior wall surface 1156 of the composite structure. Referring to FIG. 71, the living hinges can be formed by an extremely locally thin (or non-existant) layer 1158 of polymeric material and the wire screen 1156.

Referring to FIG. 37, air vents 1160 can be provided in the case 1090 by locally eliminating the polymeric material layer 1152 while maintaining the continuity of the wire screen 1156 to permit airflow, as indicated by arrows 1162, therethrough.

Referring to FIG. 39, an alternative living hinge 1164 can be formed post-production of the composite material by pressing alternating undulations 1166 therein along the axis of the intended living hinge 1164.

Referring to FIG. 38, a first process for producing composite material is illustrated, including drawing polymeric sheet material off upper and lower continuous rolls 1168 and 1180 to enclose an intermediate layer of wire screen from a third roll 1172. The three discrete sheets are heated at station 1174, rolled together at station 1176, cured at station 1178, cut-off or die cut to form performs at station 1180, scribed, punched treated and/or formed at a station 1182, and, finally, assembled at a workstation 1184.

Referring to FIG. 38, a second, alternative process for producing composite material is illustrated drawing a continuous sheet of wire screen off a roll 1186 and drawing it through a continuous extruder/molder 1188 to form the composite structure. Thereafter, the composite sheet is shaped at station 1190, cut off and/or punched at a station 1192, and, finally, assembled at a work station 1194.

Assembly of the audio system 1088 is completed by affixation of a trim plate subassembly (not illustrated) such as the device described in connection with FIGS. 2-10 hereinabove.

I-Beam

In this mechanical configuration, the case starts out as a "I-beam" allowing the CD mechanism to be attached (bottom-up) to the top of the I-beam for high slot designs then the unit can be flipped over and the board installed (bottom-up) on the bottom of the I-beam. The rectangular solid nature of the I-beam allows it to sit squarely on a table top no matter what the orientation eliminating the need for expensive fixtures at each work station.

Referring to FIGS. 41 and 42, an automotive audio system 1192 is configured to be hand assembled and is virtually fastener-less. Furthermore, this embodiment provides a partition structure providing upper and lower (reversible) assembly surfaces with integral closure members. The audio system 1192 comprises a simple sheet metal housing sleeve 1194 defining left and right side walls 1196 and 1198, respectively, a bottom 1200, a top 1202, and front and rear openings 1204 and 1206, respectfully. An H-shaped (when viewed from the side) partition member 1208 is configured and dimensioned to establish a slip-fit within the sleeve 1194. The partition member 1208 is constructed of upper and lower U-shaped sheet metal channel portions 1210 and 1212, respectively. The upper channel portion 1210 comprises a horizontal base portion 1214, a laterally extending vertically upwardly directed front panel 1216 and a laterally extending vertically upwardly directed rear panel 1218. The lower channel portion 1212 comprises a horizontal base portion 1220, a laterally extending vertically downwardly directed front panel 1222 and a laterally extending vertically downwardly directed rear panel 1224. When the partition 1208 is in the installed position illustrated in FIG. 79, the two front panels 1216 and 1222 are substantially co-planer and close the front sleeve opening 1204. Likewise, when the partition 1208 is in the installed position, the two rear panels 1218 and 1224 are substantially co-planer and close the rear sleeve opening 1206. Accordingly, the sleeve 1194 and the partition member co-act to define a substantially closed housing assembly 1226, which is subdivided into upper and lower chambers or cavities. A trim plate subassembly 1228 snap engages the sleeve 1194 to complete the assembly of the audio system 1192.

In addition to serving as a closure member, the partition member 1208 is configured to facilitate the installation of audio system subcomponents such as a radio receiver circuit subassembly 1234 (illustrated in phantom) and a CD player subassembly 1236 (illustrated in phantom). Prior to its insertion into the sleeve 1194, the partition member 1208 serves as a reversible assembly fixture that can be conveniently applied on a flat work surface, without dedicated, expensive hard fixtures and tools. For example, with the partition member 1208 disposed in the illustrated, upright position, the radio receiver circuit subassembly 1234 can be manually installed on the horizontal base portion 1214 and/or the inner surfaces of the vertical panels 1216 and 1218 from above via self-positioning, self-engaging attachment features (not illustrated) of the types described elsewhere herein. Thereafter, the partition member 1208 can be inverted and the CD player subassembly 1236 can be manually installed on the horizontal base portion 1220 and/or the inner surfaces of the vertical panels 1222 and 1224 from above via self-positioning, self-engaging attachment features (not illustrated) of the types described elsewhere herein. Note that, in this scenario, the CD player subassembly would be installed from above, but in the inverted position.

The vertical height (H2) of the panels 1222 and 1224 of the lower U-channel portion 1212 are dimensioned approximately 150% greater than the vertical height (H1) of the panels 1216 and 1218 of the upper U-channel portion 1210. This relationship permits the audio system 1192 to be easily reconfigured between a top-mount CD player or a bottom-mount CD player (by way of example only) either in the factory or in the field, merely with the replacement of the trim panel subassembly 1228.

The U-channel portions 1210 and 1212 can be formed as a single integral unit, can be fabricated separately and subsequently joined such as by welding, or can be pre assembled with their respective audio component subassemblies and separately installed within the sleeve 1194. Certain details, such as the heat sink, electrical connectors, and the like have been deleted here to avoid redundancy. It is contemplated that such features, as described elsewhere herein, can be applied in the present embodiment.

Interlocking Block/Clam-Shell

In this mechanical configuration, the bottom of the case is plastic and contains slots for the assembly of the boards. The sides of the case bottom provide a shelf for the CD mechanism to sit on. The back of the case contains a vertical slot for a guillotine heat sink to be installed. The top of the box, also plastic, then slides over the CD mechanism and heat sink and snaps to the bottom trapping all of the components in place. A plastic molded leaf spring in the back of the top would apply a controlled down force on the heat sink for good thermal transfer from the power devices.

Figure 43:
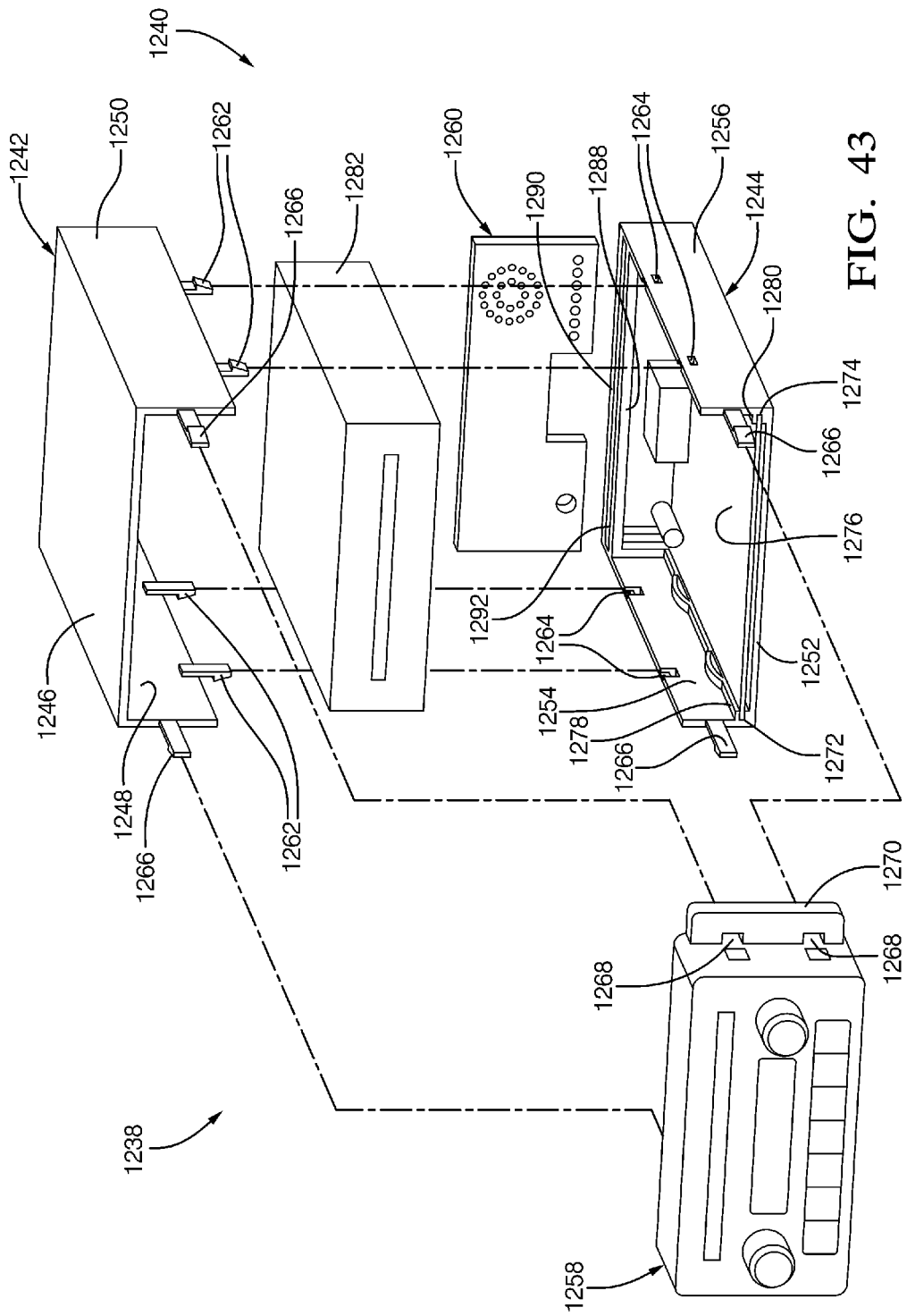
FIG. 43, is an exploded, perspective view of a fourth alternative embodiment of a radio/CD player featuring "clamshell" or "interlocking block" upper and lower self-engaging case halves.
Figure 48:
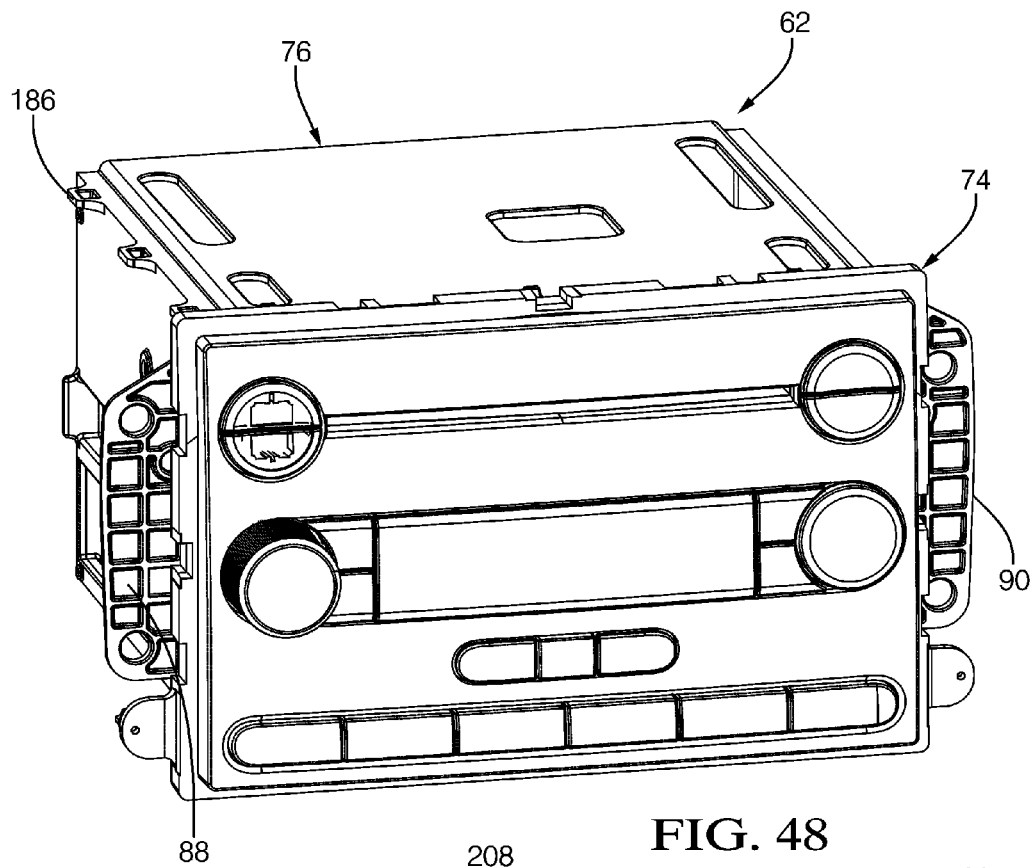
FIG. 48, is a front perspective view of the preferred embodiment of the invention, substantially similar to that of FIG. 2, but with I/O control device function graphical detail highlighted.

Referring to FIGS. 43-45, an automotive audio system 1238 is configured to be hand assembled and is virtually fastener-less. Furthermore, this embodiment provides a "clam shell" type case assembly wherein one of the case halves can be employed as an assembly fixture. The audio system 1238 comprises a housing assembly 1240 including upper and lower case halves 1242 and 1244, respectively. With the exception of specifics described hereinbelow, the case halves 1242 and 1244 are substantially symmetrical. The upper case half 1242 is shaped generally as an inverted "U", including a top wall portion 1246 and left and right downwardly extending integral half-walls 1248 and 1250. The lower case half 1244 is shaped generally as a "U", including a bottom wall portion 1252 and left and right upwardly extending half-walls 1254 and 1256. Collectively, the case halves 1242 and 1244 form front and rear openings 1257 and 1259. A trim plate subassembly 1258 serves as a front case closure member and a "guillotine type" heat sink 1260 serves as a back closure member.

The upper case half 1242 has a number of integrally formed downwardly directed snap tabs 1262 extending from the half-walls 1248 and 1250 thereof which are configured to self-locate and self-engage a like number of mating snap receiving recesses 1264 integrally formed in the half-walls 1254 and 1256 of the lower case half 1244. Similarly, the half-walls 1248, 1250, 1254 and 1256 each have an integral forwardly extending snap tab 1266 which self-locates and self-engages corresponding snap receiving recesses 1268 integrally formed in left and right integral mounting flanges 1270 (only the right flange is illustrated) in the trim plate subassembly 1258 for the retention thereof with the audio system 1238.

The half walls 1254 and 1256 of the lower case half 1244 integrally form lower longitudinally extending guideways in the form of opposed, laterally facing slots 1272 and 1274 for slidably receiving the PCB of a radio receiver circuit subassembly 1272 and upper longitudinally extending guideways in the form of opposed stepped guide surfaces 1278 and 1280 for slidably guiding the bottom surface of a CD player subassembly 1282. Resilient localized spring fingers 1284 are cantilevered from the half-walls 1254 and 1256 to continuously bias the CD player subassembly 1282 upwardly against an upper stop 1286 integrally formed in the upper case half 1230 to prevent vibration and rattles. The snap tabs 1262 extend laterally inwardly sufficiently to laterally embrace the CD player subassembly 1282.

The lower case half 1244 has a longitudinally spaced pair of cross-support members 1288 and 1290 integrally formed therewith defining and framing a vertically extending slot 1292 therebetween. Likewise, the upper case half 1242 has a substantially mirror image longitudinally spaced pair of cross-support members 1294 and 1296 integrally formed therewith defining and framing a vertically extending slot 1298 therebetween. The cross-support members 1288 and 1290 provide lateral support for the upper rear portion of the lower case half 1244, and the cross-support members 1294 and 1296 provide lateral support for the lower rear portion of the upper case half 1242. The slots 1292 and 1298 longitudinally coincide for receiving the heat sink 1260 therein. A finger spring 1300 integrally formed in the top wall portion of upper case half 1242 extends as a cantilever and continuously bears downwardly against the upper surface of the heat sink 1260 to prevent vibration and rattles.

A major advantage of the present embodiment is that the lower case half 1244 serves as an assembly fixture, which can be conveniently applied on a flat work surface, without dedicated, expensive hard fixtures and tools. Furthermore, all of the internal components can be manually inserted within the lower case half 1244 from above before the upper case half 1242 is snap-fit into place completing the assembly process, with the sole exception of attaching the trim plate subassembly 1258.

"H" Shaped Case

In this mechanical configuration, the brackets traditionally placed on each end of the CD mechanism become the left and right side of the radio. These end brackets provide slots in the bottom for the boards to be assembled and a slot in the back for a guillotine heat sink. The bottom and top of the case are then snapped into place to complete the assembly.

Referring to FIGS. 46 and 47, an automotive audio system 1302 is configured to be hand assembled and is virtually fastener-less. Furthermore, this embodiment employs a portion of the structure of an audio component subassembly, such as a CD player subassembly 1304, to be incorporated within a housing assembly 1306 of the audio system 1302 to form a portion of the outer walls of the housing assembly 1306.

The CD player subassembly 1304 includes a generally rectangular self-contained enclosure including top and bottom panels 1308 and 1310, respectively, left and right side panels 1312 and 1314, respectively, a front panel 1316 and a rear panel (not illustrated). The side panels 1312 and 1314 are extended vertically above the top panel 1308 and below the bottom panel 1310. Furthermore, the side panels 1312 and 1314 are extended longitudinally forward or the front panel 1316 and rearward of the rear panel. Thus constituted, the CD player subassembly 1304, when viewed by itself from the front or rear, is configured to approximate an "H". The side panels 1312 and 1314 can be integral extensions of traditional configuration side panels formed at the time of manufacture of the CD player subassembly 1304 as an off-line process, or can be formed as discrete elements and affixed to a conventionally configures CD player during final assembly of the audio system.

The housing assembly 1306 includes an upper closure member 1318 configured as an inverted "U" defining a top portion 1320 and downwardly directed, longitudinally extending left and right skirt portions 1322 and 1324, respectively. The housing 1306 includes a bottom closure member 1326 configured as a "U" defining a bottom portion 1328 and upwardly directed, longitudinally extending left and right skirt portions 1330 and 1332, respectively. The side panels 1312 and 1314 combine with the upper and lower closure members 1318 and 1326 to form a box-like case 1334 defining a front opening 1336 and a rear opening 1338. During final assembly of the audio system 1302, the front opening 1336 is closed by a trim plate subassembly 1340 and the rear opening 1338 is closed by a "guillotine type" heat sink 1342. The side panels 1312 and 1314, respectively, the upper and lower closure members 1318 and 1320, respectively, and the trim plate subassembly 1340 are interconnected during final assembly by cooperating self-locating, self-guiding and self-engaging features integrally formed therein, such as, by way of example, snap-lock features, as described elsewhere herein.

A first or upper cavity 1344 is formed within the case 1334 extending vertically between the top panel 1308 of the CD player subassembly 1304 and the top portion 1320 of the upper closure member 1318. Similarly, a second or lower cavity 1346 is formed within the case 1334 extending vertically between the bottom panel 1310 of the CD player subassembly 1304 and the bottom portion 1328 of the bottom closure member 1326. In the presently illustrated embodiment of the audio system 1302, the upper cavity 1344 is employed for routing of electrical cables and convection cooling air flow. The lower cavity 1346 is employed to enclose a second audio subassembly, such as a radio receiver circuit subassembly 1348. The portion of the inner surfaces of the side panels 1312 and 1314 within the lower cavity 1346 have opposed, cooperating guideways 1350 and 1352 formed thereon for slidingly receiving and supporting side edge surfaces 1354 and 1356 of a unique PCB portion 1358 of the radio receiver circuit subassembly 1348. A common PCB portion 1360 of the radio receiver circuit subassembly 1348 is supported by a second, lower set of guideways (not illustrated). The common PCB portion 1360 carries electrical connectors 1362, which are externally accessible through a port opening 1366 in the heat sink 1342, and electrical power devices 1364, which are thermally coupled to engagement surfaces 1368 of the heat sink.

A significant advantage of the present embodiment is that material (and weight) employed for the CD player subassembly closure panels and the audio system case 1334 are conserved by the "compound structure" or hybrid configuration described. Furthermore, the CD player subassembly 1304 serves as an assembly fixture, which can be conveniently applied on a flat work surface in both upright and inverted positions, without dedicated, expensive hard fixtures and tools.

Certain details, such as the snap-acting connector features, heat sink details electrical connectors, and convection cooling passages have been deleted here to avoid redundancy. It is contemplated that such features, as described elsewhere herein, can be applied in the present embodiment.

Case Edge Ground System for Circuit Board

Electronic assemblies may typically contain a circuit board assembly that may have ground points from the circuit board to the enclosure. For many applications, this has been achieved by forming a mounting tab from a sheet metal wall of the enclosure that has a hole to receive a screw that passes through a hole in a ground pad of the circuit board, such that when the screw is driven, it clamps the circuit board to the tab. This method secures the circuit board and the ground interface with a screw fastener. The same application has been used for a die cast case as well, where the interface is a mounting boss molded into the enclosure.

With the advent of electronic assemblies utilizing plastic cases to replace metal, the grounding requirements have not changed, but the method of grounding to the enclosure has been revised. With plastic, there is typically a component incorporated with the plastic to provide the conductive layer. This may be one of several approaches including, but not limited to, a conductive material filled resin, conductive paint, plating, or in-molded wire mesh.

Figure 13:
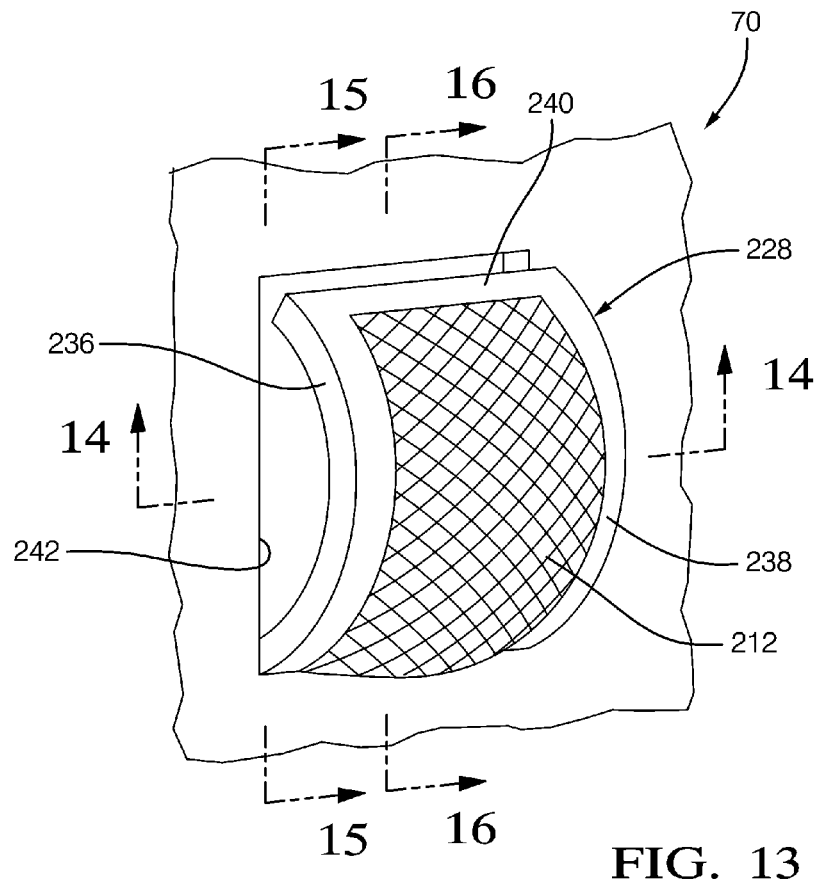
FIG. 13, is a fragmentary, perspective view of a keypad grounding clip integrally formed on the front side of the faceplate.
Figure 14:
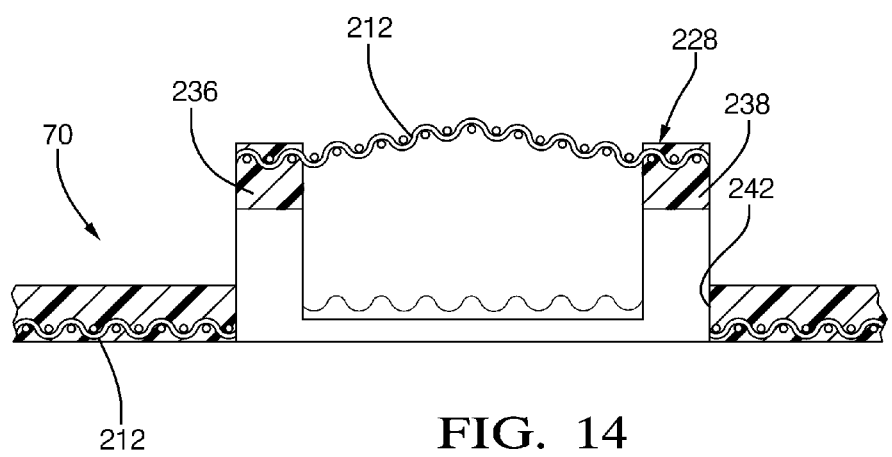
FIG. 14, is a cross-sectional view taken on lines 14-14 of FIG. 13.
Figure 15:
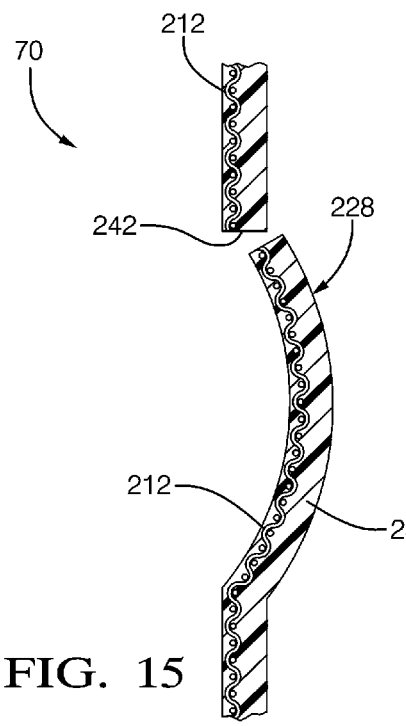
FIG. 15, is a cross-sectional view taken on lines 15-15 of FIG. 13.
Figure 16:
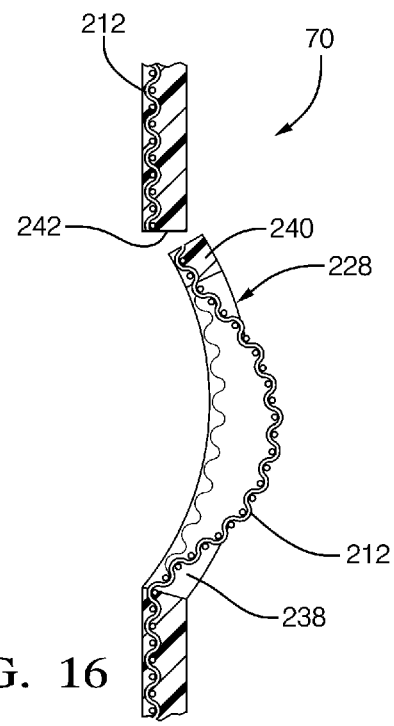
FIG. 16, is a cross-sectional view taken on lines 16-16 of FIG. 13.

With plastic enclosures, making ground contact with the circuit board assembly has been accomplished using beryllium copper clips, such as illustrated in FIGS. 11, 12 and 18, surface mount ground pads, such as illustrated in FIGS. 54-60, and even direct circuit board pad to mesh interface, such as illustrated in FIGS. 13-15, where the mesh is projected and the plastic is designed with a cantilevered spring feature to provide some force for the contact point.

Although all of the aforementioned approaches have been effective, there are generally costs associated with them or design limitations that must be comprehended to utilize these methods for grounding the circuit board.

Referring to FIGS. 65-70, several embodiments of a lightweight automotive electronic device, in particular an audio/navigation system embodying the present invention is illustrated.

By plating the edge of the circuit board at the intended ground point, the ground to the case can be facilitated in a manner that offers less cost through no additional parts and is adaptable with a plastic enclosure to provide grounding without restricting the location in the case as may be required when the method with mesh projected to perform a ground requires the location close to an enclosure edge.

Generally the ground contact is better when a contact force is applied, so with a slide together assembly as an example, it is desired to have one portion of the ground system to have some compliancy to allow a compressive contact between the parts.

To provide this feature with a mesh in plastic enclosure, the circuit board can be designed with a projected area or tab where the contact width is of an amount greater than 4.0 mm., as an example, would then be received during a slide in assembly of the circuit board to the plastic enclosure, in an open window of plastic that would have the mesh exposed in it, as illustrated in FIG. 59. The mesh could have a perimeter form executed in the molding tool to provide additional compliancy as the circuit board edge contacts the mesh. Refer FIGS. 33-41 in published related application US 2009/0154134 A1 incorporated by reference herein.

For a ground contact on the circuit board edge against a rigid component like a metal enclosure or a painted or plated plastic without any relief detail or slot, the circuit board may have a slotted detail behind the ground contact edge that allows for some flex governed by the length of the slot as to the amount of compliancy.

Because the ground pad on the circuit board is continued to the perpendicular edge of the board, the ground is more efficient than trying to accommodate an added component.

Since there is more than one option to provide compliancy to the system in one part or the other, the invention can accommodate any type of enclosure. With the mesh in plastic, the ground area is localized in a detail that may be projected or offset from the standard edge, much like the projection for a board to board connector as illustrated in FIG. 11. This provides ground capability to any accessible window area of the plastic enclosure "wall".

This invention saves having to provide an additional part to achieve a ground. It also saves on limited design capability that would be the result of a forced location due to molding tool capability to provide a projected mesh contact.

Referring to FIGS. 65 and 66, a simplified exploded view of a lightweight automotive electronic device 1510, such as an audio system, is illustrated. The electronic device 1510 includes a box-like case 1512, a front closure member 1514 and an circuit board subassembly 1516. The case 1512 and closure member 1514 are each substantially formed of a composite of a relatively rigid polymer based material and electrically conductive material operable to substantially enclose and shield the circuit board subassembly 1516.

The case 1512 defines integrally formed top and bottom wall portions 1518 and 1520, respectively, left and right side wall portions 1522 and 1524, respectively, and a rear wall portion 1526. Preferably, the case 1512 is injection molded with each of the wall portions composed of a layer of polymer based material 1528 with a continuous electrically conductive wire screen or mesh 1530 insert molded therein disposed nearly adjacent the inner surfaces of each of the wall portions. The closure member 1514 is preferably similarly constructed as a discrete structure.

Upper and lower guide walls 1532 and 1534, respectively, are integrally formed on the inner surface of the left side wall portion 1522. The guide walls 1532 and 1534 are vertically spaced apart by a dimension slightly greater than the nominal thickness of the generally planer circuit board or substrate 1536 of the circuit board assembly 1516, project laterally rightwardly inwardly within a cavity formed by the case 1512 and extend substantially continuously longitudinally horizontally the entire extent of the left side wall portion 1522. Similarly, minor image upper and lower guide walls 1538 and 1540, respectively, are integrally formed on the inner surface of the right side wall portion 1524 and are aligned with the upper and lower wall guides 1532 and 1534 to slidingly receive the circuit board 1536 from the open front of the case 1512 during the assembly process and to laterally and vertically restrain the circuit board subassembly upon final assembly.

The circuit board 1536 defines left and right edges 1542 and 1544, respectively, a rearwardly facing edge 1546 and a forwardly facing edge 1548. As best viewed in FIG. 66, an elongated open slot 1550 is formed in the circuit board 1536 extending laterally adjacent the rear edge 1546 and, at one end thereof, emerging rearwardly through the rear edge 1546 to form a resilient beam portion 1552. The resilient beam 1552 is, thus, integrally formed with the remainder of the material constituting the circuit board 1536. The resilient beam 1552 is configured to form a relatively large head portion 1554 connected as a cantilever with the remainder of the circuit board 1536 through an elongated, thin sectioned neck portion 1556. The head portion 1554 extends rearwardly beyond the rear edge 1546 and has the rear facing surface thereof coated or plated to form a contact 1558. A conductive trace 1560 is dressed/routed along the neck portion 1556 to electrically interconnect the contact 1558 with other circuitry carried with the circuit board subassembly 1516.

A window 1562 formed in the rear wall portion 1526 exposes a patch of the wire screen 1530 in register with the contact 1558 carried on the resilient beam 1552. Upon final assembly, the resilient beam 1552 continuously presses the contact 1558 rearwardly, maintaining it in interment contact with the screen 1530, thereby assuring maintenance of a reliable electrical ground path. As described in connection with FIG. 37 herein above, the window 1562 also can provide thermal ventilation. The head portion 1554 includes a lateral extension 1564 which overlaps at least one edge of the window 1562 to prevent outward (rearward) over extension of the beam portion 1552 and possible damage to the adjacent screen 1530 during the assembly process.

The embodiment of the invention illustrated in FIG. 65 also illustrates a second resilient beam portion 1566 formed along the front edge 1548 of the circuit board 1536 to similarly establish an electrical interconnection with an registering patch of wire screen (not illustrated) exposed by a recess or pocket 1568 (illustrated in phantom) formed on the rear surface of the front closure member 1514. This feature assures robust electrical interconnection between the case 1512 and the closure member 1514 upon final assembly.

Figure 8:
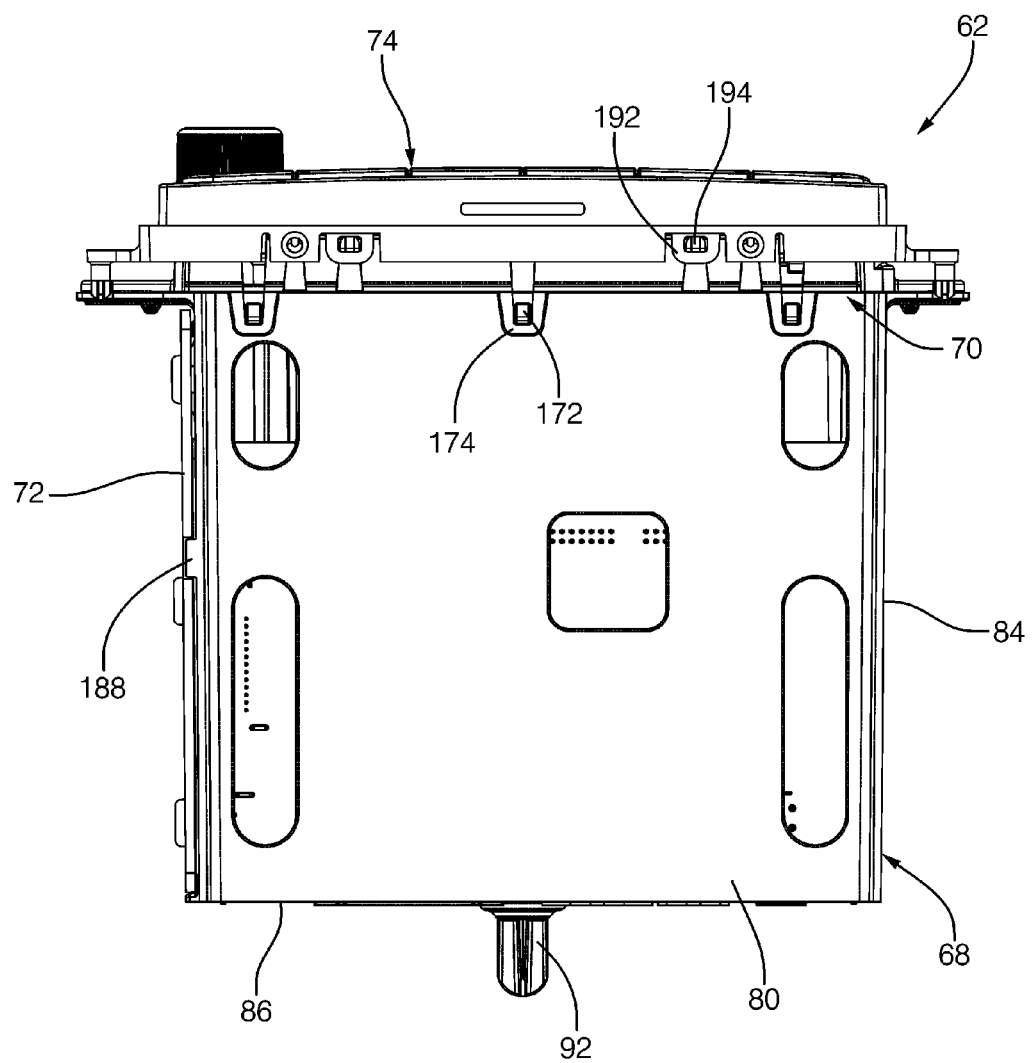
FIG. 8, is a bottom plan view of the radio/CD player of FIG. 2.
Figure 9:
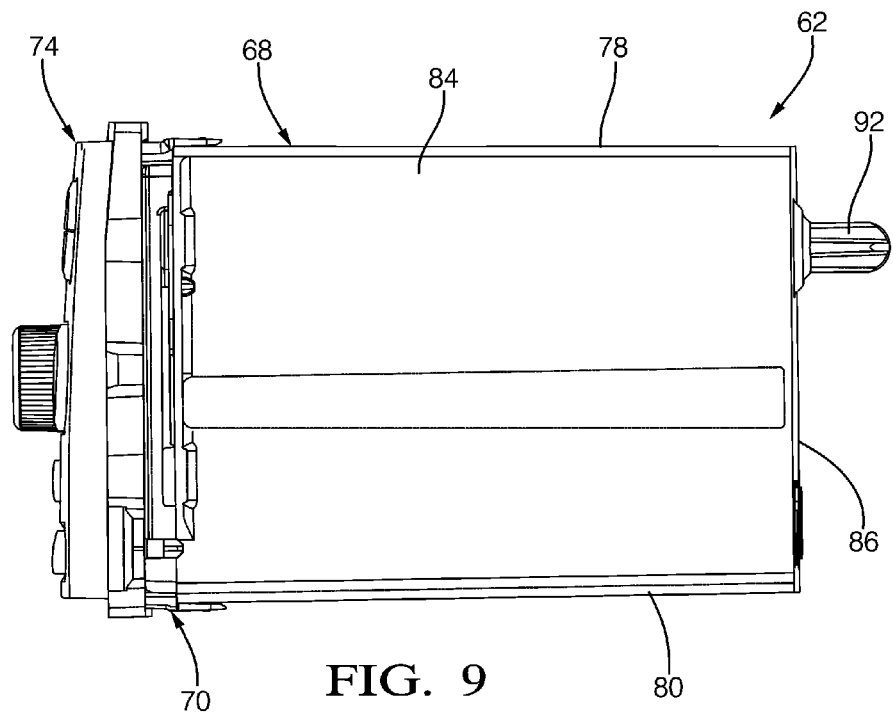
FIG. 9, is a top plan view of the radio/CD player of FIG. 2.
Figure 10:
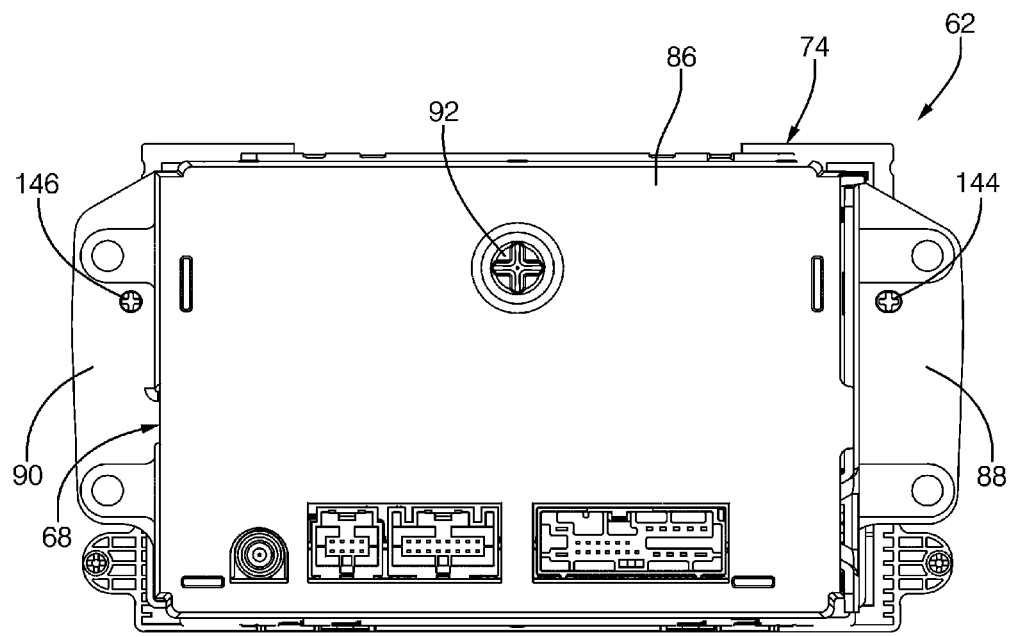
FIG. 10, is a rear plan view of the radio/CD player of FIG. 2.

During the final assembly process, the circuit board 1536 is installed longitudinally through the front opening of the case 1512 wherein the left edge 1542 of the circuit board 1536 is slip fit between the upper and lower guide walls 1532 and 1534, respectively, and the right edge 1544 of the circuit board 1536 is slip fit between the upper and lower guide walls 1538 and 1540, respectively. As the circuit board 1536 approaches its design intent installed position illustrated in FIG. 65, the contact 1558 of the rear resilient beam portion 1552 first contacts the wire screen 1530 exposed in the rear wall window 1562. In this condition, the rear edge 1546 is spaced from the inner wall of the rear wall portion 1526 of the case 1512 by a dimension approximately equaling the nominal longitudinal dimension of the slot 1550. Thereafter, the front closure member 1514 is applied to close the front opening of the case 1512. As the front closure member 1514 approaches its design intent position, such as is illustrated in FIG. 7 hereinabove, a contact carried on the forward facing surface of the second beam portion 1566 initially contacts the wire screen (not illustrated) exposed in the pocket 1568 formed in the inner surface of the closure member 1514. As the front closure member is thereafter pressed into its final installed position such as illustrated in FIGS. 8 and 9, both of the resilient beam portions 1552 and 1566 are simultaneously compressed, providing substantially equal, offsetting loading of the contacts against their respective exposed screen portion. This assures robust and substantially equal electrical characteristics of the two (or more) interconnections.

Figure 67:
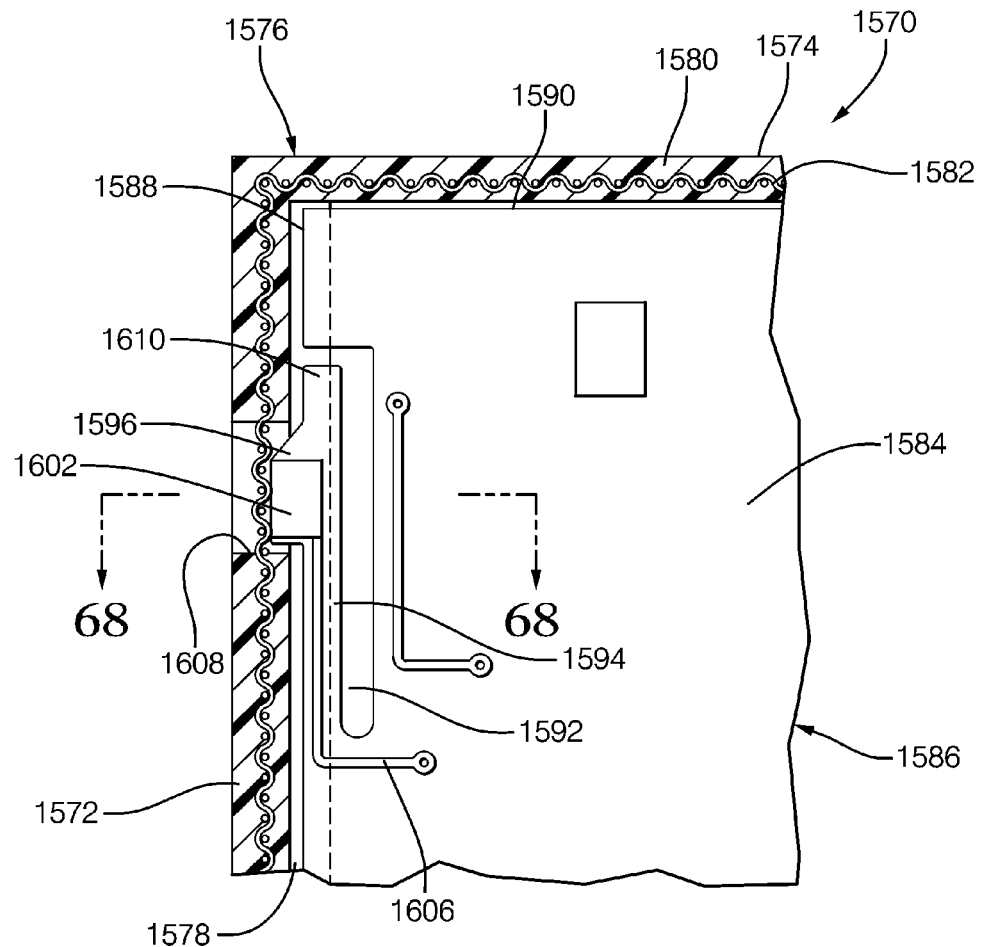
FIG. 67, is a broken, cross-sectional view of a portion of an alternative configuration of the lightweight automotive audio system of FIG. 65 as fully assembled, wherein the resilient beam is integrally formed on one (or both) of the side edges of the PCB to self-engage the case side wall and self-ground with case side wall screen exposed by a window.
Figure 68:
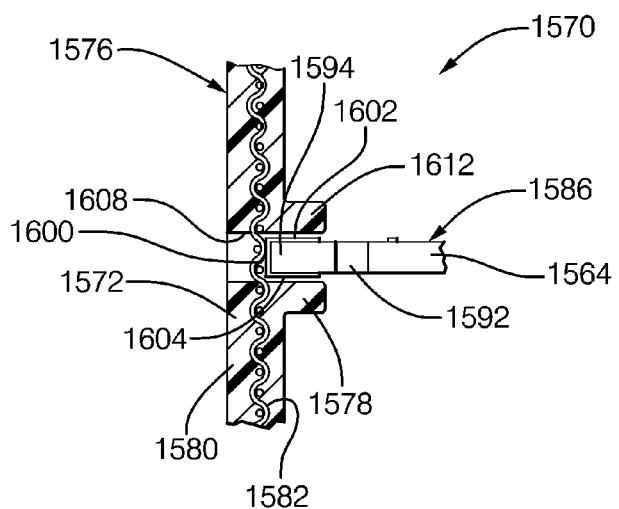
FIG. 68, is a broken, cross-sectional view taken on lines 68-68 of FIG. 67.

Referring to FIGS. 67 and 68, a second embodiment of the present invention is illustrated. The left-rear corner of a lightweight automotive electronic device 1570 depicts portions of a left side wall 1572 and rear wall 1574 of a case 1576. A lower guide wall 1578 integrally formed with the left side wall 1572 projects laterally inwardly, and extends longitudinally the entire length of the left side wall 1572. The walls of the case 1576 are integrally formed, preferably by injection molding and each include a layer of relatively rigid polymer based material 1580 and an electrically conductive layer 1582. The electrically conductive layer 1582 is preferably continuously formed wire screen or mesh which has been insert molded within the case walls. FIG. 67 also depicts the left-rear corner of a circuit board/substrate 1584 of a circuit board subassembly 1586 disposed in its design intent final assembly position within the case 1576. The circuit board 1584 depicts portions of a left edge 1588 and a rear edge 1590.

As best viewed in FIG. 67, an elongated open slot 1592 is formed in the circuit board 1536 extending laterally adjacent the left side edge 1588 and, at one end thereof, emerging leftwardly through the side edge 1588 to form a resilient beam portion 1594. The resilient beam 1594 is, thus, integrally formed with the remainder of the material constituting the circuit board 1584. The resilient beam 1594 is configured to form a relatively large head portion 1596 connected as a cantilever with the remainder of the circuit board 1584 through an elongated, thin sectioned neck portion 1598. The head portion 1596 extends leftwardly beyond the left edge 1588 and has the left facing surface thereof coated or plated to form a contact 1600. As best seen in FIG. 68, the contact 1600 has an integral first portion 1602 extending radially inwardly on the upper surface of the circuit board 1564 and an integral second portion 1604 extending radially inwardly on the lower surface of the circuit board 1564. The first and second portions 1602 and 1604 assure robustness of the mechanical connection of the contact 1600 to the edge of the circuit board 1564 as well as reliable electrical interconnection with the wire screen 1582. A conductive trace 1606 is dressed/routed along the neck portion 1598 to electrically interconnect the contact 1600 with other circuitry carried with the circuit board subassembly 1586.

A window 1608 formed in the left side wall portion 1572 exposes a patch of the wire screen 1582 in register with the contact 1600 carried on the resilient beam 1594. As illustrated in FIGS. 67 and 68, upon final assembly, the resilient beam 1594 continuously presses the contact 1600 leftwardly, maintaining it in interment contact with the screen 1582, thereby assuring maintenance of a reliable electrical ground path. The head portion 1596 includes a longitudinal extension 1610 which overlaps at least one edge of the window 1608 to prevent outward (leftward) over extension of the beam portion 1594 and possible damage to the adjacent screen 1582 during the assembly process. Definitionally, the term "window" is herein broadly defined as an opening, through passage (as illustrated in FIGS. 66-70), relief, recess (as illustrated in FIG. 65), nitch or the like which provides the exposure of a localized area of conductive material.

An upper guide wall 1612 is integrally formed on the left side wall 1572 to cooperate with the lower guide wall 1578. Upper and lower guide walls 1612 and 1578, respectively, function similarly to upper and lower guide walls 1532 and 1534, respectively, as described in connection with FIGS. 65 and 66 hereinabove.

Referring to FIG. 69A, the first step of installing circuit board subassembly 1586 within the case 1576 is illustrated wherein the elements are juxtaposed in aligned along the assembly axis (illustrated by an arrow 1614) prior to insertion of the circuit board assembly 1586 within the case 1575. The outer leading edge of the beam portion 1594 forms a ramped engagement surface 1616 transitioning radially outwardly from the longitudinal extension 1610 to the radially outermost portion of the head portion 1596 supporting the contact 1600. Furthermore, the trailing edge of the head portion 1596 forms a radially extending abutment surface 1618.

Referring to FIG. 69B, the second step of installing circuit board subassembly 1586 within the case 1576 is illustrated wherein the circuit board 1586 is partially inserted within the case 1576. As the circuit board 1586 transitions from the position of FIG. 69A to that of FIG. 69B, the ramped engagement surface 1616 first engages the frontal edge 1620 of the left side wall 1572. As the circuit board 1586 is urged further within the case 1576, the ramp surface 1616 momentarily resiliently deflects the leading free end of the cantilever beam 1594 radially inwardly until the outermost surface of the head portion 1596 is disposed entirely radially inwardly of the inner surface of the left side wall 1572. Thereafter, the circuit board 1586 continues to slide toward its final installed design location illustrated in FIG. 69C.

Referring to FIGS. 69B and 69C, as the circuit board its final installed position, the abutment surface 1618 of the head portion 1596 will longitudinally pass the forwardmost edge of the window 1608. When this occurs, the inherent resiliency of the material forming the circuit board 1584 will cause the beam portion 1594 to "snap back", at least substantially returning to its original position as illustrated in FIG. 69A. Insodoing, the contact 1600 carried with the head portion 1596 will positively resiliently engage the wire screen 1582 exposed within the window. 1608. Additionally, the abutment surface 1618 of the head portion 1596 will positively interlock with the leading edge of the window 1608, thereby locking the circuit board assembly 1586 in the fully installed position depicted in FIG. 69C. Thereby, the circuit board subassembly 15896 is deemed to be self-fixturing, self-aligning and self-engaging, requiring no external tools or fixturing equipment to effect final assembly.

Although only a single, left side resilient beam 1594 is illustrated in FIGS. 67-69C, it is contemplated that a second, minor image resilient beam (not illustrated) can be applied on the right side of the case and circuit board subassembly interconnection. Furthermore, a rear edge resilient beam can also be applied as the application requires.

Figure 70:
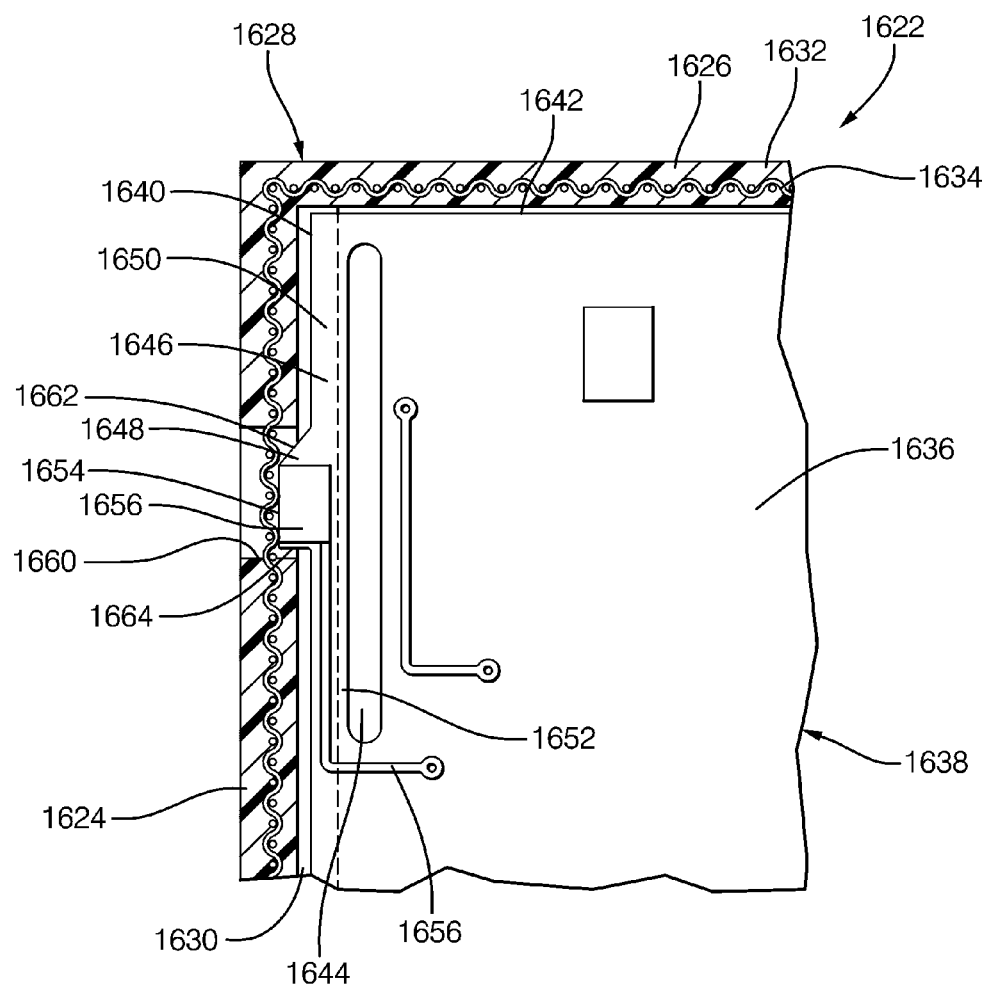
FIG. 70, is a broken, cross-sectional view of a portion of a fully assembled second alternative configuration of the invention similar to that of FIG. 67, but wherein the PCB has a longitudinally extending elongated beam formed therein adjacent its side edges which is affixed to the main body of the PCB at both ends and carried a contact pad at a center location (most laterally flexible) for locking engagement within a case side wall window and electrical engagement with exposed sidewall wire mesh.

Referring to FIG. 70, a third embodiment of the present invention is illustrated. The left-rear corner of a lightweight automotive electronic device 1622 depicts portions of a left side wall 1624 and rear wall 1626 of a case 1628. A lower guide wall 1630 integrally formed with the left side wall 1624 projects laterally inwardly, and extends longitudinally the entire length of the left side wall 1624. The walls of the case 1626 are integrally formed, preferably by injection molding and each include a layer of relatively rigid polymer based material 1632 and an electrically conductive layer 1634. The electrically conductive layer 1634 is preferably continuously formed wire screen or mesh which has been insert molded within the case walls. FIG. 70 also depicts the left-rear corner of a circuit board/substrate 1636 of a circuit board subassembly 1638 disposed in its design intent final assembly position within the case 1628. The circuit board 1636 depicts portions of a left edge 1640 and a rear edge 1642.

An elongated open slot 1592 is formed in the circuit board 1636 extending laterally adjacent the left side edge 1640 to form a resilient beam portion 1646. The resilient beam 1646 is, thus, integrally formed with the remainder of the material constituting the circuit board 1636. The resilient beam 1646 is configured to form a relatively large central head portion 1648 connected as a beam with the remainder of the circuit board 1636 through upper and lower elongated, thin sectioned neck portions 1650 and 652, respectively. The head portion 1648 extends leftwardly beyond the left edge 1640 and has the left facing surface thereof coated or plated to form a contact 1654. The contact 1654 has an integral first portion 1656 extending radially inwardly on the upper surface of the circuit board 1636 and an integral second portion (not illustrated) extending radially inwardly on the lower surface of the circuit board 1564. The first and second portions assure robustness of the mechanical connection of the contact 1654 to the edge of the circuit board 1636 as well as reliable electrical interconnection with the wire screen 1634. A conductive trace 1656 is dressed/routed along the lower neck portion 1652 to electrically interconnect the contact 1654 with other circuitry carried with the circuit board subassembly 1638.

A window 1660 formed in the left side wall portion 1624 exposes a patch of the wire screen 1634 in register with the contact 1654 carried on the resilient beam 1646. As illustrated in FIG. 70, upon final assembly, the resilient beam 1646 continuously presses the contact 1654 leftwardly, maintaining it in interment contact with the screen 1634, thereby assuring maintenance of a reliable electrical ground path.

The outer leading edge of the upper neck portion 1650 forms a ramped engagement surface 1662 transitioning radially outwardly toward the radially outermost portion of the head portion 1648 supporting the contact 1654. Furthermore, the trailing edge of the head portion 1596 adjacent the lower neck portion 1652 forms a radially extending abutment surface 1664.

The third embodiment of the invention described in connection with FIG. 70 functions substantially as described in connection with the second embodiment of the invention. (FIGS. 67-69C) with the exception that the head portion 1648 is supported by two discrete beam portions 1650 and 1652 to provide a more reliable and robust design and potentially stronger "snap-back" forces.

It is to be understood that the invention has been described with reference to specific embodiments and variations to provide the features and advantages previously described and that the embodiments are susceptible of modification as will be apparent to those skilled in the art.

Furthermore, it is contemplated that many alternative, common inexpensive materials can be employed to construct the basis constituent components. Accordingly, the forgoing is not to be construed in a limiting sense.

The invention has been described in an illustrative manner, and it is to be understood that the terminology, which has been used is intended to be in the nature of words of description rather than of limitation.

Obviously, many modifications and variations of the present invention are possible in light of the above teachings. For example, a number of the various radio/CD player case constructions illustrated herein are illustrated as being formed of solid molded polymer material for the sake of simplicity and clarity of understanding. It is to be understood, however, that the wire mesh depicted, for example in FIG. 93, can be employed in the other configurations and embodiments with equal success. Furthermore, several of the housing assembly structures are described herein as being formed of metal. However, a wide range of material substitutes, including plastics, ceramics, non-ferrous metals and composites can be substituted without departing from the spirit and scope of the present invention. The terms "snap-engaging" and "self-engaging" are intended to interpreted very broadly inasmuch as innumerable structural, process (e.g. weldments) and chemical (e.g. adhesives) equivalents are available. It is, therefore, to be understood that within the scope of the appended claims, wherein reference numerals are merely for illustrative purposes and convenience and are not in any way limiting, the invention, which is defined by the following claims as interpreted according to the principles of patent law, including the Doctrine of Equivalents, may be practiced otherwise than is specifically described.

What is claimed is:

1. A lightweight automotive electronic device comprising:
at least one electronic circuit component including a circuit board integrally forming a resilient beam portion adjacent an edge thereof carrying a grounding pad; and
a housing assembly substantially formed of a composite of relatively rigid polymer based material and electrically conductive material operable to substantially enclose and to shield said at least one electronic circuit component from electrical anomalies, wherein an inwardly facing exposed portion of said conductive material is disposed adjacent said grounding pad to establish an electrical ground path therebetween.

2. The electronic device of claim 1, wherein said housing assembly comprises an opening formed in said polymer based material that is substantially closed by said exposed portion of said electrically conductive material.

3. The electronic device of claim 1, wherein said electrically conductive material comprises an open mesh screen operative to enable the flow of ambient fluid therethrough.

4. The electronic device of claim 1, wherein said beam portion comprises a cantilevered extension of the material forming said circuit board.

* * * * *